(12) United States Patent
Yamaguchi et al.

(10) Patent No.: US 12,029,054 B2
(45) Date of Patent: ***Jul. 2, 2024

(54) SOLID-STATE IMAGING APPARATUS AND ELECTRONIC APPARATUS

(71) Applicant: SONY GROUP CORPORATION, Tokyo (JP)

(72) Inventors: Tetsuji Yamaguchi, Kanagawa (JP); Atsushi Toda, Kanagawa (JP); Itaru Oshiyama, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/303,074

(22) Filed: Apr. 19, 2023

(65) Prior Publication Data

US 2023/0292536 A1   Sep. 14, 2023

Related U.S. Application Data

(63) Continuation of application No. 17/564,484, filed on Dec. 29, 2021, now Pat. No. 11,659,724, which is a
(Continued)

(30) Foreign Application Priority Data

May 20, 2016   (JP) .................................. 2016-101076

(51) Int. Cl.
*H10K 39/32*   (2023.01)
*G02B 5/20*   (2006.01)
(Continued)

(52) U.S. Cl.
CPC ............. *H10K 39/32* (2023.02); *G02B 5/201* (2013.01); *G02B 5/208* (2013.01); *H01L 27/146* (2013.01);
(Continued)

(58) Field of Classification Search
CPC ...... H10K 39/32; H10K 19/20; H10K 19/201; G02B 5/201; G02B 5/208; H01L 27/146;
(Continued)

(56) References Cited

U.S. PATENT DOCUMENTS

| 5,453,611 A | 9/1995 | Oozu et al. |
| 7,750,423 B2 | 7/2010 | Yokoyama |

(Continued)

FOREIGN PATENT DOCUMENTS

| JP | H06-204445 | 7/1994 |
| JP | 2009-027063 | 2/2009 |

(Continued)

OTHER PUBLICATIONS

International Search Report and Written Opinion for International (PCT) Patent Application No. PCT/JP2017/017281, dated May 30, 2017, 9 pages.

(Continued)

*Primary Examiner* — Seung C Sohn
(74) *Attorney, Agent, or Firm* — Sheridan Ross PC

(57) ABSTRACT

A solid-state imaging apparatus includes a pixel array part in which a plurality of pixels are two-dimensionally arranged, in which each pixel has a first photoelectric conversion region formed above a semiconductor layer, a second photoelectric conversion region formed in the semiconductor layer, a first filter configured to transmit a light in a predetermined wavelength region corresponding to a color component, and a second filter having different transmission characteristics from the first filter, one photoelectric conversion region out of the first photoelectric conversion region and the second photoelectric conversion region photoelectrically converts a light in a visible light region, the other photoelectric conversion region photoelectrically converts a light in an infrared region, the first filter is formed above the
(Continued)

first photoelectric conversion region, and the second filter has transmission characteristics of making wavelengths of lights in an infrared region absorbed in the other photoelectric conversion region formed below the first filter the same.

20 Claims, 34 Drawing Sheets

Related U.S. Application Data continuation of application No. 17/069,610, filed on Oct. 13, 2020, now Pat. No. 11,233,092, which is a continuation of application No. 16/301,105, filed as application No. PCT/JP2017/017281 on May 2, 2017, now Pat. No. 10,847,581.

(51) Int. Cl.
| | | |
|---|---|---|
| *H01L 27/146* | (2006.01) | |
| *H01L 31/10* | (2006.01) | |
| *H04N 23/11* | (2023.01) | |
| *H04N 23/12* | (2023.01) | |
| *H04N 25/131* | (2023.01) | |
| *H04N 25/75* | (2023.01) | |
| *H04N 25/77* | (2023.01) | |
| *H04N 25/79* | (2023.01) | |
| *H10K 19/00* | (2023.01) | |
| *H10K 19/20* | (2023.01) | |

(52) U.S. Cl.
CPC .... *H01L 27/1462* (2013.01); *H01L 27/14621* (2013.01); *H01L 27/1464* (2013.01); *H01L 27/14649* (2013.01); *H01L 27/14667* (2013.01); *H01L 31/10* (2013.01); *H04N 23/11* (2023.01); *H04N 23/12* (2023.01); *H04N 25/79* (2023.01); *H10K 19/20* (2023.02); *H10K 19/201* (2023.02); *H04N 25/131* (2023.01); *H04N 25/75* (2023.01); *H04N 25/77* (2023.01)

(58) Field of Classification Search
CPC ........... H01L 27/1462; H01L 27/14621; H01L 27/1464; H01L 27/14649; H01L 27/14667; H01L 31/10; H04N 23/11; H04N 23/12; H04N 25/79; H04N 25/131; H04N 25/75; H04N 25/77; Y02E 10/549

See application file for complete search history.

(56) References Cited

U.S. PATENT DOCUMENTS

| | | | |
|---|---|---|---|
| 7,928,352 B2 | 4/2011 | Toda | |
| 7,936,035 B2 | 5/2011 | Maehara et al. | |
| 7,968,888 B2 | 6/2011 | Yamaguchi et al. | |
| 8,710,418 B2 | 4/2014 | Natori | |
| 9,601,547 B2 * | 3/2017 | Hatano | H10K 30/81 |
| 10,008,544 B2 | 8/2018 | Park et al. | |
| 10,580,814 B2 | 3/2020 | Kenichi | |
| 10,847,581 B2 | 11/2020 | Yamaguchi et al. | |
| 11,233,092 B2 | 1/2022 | Yamaguchi et al. | |
| 2009/0321865 A1 | 12/2009 | Kasano et al. | |
| 2014/0015932 A1 | 1/2014 | Kim et al. | |
| 2014/0194748 A1 | 7/2014 | Yamamoto et al. | |
| 2015/0171146 A1 | 6/2015 | Ooki | |
| 2022/0123053 A1 | 4/2022 | Yamaguchi et al. | |

FOREIGN PATENT DOCUMENTS

| | | |
|---|---|---|
| JP | 2010-011415 | 1/2010 |
| JP | 2013-070030 | 4/2013 |
| JP | 2014-135535 | 7/2014 |
| JP | 2015-162562 | 9/2015 |
| JP | 2015-225950 | 12/2015 |
| WO | WO 2012/169127 | 12/2012 |
| WO | WO 2014/199720 | 12/2014 |
| WO | WO 2015/199163 | 12/2015 |

OTHER PUBLICATIONS

Official Action for U.S. Appl. No. 16/301,105, dated Jan. 27, 2020, 12 pages.
Notice of Allowance for U.S. Appl. No. 16/301,105, dated Jul. 13, 2020, 9 pages.
Notice of Allowance for U.S. Appl. No. 17/069,610, dated Sep. 30, 2021, 9 pages.
Notice of Allowance for U.S. Appl. No. 17/564,484, dated Jan. 18, 2023, 9 pages.

* cited by examiner

SOLID-STATE IMAGING APPARATUS AND ELECTRONIC APPARATUS

CROSS-REFERENCE TO RELATED APPLICATIONS

This application is a continuation application of U.S. Serial application Ser. No. 17/564,484 filed Dec. 29, 2021, which is a continuation application of U.S. Serial application Ser. No. 17/069,610 filed Oct. 13, 2020, now U.S. Pat. No. 11,233,092, which is a continuation application of U.S. Serial application Ser. No. 16/301,105 filed Nov. 13, 2018, now U.S. Pat. No. 10,847,581, which is a national stage application under 35 U.S.C. 371 and claims the benefit of PCT Application No. PCT/JP2017/017281 having an international filing date of May 2, 2017, which designated the United States, which PCT application claimed the benefit of Japanese Patent Application No. 2016-101076 filed May 20, 2016, the entire disclosures of each of which are incorporated herein by reference.

TECHNICAL FIELD

The present technology relates to a solid-state imaging apparatus and an electronic apparatus, and particularly to a solid-state imaging apparatus capable of generating a high-resolution IR image while keeping high quality of a visible light image, and an electronic apparatus.

BACKGROUND ART

An image sensor shoots an image obtained by visible lights (denoted as visible light image below) by use of R (read), G (green), and B (blue) color filters. Further, an image sensor shoots an image obtained by infrared rays (IR) (denoted as IR image below) by detecting from a visible light to an infrared ray without the use of color filters in order to improve a night-vision sensitivity and to acquire object information which cannot be shot by a visible light in addition to a visible light image.

On the other hand, not acquiring either a visible light image or an IR image at one time, a demand to acquire both a visible light image and an IR image at the same time has increased. For example, there is known, as a pixel layout pattern, a configuration in which IR pixels corresponding to the IR component are two-dimensionally arranged in addition to R pixels corresponding to the R component, G pixels corresponding to the G component, and B pixels corresponding to the B component thereby to acquire a visible light image and an IR image at the same time.

Further, there is disclosed a configuration in which an infrared photoelectric conversion layer configured to absorb a light in an infrared region is formed above a semiconductor substrate in which photodiodes configured to detect lights of R component, G component, and B component are formed thereby to acquire a visible light image and an IR image at the same time (see Patent Document 1, for example).

CITATION LIST

Patent Document

Patent Document 1: Japanese Patent Application Laid-Open No. 2009-27063

SUMMARY OF THE INVENTION

Problems to be Solved by the Invention

In the pixel structure disclosed in Patent Document 1, the infrared photoelectric conversion layer configured to absorb a light in an infrared region is provided for all the pixels, and an IR image using IR signals obtained from all the IR pixels can be acquired.

On the other hand, in the pixel structure disclosed in Patent Document 1, an inorganic filter (filter including an inorganic material) formed below the infrared photoelectric conversion layer disperses the color components without providing color filters configured to disperse the color components of lights detected by the photodiodes above the infrared photoelectric conversion layer.

Here, the spectroscopic shape of a light obtained by the inorganic filter is inferior to the spectroscopic shape of a light obtained by the color filters, and thus the quality of a visible light image using RGB signals obtained from R pixels, G pixels, and B pixels is lower in using the inorganic filter than in using the color filters. Therefore, a technology for generating a high-resolution IR image while keeping high quality of a visible light image has been required.

The present technology has been made in terms of such situations, and is directed to generating a high-resolution IR image while keeping high quality of a visible light image.

Solutions to Problems

A solid-state imaging apparatus according to an aspect of the present technology is a solid-state imaging apparatus including: a pixel array part in which pixels each having a first photoelectric conversion region formed above a semiconductor layer and a second photoelectric conversion region formed in the semiconductor layer are two-dimensionally arranged, in which each of the pixels further has: a first filter configured to transmit a light in a predetermined wavelength region corresponding to a color component; and a second filter having different transmission characteristics from the first filter, one photoelectric conversion region out of the first photoelectric conversion region and the second photoelectric conversion region photoelectrically converts a light in a visible light region and the other photoelectric conversion region photoelectrically converts a light in an infrared region, the first filter is formed above the first photoelectric conversion region, and the second filter has transmission characteristics of making wavelengths of lights in an infrared region absorbed in the other photoelectric conversion region formed below the first filter the same.

In a solid-state imaging apparatus according to one aspect of the present technology, each of pixels two-dimensionally arranged in a pixel array part has a first photoelectric conversion region formed above a semiconductor layer, a second photoelectric conversion region formed in the semiconductor layer, a first filter configured to transmit a light in a predetermined wavelength region corresponding to a color component, and a second filter having different transmission characteristics from the first filter. Then, one photoelectric conversion region out of the first photoelectric conversion region and the second photoelectric conversion region photoelectrically converts a light in a visible light region, and the other photoelectric conversion region photoelectrically converts a light in an infrared region. Further, the second filter uniforms wavelengths of lights in an infrared region absorbed in the other photoelectric conversion region formed below the first filter.

An electronic apparatus according to an aspect of the present technology is an electronic apparatus mounting a solid-state imaging apparatus thereon, the solid-state imaging apparatus including: a pixel array part in which pixels each having a first photoelectric conversion region formed above a semiconductor layer and a second photoelectric conversion region formed in the semiconductor layer are two-dimensionally arranged, in which each of the pixels further has: a first filter configured to transmit a light in a predetermined wavelength region corresponding to a color component; and a second filter having different transmission characteristics from the first filter, one photoelectric conversion region out of the first photoelectric conversion region and the second photoelectric conversion region photoelectrically converts a light in a visible light region, and the other photoelectric conversion region photoelectrically converts a light in an infrared region, the first filter is formed above the first photoelectric conversion region, and the second filter has characteristics of making wavelengths of lights in an infrared region absorbed in the other photoelectric conversion region formed below the first filter the same.

In an electronic apparatus according to one aspect of the present technology, each of pixels two-dimensionally arranged in a pixel array part in a solid-state imaging apparatus mounted thereon has a first photoelectric conversion region formed above a semiconductor layer, a second photoelectric conversion region formed in the semiconductor layer, a first filter configured to transmit a light in a predetermined wavelength region corresponding to a color component, and a second filter having different transmission characteristics from the first filter. Then, one photoelectric conversion region out of the first photoelectric conversion region and the second photoelectric conversion region photoelectrically converts a light in a visible light region, and the other photoelectric conversion region photoelectrically converts a light in an infrared region. Further, the second filter uniforms wavelengths of lights in an infrared region absorbed in the other photoelectric conversion region formed below the first filter.

Additionally, each of the solid-state imaging apparatus and the electronic apparatus according to one aspect of the present technology may be an independent apparatus, or may be an internal block configuring one apparatus.

Effects of the Invention

According to one aspect of the present technology, it is possible to generate a high-resolution IR image while keeping high quality of a visible light image.

Additionally, the effects described herein are not necessarily restrictive, and any effect described in the present disclosure may be obtained.

MODE FOR CARRYING OUT THE INVENTION

Embodiments of the present technology will be described below with reference to the drawings Additionally, the description will be made in the following order.

1. Configuration of solid-state imaging apparatus
2. First embodiment: structure using dual-bandpass filter (OPC: RGB pixels, PD: IR pixels)
3. Second embodiment: structure using multilayered filter (OPC: RGB pixels, PD: IR pixels)
4. Third embodiment: structure using plasmon filter (OPC: RGB pixels, PD: IR pixels)
5. Fourth embodiment: structure using dual-bandpass filter (OPC: IR pixels, PD: RGB pixels)
6. Fifth embodiment: structure using multilayered filter (OPC: IR pixels, PD: RGB pixels)
7. Readout circuit
8. Variant
9. Configuration of electronic apparatus
10. Exemplary use of solid-state imaging apparatus 1. Configuration of Solid-State Imaging Apparatus Exemplary Configuration of Solid-State Imaging Apparatus)
FIG. 1 is a diagram illustrating one embodiment of a solid-state imaging apparatus according to the present technology.

Figure 1:
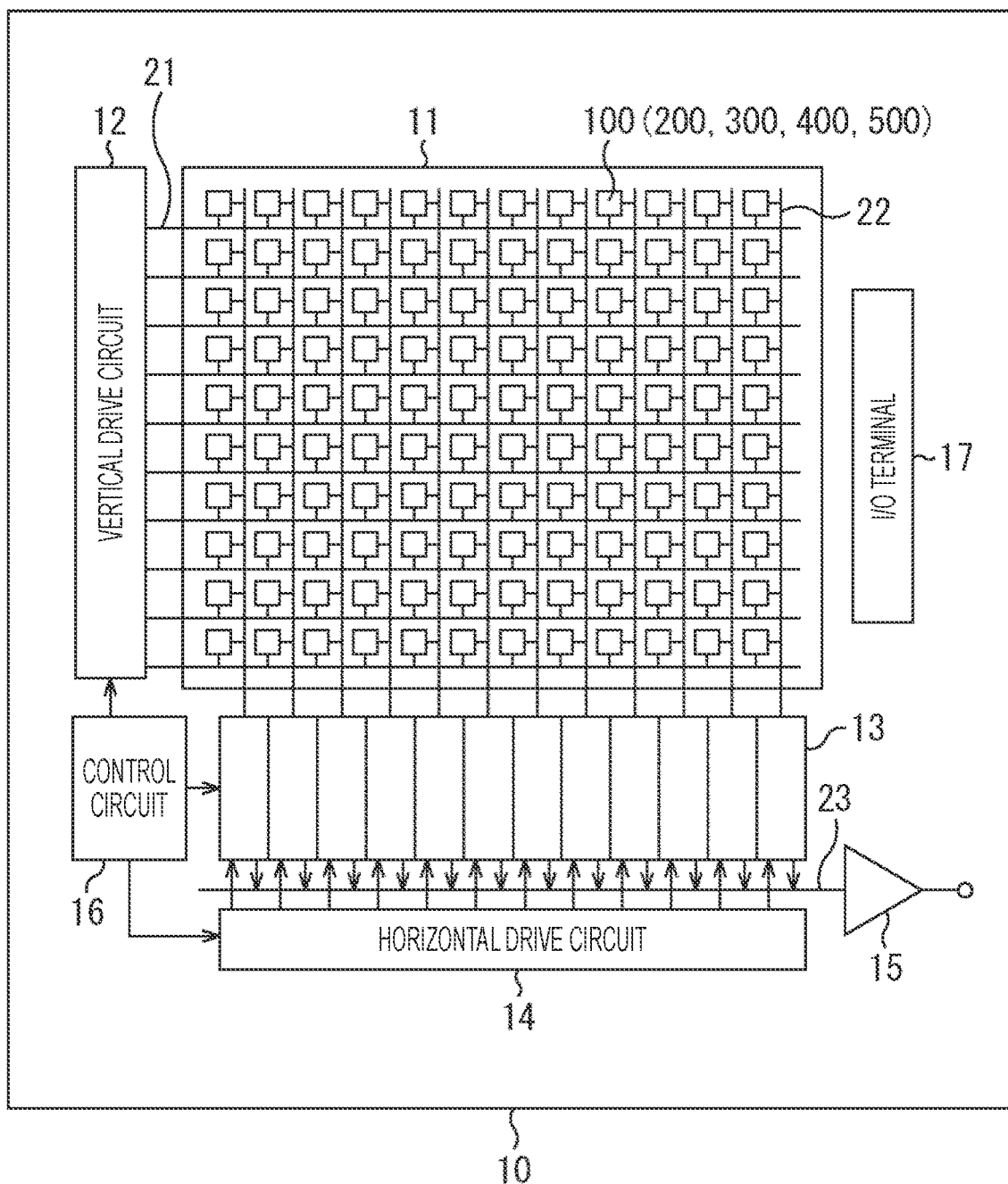
FIG. 1 is a diagram illustrating one embodiment of a solid-state imaging apparatus according to the present technology.

A CMOS image sensor 10 of FIG. 1 is a solid-state imaging apparatus using complementary metal oxide semiconductor (CMOS). The CMOS image sensor 10 takes in an incident light (image light) from an object via an optical lens system (not illustrated), converts the amount of the incident light formed on the imaging surface into electric signals in units of pixel, and outputs the electric signals as pixel signals.

In FIG. 1, the CMOS image sensor 10 is configured of a pixel array part 11, a vertical drive circuit 12, column signal processing circuits 13, a horizontal drive circuit 14, an output circuit 15, a control circuit 16, and an I/O terminal 17.

A plurality of pixels 100 are two-dimensionally arranged in the pixel array part 11. A pixel 100 is configured of an organic photoelectric conversion layer (OPC) as a photoelectric conversion region and a photodiode (PD) as well as a plurality of pixel transistors.

The vertical drive circuit 12 is configured of a shift register, for example, selects a predetermined pixel drive line 21, supplies the selected pixel drive line 21 with a pulse for driving the pixels 100, and drives the pixels 100 in units of row. That is, the vertical drive circuit 12 selects and scans the respective pixels 100 in the pixel array part 11 in units of row sequentially in the vertical direction, and supplies the pixel signals based on signal charges (charges) generated depending on the amount of received light in the organic photoelectric conversion layer or the photodiodes in the respective pixels 100 to the column signal processing circuits 13 via vertical signal lines 22.

The column signal processing circuits 13 are arranged in units of column of the pixels 100, and perform a signal processing such as noise cancellation on the signals output from one row of pixels 100 per column of pixels. For example, the column signal processing circuits 13 perform a signal processing such as correlated double sampling (CDS) for canceling a pixel-specific fixed pattern noise and analog/digital (A/D) conversion.

The horizontal drive circuit 14 is configured of a shift register, for example, sequentially outputs a horizontal scanning pulse, selects each of the column signal processing circuits 13 in turn, and causes pixel signals to be output from each of the column signal processing circuits 13 to a horizontal signal line 23.

The output circuit 15 performs a signal processing on and outputs the signals sequentially supplied from each of the column signal processing circuits 13 via the horizontal signal line 23. Additionally, the output circuit 15 may perform only buffering, for example, or may perform black level adjustment, column variation correction, various digital signal processings, and the like.

The control circuit 16 controls the operations of each part in the CMOS image sensor 10. For example, the control circuit 16 receives an input clock signal and data for giving an instruction on an operation mode or the like, and outputs data such as internal information of the CMOS image sensor 10. That is, the control circuit 16 generates clock signals or control signals as the references of the operations of the vertical drive circuit 12, the column signal processing circuits 13, the horizontal drive circuit 14, and the like on the basis of a vertical synchronization signal, a horizontal synchronization signal, and a master clock signal. The control circuit 16 outputs the generated clock signals or control signals to the vertical drive circuit 12, the column signal processing circuits 13, the horizontal drive circuit 14, and the like.

The I/O terminal 17 exchanges signals with the outside.
The thus-configured CMOS image sensor 10 of FIG. 1 is assumed as a CMOS image sensor in a column AD system in which the column signal processing circuits 13 configured to perform the CDS processing and the A/D conversion processing are arranged per column of pixels. Further, the CMOS image sensor 10 of FIG. 1 may be assumed as a CMOS image sensor of backside irradiation type or surface irradiation type. Additionally, the configuration illustrated in FIG. 1 is exemplary, and may be different depending on a configuration of a readout circuit (for the organic photoelectric conversion layer and the photodiode) of a pixel 100, for example. For example, in a case where the readout circuit for the organic photoelectric conversion layer employs a system in which a memory part for reducing noises is provided, not the above CDS processing but an external memory part is used to cancel noises.

Incidentally, the structure of the pixels 100 two-dimensionally arranged in the pixel array part 11 in the CMOS image sensor 10 may employ the structures of pixels according to a first embodiment to a fifth embodiment described below. The structures of pixels according to the first embodiment to the fifth embodiment arranged in the pixel array part 11 will be described below.

Additionally, the pixels according to the first embodiment are denoted as pixels 100 and are discriminated from the pixels according to the other embodiments in the following description for convenient description. Similarly, the pixels according to the second embodiment to the fifth embodiment are denoted as pixels 200, pixel 300, pixels 400, and pixels 500, respectively, but the pixels are also two-dimensionally arranged in the pixel array part 11 in the CMOS image sensor 10 (FIG. 1).

Figure 2:
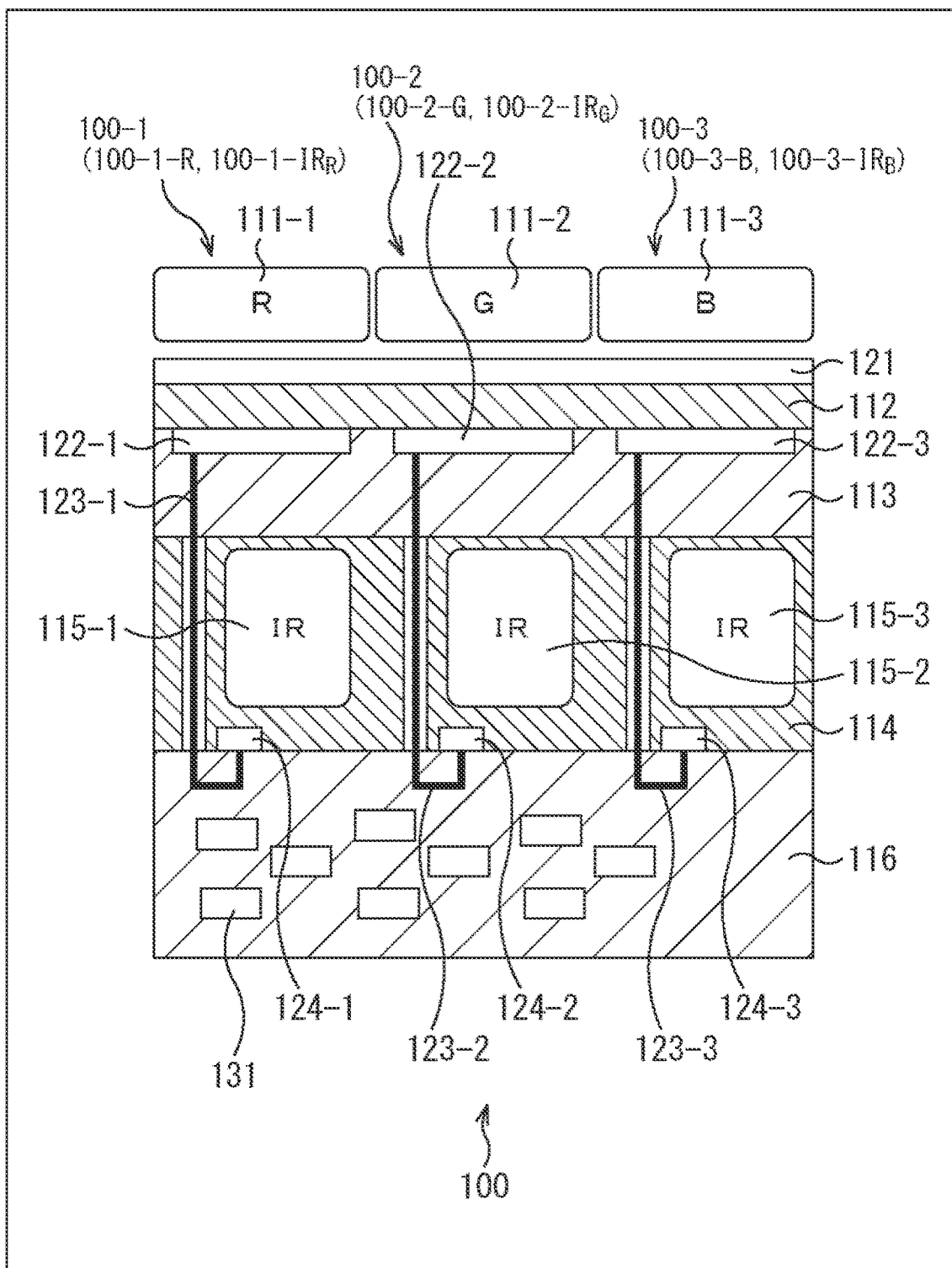
FIG. 2 is a cross-section view illustrating a structure of pixels.

2. First Embodiment: Structure Using Dual-Bandpass Filter (OPC: RGB Pixels, PD: IR Pixels A structure of the pixels 100 according to the first embodiment will be first described with reference to FIG. 2 to FIG. 12.
Structure of Pixels
FIG. 2 is a cross-section view illustrating a structure of the pixels 100. FIG. 2 illustrates three pixels 100-1 to 100-3 arranged at arbitrary positions among a plurality of pixels 100 two-dimensionally arranged in the pixel array part 11 by way of example. However, the pixels 100-1 to 100-3 employ a structure of backside irradiation type.

Photodiodes 115-1 to 115-3 and charge holding parts 124-1 to 124-3 are formed in a semiconductor layer 114 including silicon (Si) or the like in the pixels 100-1 to 100-3, respectively. A wiring layer 116 is assumed below the semiconductor layer 114, where a plurality of wirings 131 are formed. Further, an interlayer insulative film 113 and an organic photoelectric conversion layer 112 are laminated on the semiconductor layer 114.

The organic photoelectric conversion layer 112 absorbs only lights in the visible light region, and generates signal charges (charge) corresponding to lights of the respective color components of R (red) component, G (green) component, and B (blue) component. A transparent electrode 121 configured to read out a signal charge generated in the organic photoelectric conversion layer 112, and transparent electrodes 122-1 to 122-3 are formed on the top and back of the organic photoelectric conversion layer 112, respectively.

Additionally, the transparent electrode 121 is formed on the entire surface of the organic photoelectric conversion layer 112. Further, the transparent electrodes 122-1 to 122-3 are formed depending on a pixel pitch. The transparent electrode 122-1 is connected to the charge holding part 124-1 via an electrode 123-1. Similarly, the transparent electrodes 122-2 and 122-3 are connected to the charge holding parts 124-2 and 124-3 via electrodes 123-2 and 123-3, respectively.

An R color filter 111-1 configured to transmit an R-component light is formed on the side in which a light is incident of the pixel 100-1 among the pixels 100-1 to 100-3. Similarly, a G color filter 111-2 configured to transmit a G-component light is formed on the side in which a light is incident of the pixel 100-2. Further, a B color filter 111-3 configured to transmit a B-component light is formed on the side in which a light is incident of the pixel 100-3.

That is, in the pixel 100-1, an R-component light in the visible light region among the lights transmitting through the R color filter 111-1 is absorbed in the organic photoelectric conversion layer 112 while an IR-component light in the infrared region transmits through the organic photoelectric conversion layer 112. Thus, a signal charge corresponding to the R-component light is generated in the organic photoelectric conversion layer 112 in the pixel 100-1. On the other hand, a signal charge corresponding to the IR-component light is generated in the photodiode 115-1.

Further, in the pixel 100-2, a G-component light in the visible light region among the lights transmitting through the G color filter 111-2 is absorbed in the organic photoelectric conversion layer 112 while an IR-component light in the infrared region transmits through the organic photoelectric conversion layer 112. Thus, a signal charge corresponding to the G-component light is generated in the organic photoelectric conversion layer 112 in the pixel 100-2. On the other hand, a signal charge corresponding to the IR-component light is generated in the photodiode 115-2.

Further, in the pixel 100-3, a B-component light in the visible light region among the lights transmitting through the B color filter 111-3 is absorbed in the organic photoelectric conversion layer 112 while an IR-component light in the infrared region transmits through the organic photoelectric conversion layer 112. Thus, a signal charge corresponding to the B-component light is generated in the organic photoelectric conversion layer 112 in the pixel 100-3. On the other hand, a signal charge corresponding to the IR-component light is generated in the photodiode 115-3.

An R signal and an IR signal are generated in the pixel 100-1 in this way. Further, a G signal and an IR signal are generated in the pixel 100-2, and a B signal and an IR signal are generated in the pixel 100-3. That is, in the respective pixels 100 two-dimensionally arranged in the pixel array part 11, the IR-component signals are acquired in addition to the signals of color components depending on the type of a color filter, thereby generating a visible light image and an IR image at the same time.

Additionally, the configuration including the organic photoelectric conversion layer 112 configured to generate an R signal is denoted as R pixel 100-1-R and the configuration including the photodiode 115-1 configured to generate an IR signal is denoted as IR pixel 100-1-$IR_R$ in the pixel 100-1 in the following description for convenient description. That is, the pixel 100-1 may be both the R pixel 100-1-R and the IR pixel 100-1-$IR_R$.

Similarly, the configuration including the organic photoelectric conversion layer 112 configured to generate a G signal is denoted as G pixel 100-2-G and the configuration including the photodiode 115-2 configured to generate an IR signal is denoted as IR pixel 100-2-$IR_G$ in the pixel 100-2. That is, the pixel 100-2 may be both the G-pixel 100-2-G and the IR pixel 100-2-$IR_G$.

Further, the configuration including the organic photoelectric conversion layer 112 configured to generate a B signal is denoted as B pixel 100-3-B and the configuration including the photodiode 115-3 configured to generate an IR signal is denoted as IR pixel 100-3-$IR_B$ in the pixel 100-3. That is, the pixel 100-3 may be both the B pixel 100-3-B and the IR pixel 100-3-$IR_B$.

Further, in a case where the R color filter 111-1, the G color filter 111-2, and the B color filter 111-3 do not need to be particularly discriminated, they will be simply denoted as color filters 111 in the following description. Further, in a case where the photodiode 115-1, the photodiode 115-2, and the photodiode 115-3 do not need to be particularly discriminated, they will be simply denoted as photodiodes 115. Additionally, the relationships are similarly applied also in the other embodiments described below.

The pixels 100 of FIG. 2 have the above structure, but a spectroscopic shape (spectroscopic characteristics) of an IR pixel in each pixel 100 is different depending on the type of a color filter 111 provided in the upper layer, and thus an IR image using the IR signals obtained from all the IR pixels cannot be generated. The reason will be described below.

Transmissivity of Color Filters

Figure 3:
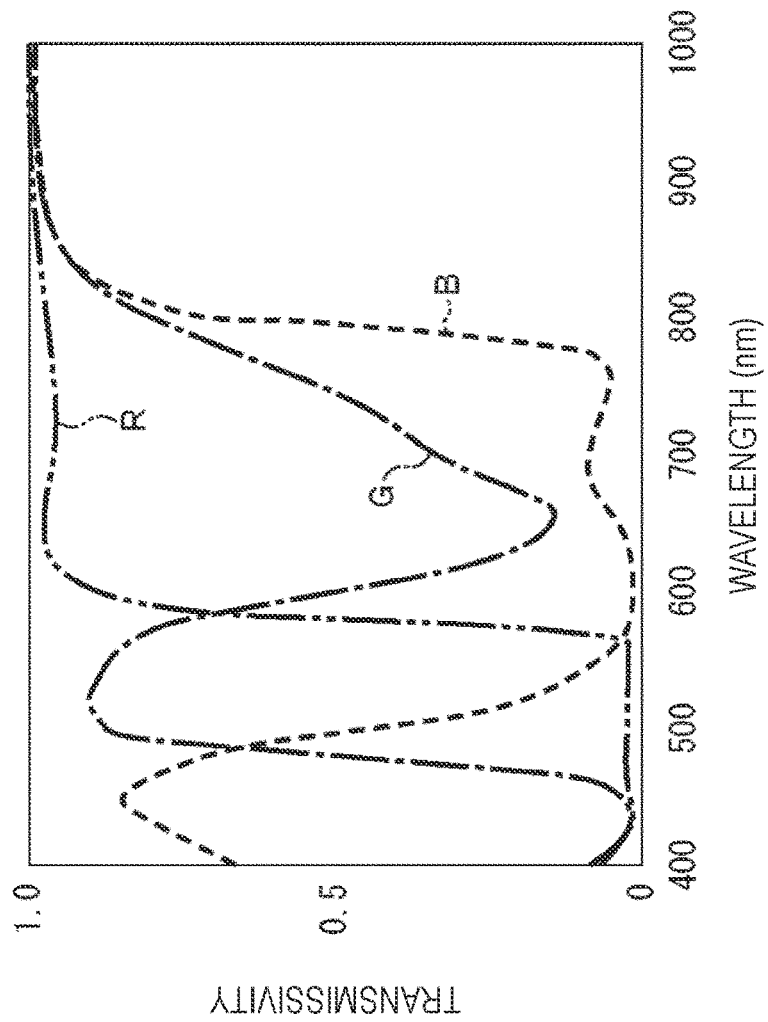
FIG. 3 is a diagram illustrating transmissivity of color filters in each wavelength band.

Here, FIG. 3 illustrates transmissivity of the color filters 111 of FIG. 2 in each wavelength band. In FIG. 3, the horizontal axis indicates wavelength (nm), the value of which is higher from the left side toward the right side in the Figure. Further, the vertical axis indicates transmissivity of each color filter 111, the value of which is within a range of 0 to 1.0.

As illustrated in FIG. 3, the R color filter 111-1 has transmissivity corresponding to a wavelength region (a range of 600 to 650 nm, 550 to 650 nm, or the like, for example) of an R-component light in order to extract the R-component light. Further, the G color filter 111-2 has transmissivity corresponding to a wavelength region (a range of 500 to 600 nm, or the like, for example) of a G-component light in order to extract the G-component light. Further, the B color filter 111-3 has transmissivity corresponding to a wavelength region (a range of 450 to 500 nm, 400 to 500 nm, or the like, for example) of a B-component light in order to extract the B-component light.

Further, as illustrated in FIG. 3, each color filter 111 transmits lights in the regions other than the visible light region, but the R color filter 111-1, the G color filter 111-2, and the B color filter 111-3 are different in transmissivity at a wavelength of 700 nm or more, and their transmissivity varies.

Absorption Rate of Organic Photoelectric Conversion Layer

Figure 4:
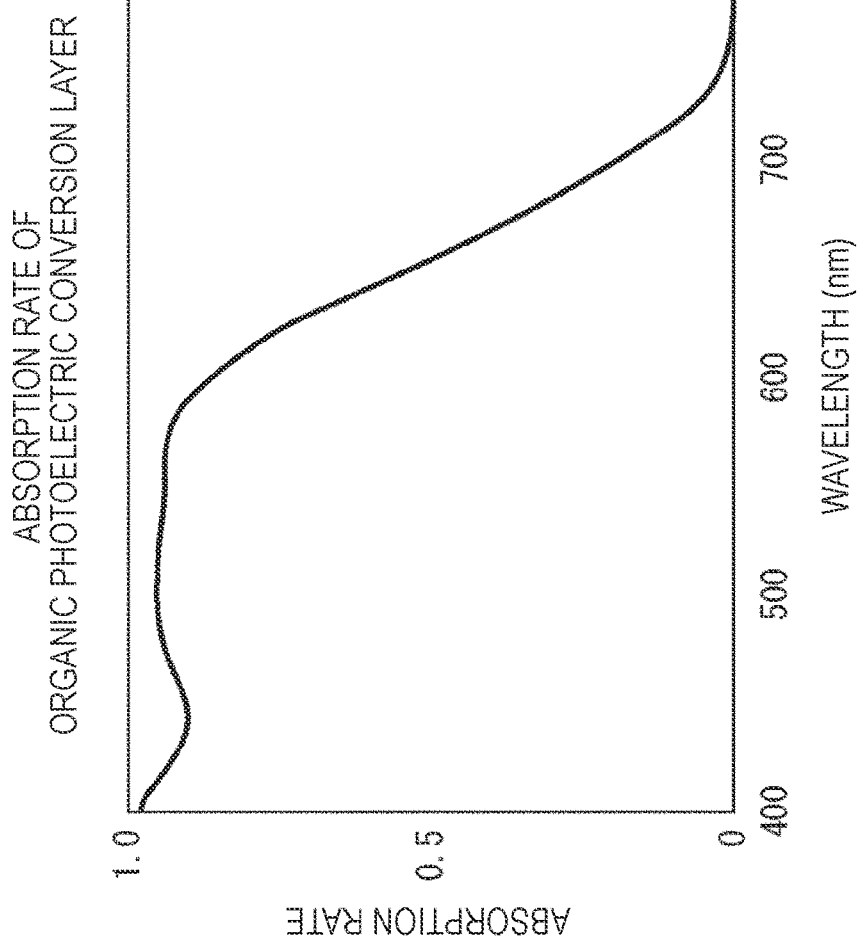
FIG. 4 is a diagram illustrating an absorption rate of an organic photoelectric conversion layer in each wavelength band.

FIG. 4 illustrates an absorption rate of the organic photoelectric conversion layer 112 of FIG. 2 in each wavelength band. The horizontal axis indicates wavelength (nm) and the vertical axis indicates absorption rate in FIG. 4.

In FIG. 4, the organic photoelectric conversion layer 112 has an absorption rate corresponding to a wavelength region (a range of 400 nm to 760 nm, or the like, for example) of lights in the visible light region. Additionally, the organic photoelectric conversion layer 112 may employ a bulk-hetero structure using P3HT or PCBM, and the like, for example.

Absorption Rates of R, G, and B Pixels

Figure 5:
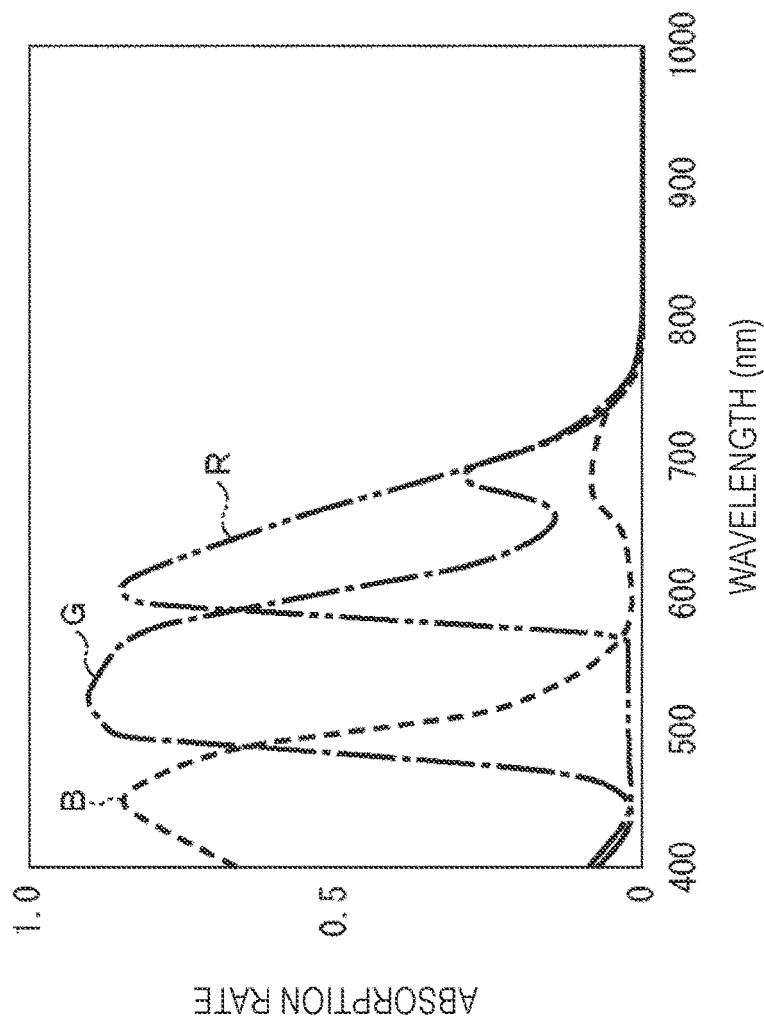
FIG. 5 is a diagram illustrating absorption rates of an R pixel, a G pixel, and a B pixel in each wavelength band.

FIG. 5 illustrates absorption rates of the pixels of the respective color components such as the R pixel 100-1-R, the G pixel 100-2-G, and the B pixel 100-3-B of FIG. 2 in each wavelength band. The horizontal axis indicates wavelength (nm) and the vertical axis indicates absorption rate in FIG. 5.

In FIG. 5, the absorption rate of the R pixel 100-1-R configured of the organic photoelectric conversion layer 112 corresponds to a spectroscopic shape obtained by multiplying the transmissivity of the R color filter 111-1 of FIG. 3 by the absorption rate of the organic photoelectric conversion layer 112 of FIG. 4. That is, the R pixel 100-1-R has an absorption rate corresponding to the wavelength region (a range of 600 to 650 nm, 550 to 650 nm, or the like, for example) of the R-component light, but does not absorb and transmits lights (infrared rays) with a wavelength outside the wavelength region of the R-component light.

Similarly, the absorption rate of the G pixel 100-2-G configured of the organic photoelectric conversion layer 112 corresponds to a spectroscopic shape obtained by multiplying the transmissivity of the G color filter 111-2 of FIG. 3 by the absorption rate of the organic photoelectric conversion layer 112 of FIG. 4. That is, the G pixel 100-2-G has an absorption rate corresponding to the wavelength region (a range of 500 to 600 nm, or the like, for example) of the G-component light, but transmits lights (infrared rays) with a wavelength outside the wavelength region of the G-component light.

Further, the absorption rate of the B pixel 100-3-B configured of the organic photoelectric conversion layer 112 corresponds to a spectroscopic shape obtained by multiplying the transmissivity of the B color filter 111-3 of FIG. 3 by the absorption rate of the organic photoelectric conversion layer 112 of FIG. 4. That is, the B pixel 100-3-B has an absorption rate corresponding to the wavelength region (a range of 450 to 500 nm, 400 to 500 nm, or the like, for example) of the B-component light, but transmits lights with a wavelength outside the wavelength region of the B-component light.

Transmissivity into IR Pixels

Figure 6:
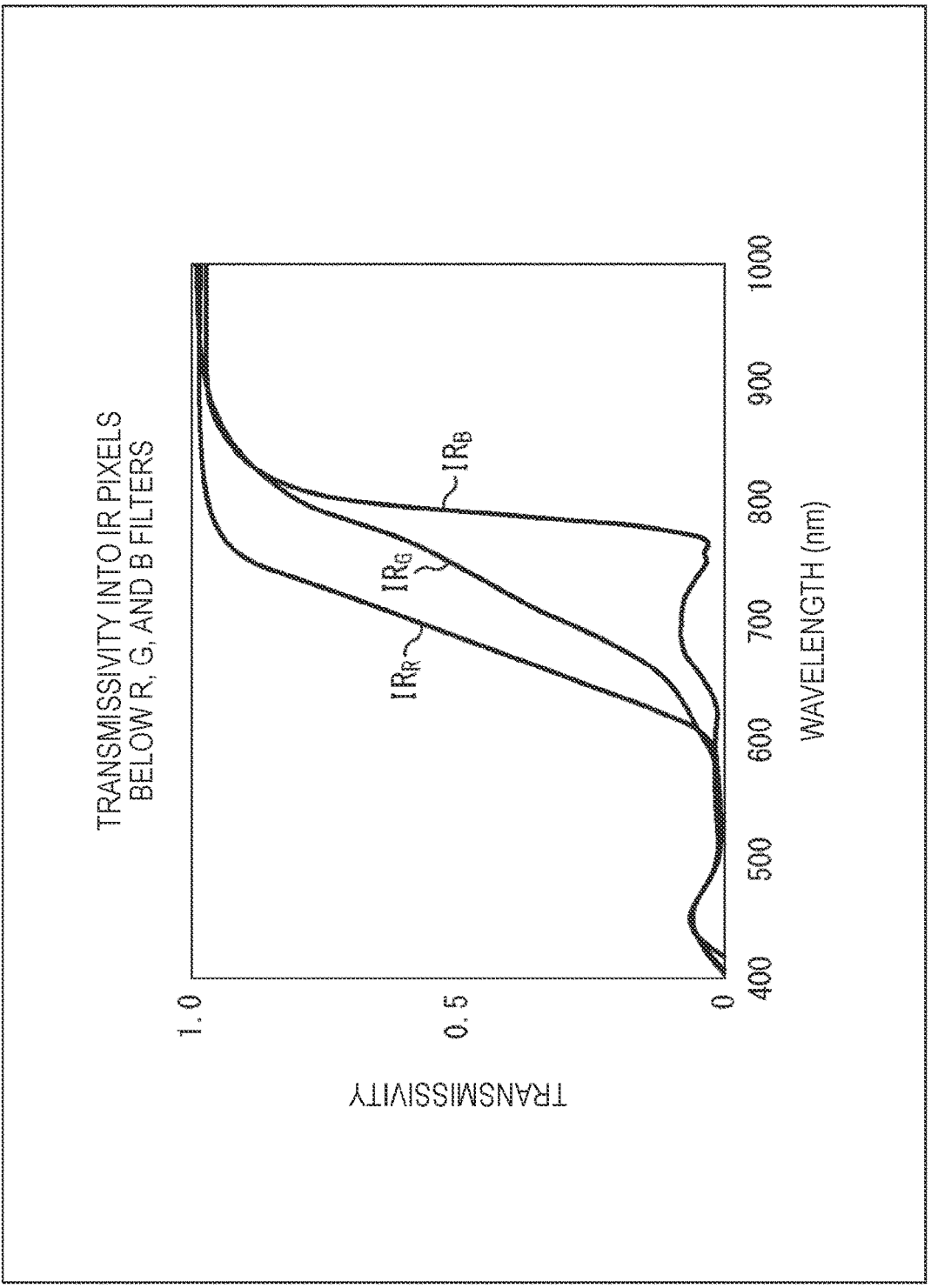
FIG. 6 is a diagram illustrating transmissivity of an R filter, a G filter, and a B filter in each wavelength band.

FIG. 6 illustrates transmissivity into the respective IR pixels of the IR pixel 100-1-$IR_R$, the IR pixel 100-2-$IR_G$, and the IR pixel 100-3-$IR_B$ arranged below the color filters 111 of FIG. 2, respectively. The horizontal axis indicates wavelength (nm) and the vertical axis indicates transmissivity in FIG. 6.

In FIG. 6, a light which transmits through the R color filter 111-1 and the organic photoelectric conversion layer 112 and is detected by (absorbed in) the IR pixel 100-1-$IR_R$ configured of the photodiode 115-1 is indicated in a wave pattern with "$IR_R$".

Similarly, in FIG. 6, a light which transmits through the G color filter 111-2 and the organic photoelectric conversion layer 112 and is detected by (absorbed in) the IR pixel 100-2-$IR_G$ configured of the photodiode 115-2 is indicated in a wave pattern with "IRS". Further, a light which transmits through the B color filter 111-3 and the organic photoelectric conversion layer 112 and is detected by (absorbed in) the IR pixel 100-3-$IR_B$ configured of the photodiode 115-3 is indicated in a wave pattern with "$IR_B$".

As illustrated in FIG. 6, a spectrum of the IR-component light absorbed in the IR pixel 100-1-$IR_R$, a spectrum of the IR-component light absorbed in the IR pixel 100-2-$IR_G$, and a spectrum of the IR-component light absorbed in the IR pixel 100-3-$IR_B$ are different. Thus, the IR pixel 100-1-$IR_R$, the IR pixel 100-2-$IR_G$, and the IR pixel 100-3-$IR_B$ are different in sensitivity per IR pixel, and cannot be used as IR pixels for generating the same IR image.

Figure 7:
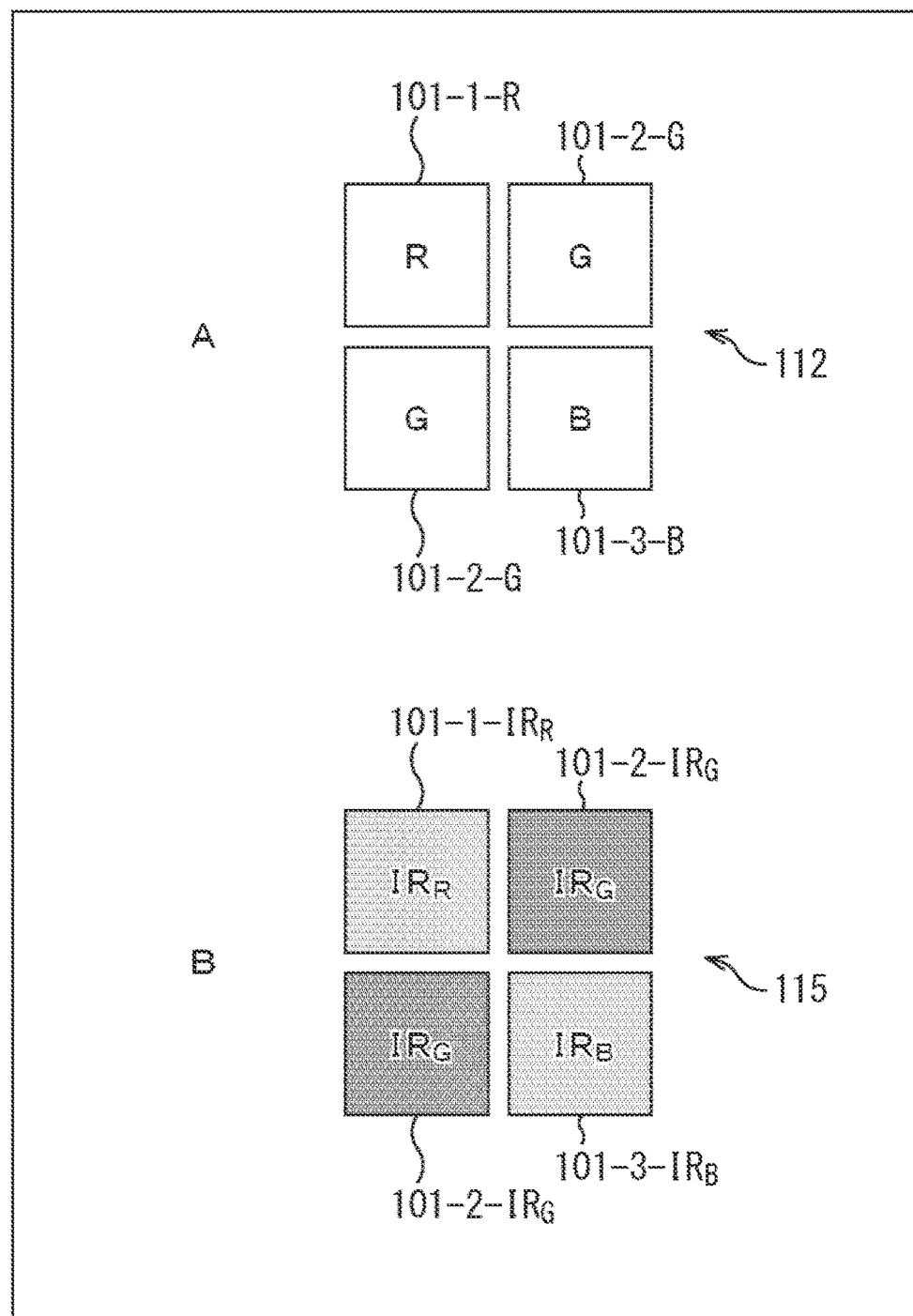
FIG. 7 is a diagram for explaining that a light spectrum detected per IR pixel is different.

Here, for example, in a case where the pixels 100 illustrated in FIG. 2 are two-dimensionally arranged in the Bayer layout in the pixel array part 11, they can be expressed as the respective pixels illustrated in FIG. 7. A of FIG. 7 illustrates an R pixel 100-1-R, G pixels 100-2-G, and a B pixel 100-3-B which are configured of the organic photoelectric conversion layer 112 (FIG. 2). That is, the G pixels 100-2-G are checkerwise arranged and the R pixel 100-1-R and the B pixel 100-3-B are alternately arranged every column in the remaining parts in the pixel array part 11.

Further, B of FIG. 7 illustrates an IR pixel 100-1-$IR_R$, IR pixels 100-2-$IR_G$, and an IR pixel 100-3-$IR_B$ which are configured of the photodiodes 115 (FIG. 2) embedded in the semiconductor layer 114 below the organic photoelectric conversion layer 112 (FIG. 2). In B of FIG. 7, the spectra of the IR-component lights detected by (absorbed in) the IR pixel 100-1-$IR_R$, the IR pixels 100-2-$IR_G$, and the IR pixel 100-3-$IR_B$ are different as expressed in contrasting density of the respective IR pixels, and the sensitivity of the respective IR pixels is not the same.

In a case where the structure of the pixels 100 of FIG. 2 is employed in this way, the spectrum (spectroscopic shape) of a light detected by (absorbed in) each IR pixel is different depending on the type of a color filter 111 provided thereon (varies due to a difference in transmissivity of a color filter 111), and thus each IR pixel substantially functions as a pixel for detecting other IR-component light. Consequently, an IR image using the IR signals obtained from all the IR pixels cannot be acquired and a high-resolution IR image cannot be acquired.

Thus, according to the present technology, a filter functioning as a spectroscopic adjustment layer is provided in order to uniform the spectra (spectroscopic shapes) of the lights detected by (absorbed in) the respective IR pixels provided below the color filters 111 so that the spectra of the lights detected by (absorbed in) the respective IR pixels are the same for all the IR pixels. With this arrangement, a high-quality visible light image using the RGB signals obtained from the R pixels, the G pixels, and the B pixels and a high-resolution IR image using the IR signals obtained from the IR pixels can be acquired at the same time.

Structure of Pixels According to First Embodiment

Figure 8:
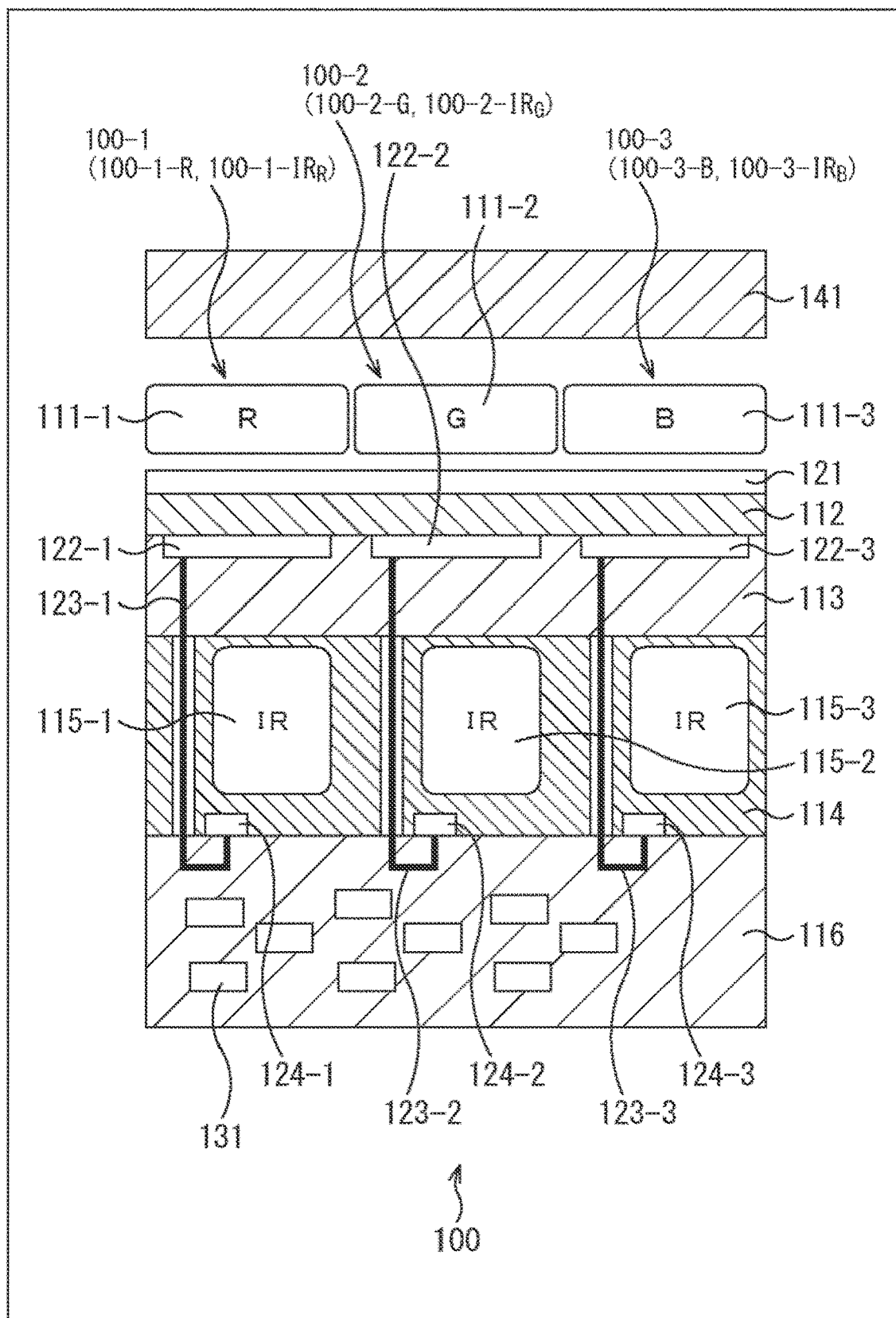
FIG. 8 is a cross-section view illustrating a structure of pixels according to a first embodiment.

FIG. 8 is a cross-section view illustrating a structure of the pixels 100 according to the first embodiment.

The parts in the pixels 100 of FIG. 8 corresponding to those in the pixels 100 of FIG. 2 are denoted with the same reference numerals, and the description thereof will be omitted as needed. That is, the structure of the pixels 100 of FIG. 8 is different from that of the pixels 100 of FIG. 2 in that a dual-bandpass filter 141 is provided above the R color filter 111-1, the G color filter 111-2, and the B color filter 111-3.

The dual-bandpass filter 141 has the transmission bands in the visible light region and the infrared region, respectively.

Figure 9:
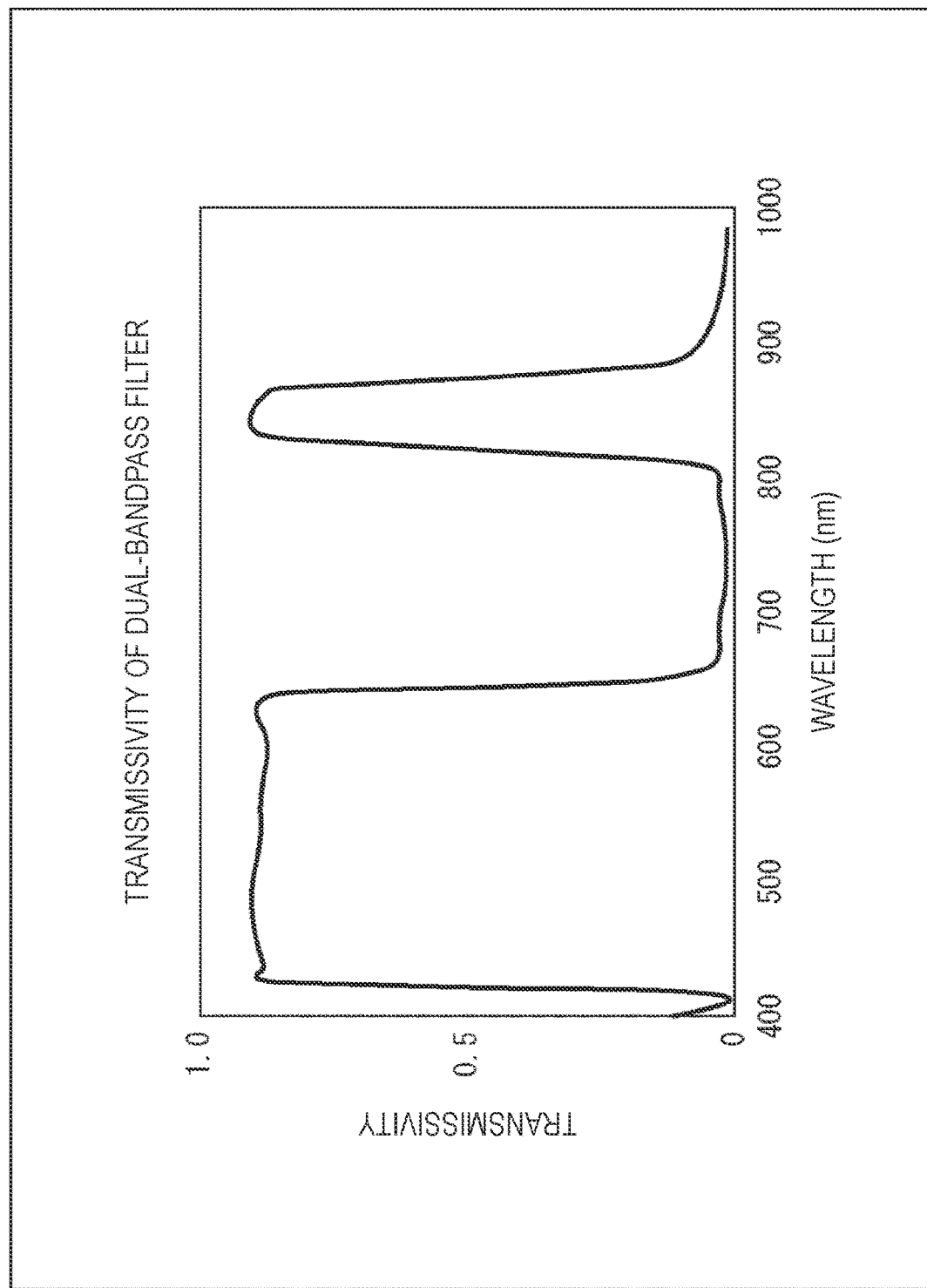
FIG. 9 is a diagram illustrating transmissivity of a dual-bandpass filter in each wavelength band.

Here, FIG. 9 illustrates transmissivity of the dual-bandpass filter 141 in each wavelength band. The horizontal axis indicates wavelength (nm) and the vertical axis indicates transmissivity in FIG. 9. As illustrated in FIG. 9, the dual-bandpass filter 141 has the transmission bands in a wavelength region (a range of 400 to 650 nm, or the like, for example) of the visible light region and in a wavelength region (a range of 800 to 900 nm, or the like, for example) of the infrared region, respectively, and transmits lights with a wavelength included in the transmission bands.

The dual-bandpass filter 141 is provided for the pixels 100 so that the spectrum of a light detected by (absorbed in) each IR pixel can be the same for all the IR pixels by the transmission band in the infrared region. A difference in transmissivity into each IR pixel before and after the dual-bandpass filter 141 is inserted will be described here with reference to FIG. 10 and FIG. 11.

Characteristics of Each Pixel Before Dual-Bandpass Filter is Inserted

Figure 10:
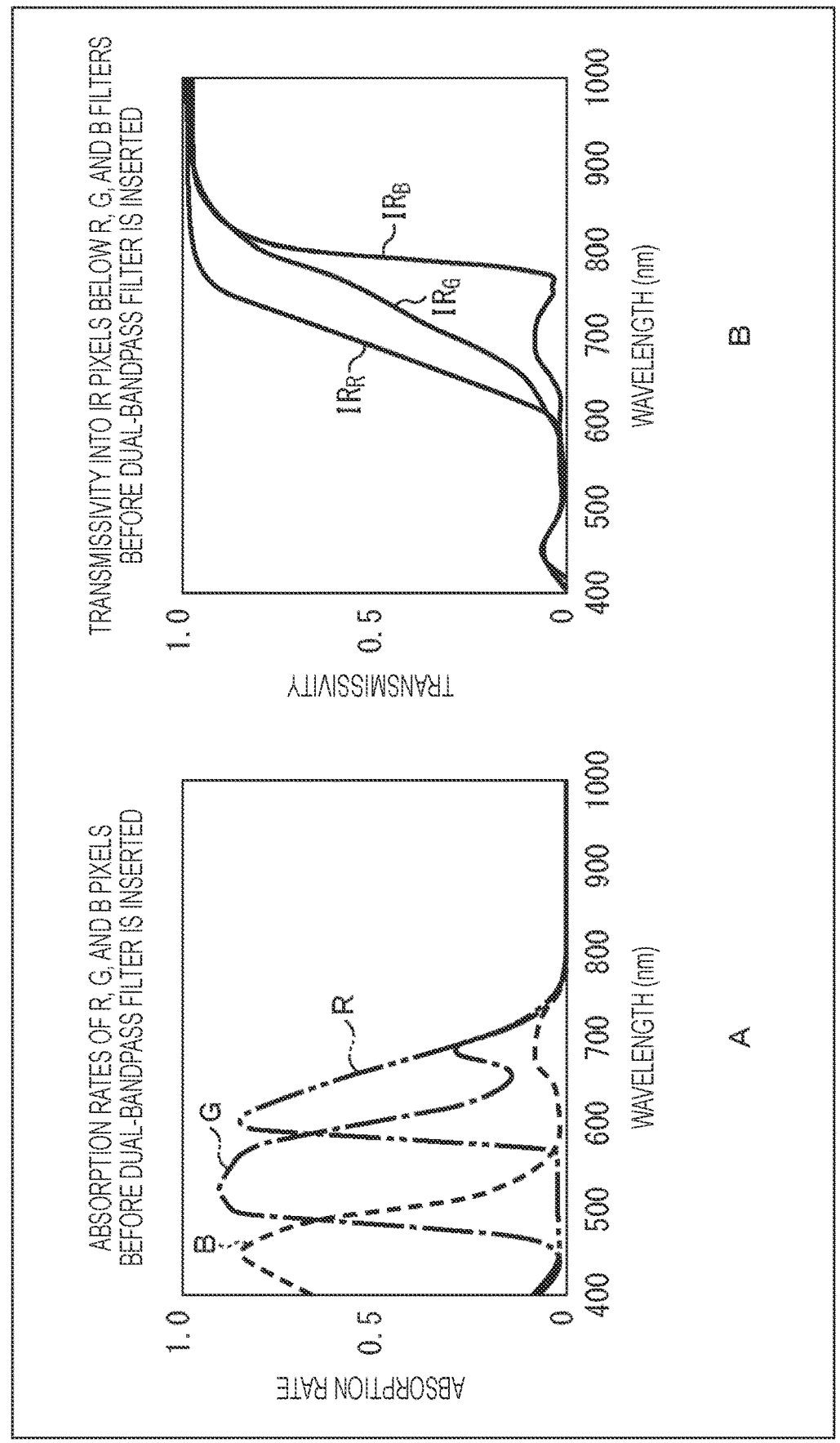
FIG. 10 is a diagram illustrating characteristics of each pixel before the dual-bandpass filter is inserted.

FIG. 10 is a diagram illustrating characteristics of each pixel before the dual-bandpass filter 141 is inserted. Additionally, the characteristics of the pixels illustrated in FIG. 10 are the characteristics of the pixels before the dual-bandpass filter 141 is inserted, and correspond to the characteristics of the pixels 100 illustrated in FIG. 2.

A of FIG. 10 illustrates absorption rates of the pixels of the respective color components configured of the organic photoelectric conversion layer 112 in each wavelength band. As illustrated in A of FIG. 10, the R pixel 100-1-R can absorb a light (visible light) corresponding to the wavelength region of the R-component light. Further, the G pixel 100-2-G can absorb a light corresponding to the wavelength region of the G-component light, and the B pixel 100-3-B can absorb a light corresponding to the wavelength region of the B-component light.

Further, B of FIG. 10 illustrates transmissivity into the IR pixels configured of the photodiodes 115 arranged below the color filters 111 of the respective color components. As illustrated in B of FIG. 10, the spectra of the IR-component lights detected by (absorbed in) the IR pixel 100-1-IR$_R$, the IR pixel 100-2-IR$_G$, and the IR pixel 100-3-IR$_B$ are different. That is, the sensitivity is different per IR pixel in the IR pixels, and as described above, the IR pixels cannot be used for generating the same IR image.

Additionally, FIG. 10 illustrates the spectroscopic shapes before the dual-bandpass filter 141 is inserted, and thus A of FIG. 10 illustrates that the absorption rates of the R pixel 100-1-R, the G pixel 100-2-G, and the B pixel 100-3-B are similar to the absorption rates of the R, G, and B pixels illustrated in FIG. 5. Further, the transmissivity into the IR pixel 100-1-IR$_R$, the IR pixel 100-2-IR$_G$, and the IR pixel 100-3-IR$_B$ in B of FIG. 10 is also similar to the transmissivity into the IR pixels illustrated in FIG. 6.

Characteristics of Each Pixel after Dual-Bandpass Filter is Inserted

Figure 11:
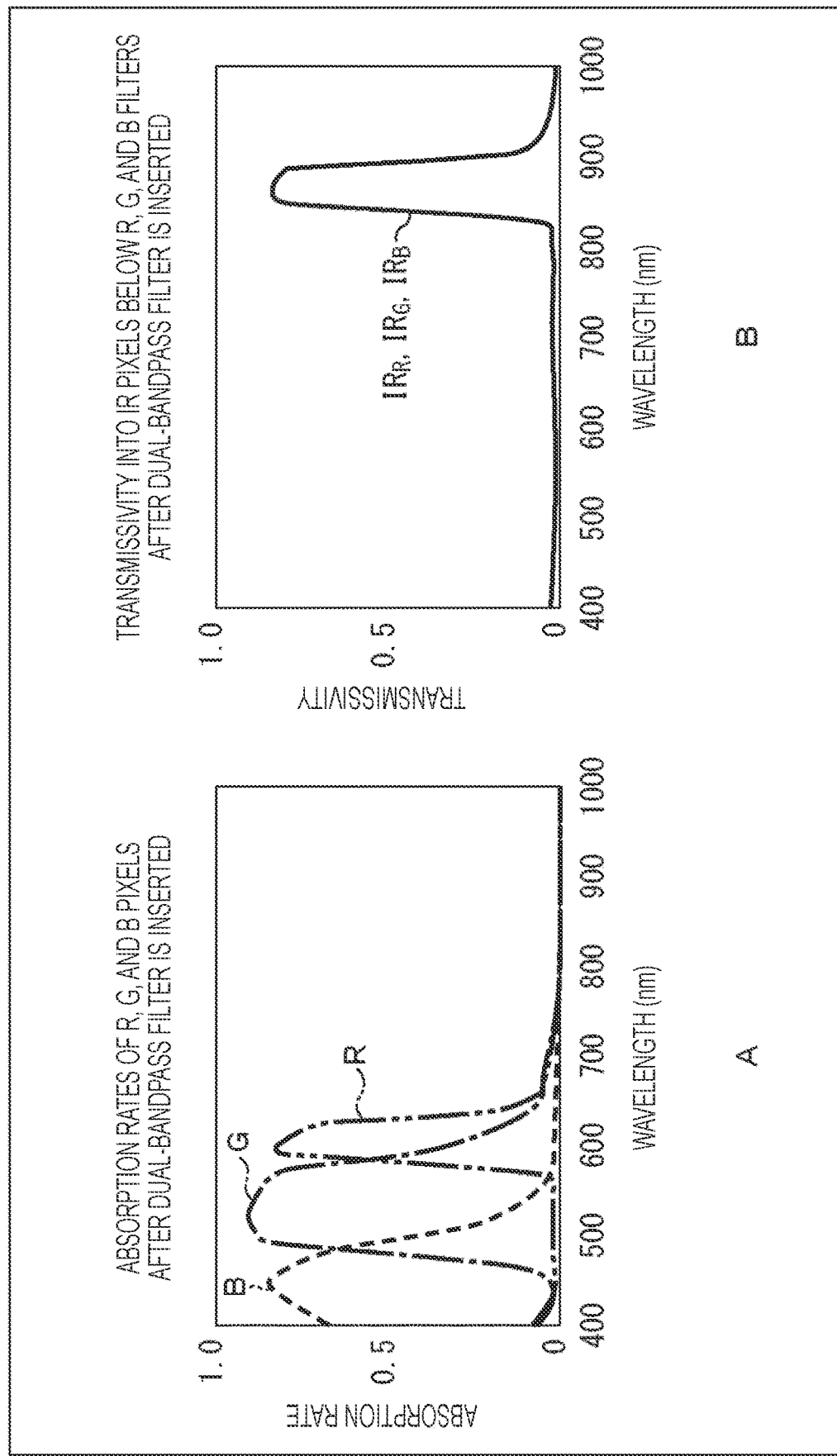
FIG. 11 is a diagram illustrating characteristics of each pixel after the dual-bandpass filter is inserted.

FIG. 11 is a diagram illustrating characteristics of each pixel after the dual-bandpass filter 141 is inserted. Additionally, the characteristics of the pixels illustrated in FIG. 11 are the characteristics of the pixels after the dual-bandpass filter 141 is inserted, and thus correspond to the characteristics of the pixels 100 illustrated in FIG. 8.

A of FIG. 11 illustrates absorption rates of the pixels of the respective color components configured of the organic photoelectric conversion layer 112 in each wavelength band.

Here, in a case where the dual-bandpass filter 141 is provided above the color filters 111, the dual-bandpass filter 141 has a transmission band in a wavelength region (a range of 400 to 650 nm, or the like, for example) of the visible light region, and thus the organic photoelectric conversion layer 112 can absorb lights in the visible light region transmitting through the dual-bandpass filter 141 and the color filters 111.

As illustrated in A of FIG. 11, the R pixel 100-1-R can absorb a light (visible light) corresponding to the wavelength region of the R-component light. Further, the G pixel 100-2-G can absorb a light corresponding to the wavelength region of the G-component light, and the B pixel 100-3-B can absorb a light corresponding to the wavelength region of the B-component light.

Here, with a comparison between A of FIG. 10 and A of FIG. 11, the dual-bandpass filter 141 has a transmission band in the visible light region, and thus the organic photoelectric conversion layer 112 which absorbs a light in the visible light region can absorb the lights of the respective color components of R component, G component, and B component irrespective of the presence of the inserted dual-bandpass filter 141.

Further, B of FIG. 11 illustrates transmissivity into the IR pixels configured of the photodiodes 115 arranged below the color filters 111 of the respective color components.

Here, in a case where the dual-bandpass filter 141 is provided above the color filters 111, the dual-bandpass filter 141 has a transmission band in a wavelength region (a range of 800 to 900 nm, or the like, for example) of the infrared region, and thus only lights (infrared rays) in the wavelength region with the transmission band in the infrared region reach the IR pixel 100-1-IR$_R$, the IR pixel 100-2-IR$_G$, and the IR pixel 100-3-IR$_B$.

Then, the IR-component lights detected by (absorbed in) the IR pixel 100-1-IR$_R$, the IR pixel 100-2-IR$_G$, and the IR pixel 100-3-IR$_B$, respectively, correspond to the lights in the wavelength region with the transmission band in the infrared region of the dual-bandpass filter 141. Thus, as illustrated in B of FIG. 11, the spectra of the IR-component lights detected by (absorbed in) the IR pixel 100-1-IR$_R$, the IR pixel 100-2-IR$_G$, and the IR pixel 100-3-IR$_B$ can be uniformed.

With a comparison between B of FIG. 10 and B of FIG. 11, in a case where the dual-bandpass filter 141 is not inserted, the spectra of the IR-component lights detected by (absorbed in) the respective IR pixels vary, but the dual-bandpass filter 141 is inserted so that the spectra of the IR-component lights detected by (absorbed in) the respective IR pixels can be uniformed due to the transmission band in the infrared region. Consequently, the sensitivity can be uniformed per IR pixel, and the IR pixels can be used for generating the same IR image.

Figure 12:
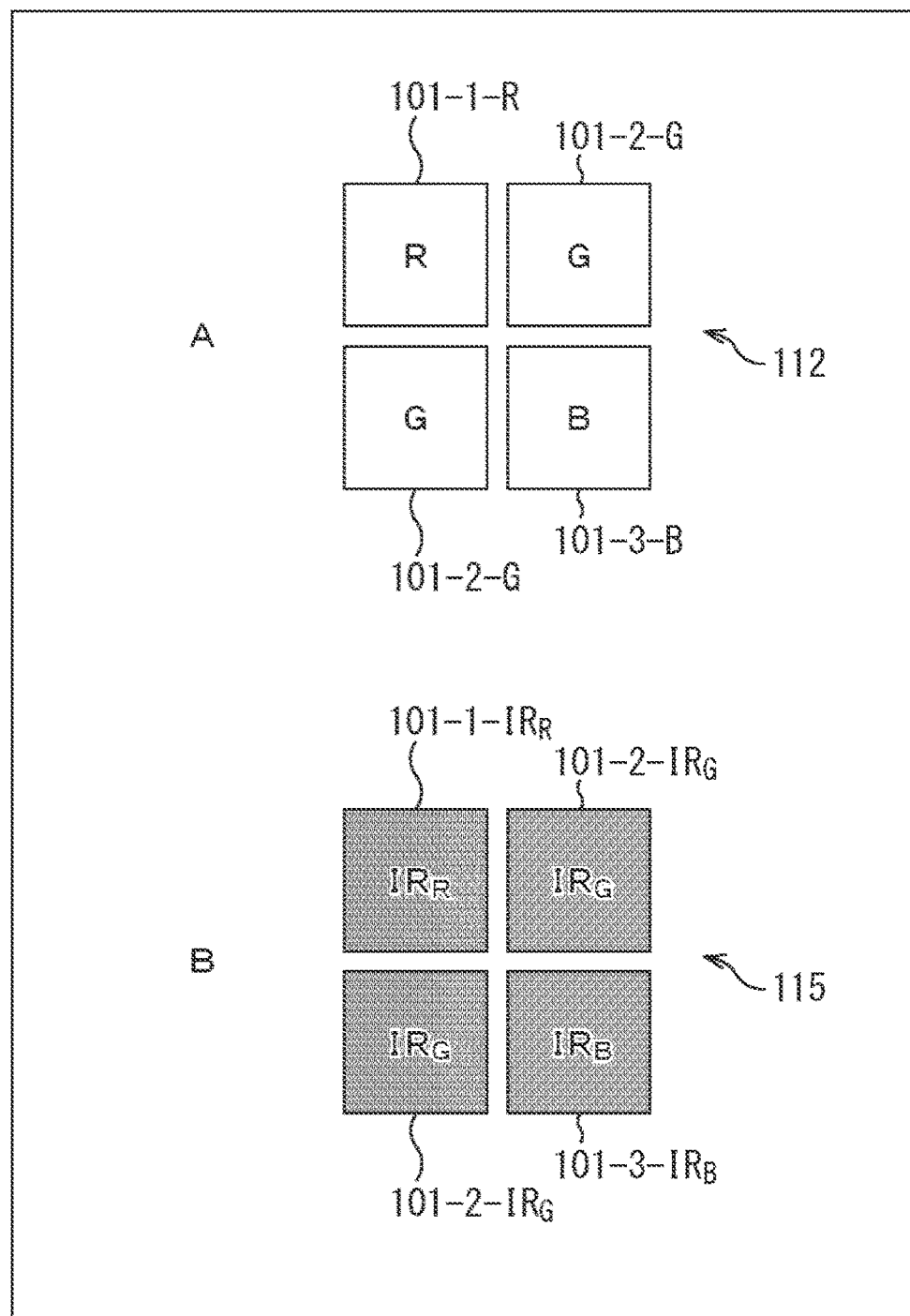
FIG. 12 is a diagram for explaining that a light spectrum detected per IR pixel is the same.

Here, for example, in a case where the pixels 100 illustrated in FIG. 8 are two-dimensionally arranged in the Bayer layout in the pixel array part 11, they can be expressed as the respective pixels illustrated in FIG. 12. That is, A of FIG. 12 illustrates an R pixel 100-1-R, G pixels 100-2-G, and a B pixel 100-3-B configured of the organic photoelectric conversion layer 112 (FIG. 8). Further, B of FIG. 12 illustrates an IR pixel 100-1-IR$_R$, IR pixels 100-2-IR$_G$, and an IR pixel 100-3-IR$_B$ configured of the photodiodes 115 (FIG. 8) embedded in the semiconductor layer 114 below the organic photoelectric conversion layer 112 (FIG. 8).

As illustrated in contrasting density of the respective IR pixels in B of FIG. 12, the spectra of the IR-component lights detected by (absorbed in) the IR pixel 100-1-IR$_R$, the IR pixels 100-2-IR$_G$, and the IR pixel 100-3-IR$_B$ are the same and the sensitivity of the respective IR pixels are the same.

In a case where the structure of the pixels 100 of FIG. 8 is employed in this way, the lights (visible lights) transmitting through the transmission band in the visible light region of the dual-bandpass filter 141 are absorbed in the R pixel 100-1-R, the G pixel 100-2-G, and the B pixel 100-3-B configured of the organic photoelectric conversion layer 112 as a photoelectric conversion region. On the other hand, the lights (infrared rays) transmitting through the transmission band in the infrared region of the dual-bandpass filter 141 are detected by (absorbed in) the IR pixel 100-1-IR$_R$, the IR pixel 100-2-IR$_G$, and the IR pixel 100-3-IR$_B$ configured of the photodiodes 115-1 to 115-3 as photoelectric conversion regions.

At this time, a light (infrared ray) detected by (absorbed in) each photodiode 115 is a light in the wavelength region with the transmission band in the infrared region of the dual-bandpass filter 141. Thus, the spectra of the lights detected by (absorbed in) the respective IR pixels are the same. Consequently, an IR image using the IR signals obtained from the IR pixels in all the pixels 100 two-dimensionally arranged in the pixel array part 11 (FIG. 1) can be acquired and a high-resolution IR image can be acquired.

In addition, a plurality of pixels 100 two-dimensionally arranged in the pixel array part 11 (FIG. 1) are pixels of any color component such as R pixel 100-1-R, G pixel 100-2-G, or B pixel 100-3-B depending on a layout pattern such as Bayer layout, and generates any of R signals, G signals, and B signals. Further, at the same time, all the plurality of pixels 100 two-dimensionally arranged in the pixel array part 11 (FIG. 1) are IR pixels with the same sensitivity (IR pixel 100-1-IR$_R$, IR pixel 100-2-IR$_G$, or IR pixel 100-3-IR$_B$), and generates IR signals.

As described above, the CMOS image sensor 10 (FIG. 1) having the pixels 100 (FIG. 8) according to the first embodiment can acquire a visible light image using R signals, G signal, or B signals obtained for a plurality of pixels 100 two-dimensionally arranged in a predetermined layout pattern, and a high-resolution IR image using the IR signals obtained from all the plurality of pixels 100 at the same time.

Further, at this time, the R pixel 100-1-R, the G pixel 100-2-G, or the B pixel 100-3-B which generates an R signal, a G signal, or a B signal photoelectrically converts a light (visible light) transmitting through the organic photoelectric conversion layer 112 and the color filter 111 formed above the photodiode 115, and thus can acquire a higher-quality visible light image (can keep image quality of a visible light image in using a conventional Bayer layout, for example) than in a case where an inorganic filter or the like is employed. Consequently, the structure of the pixels 100 according to the first embodiment is employed thereby to generate a high-resolution IR image while keeping high quality of a visible light image.

Additionally, the above description has been made by use of the Bayer layout as a layout pattern of a plurality of pixels 100 two-dimensionally arranged in the pixel array part 11 by way of example, but other layout pattern repeated at a predetermined cycle may be employed. Further, though not illustrated, on-chip lenses configured to condense an incident light are actually formed on top of the color filters 111 in the structures of the pixels 100 illustrated in FIG. 2 and FIG. 8.

3. Second Embodiment: Structure Using Multilayered Film (OPC: RGB Pixels, PD: IR Pixels)

A structure of pixels 200 according to the second embodiment will be described below with reference to FIG. 13 to FIG. 17.

Structure of Pixels

Figure 13:
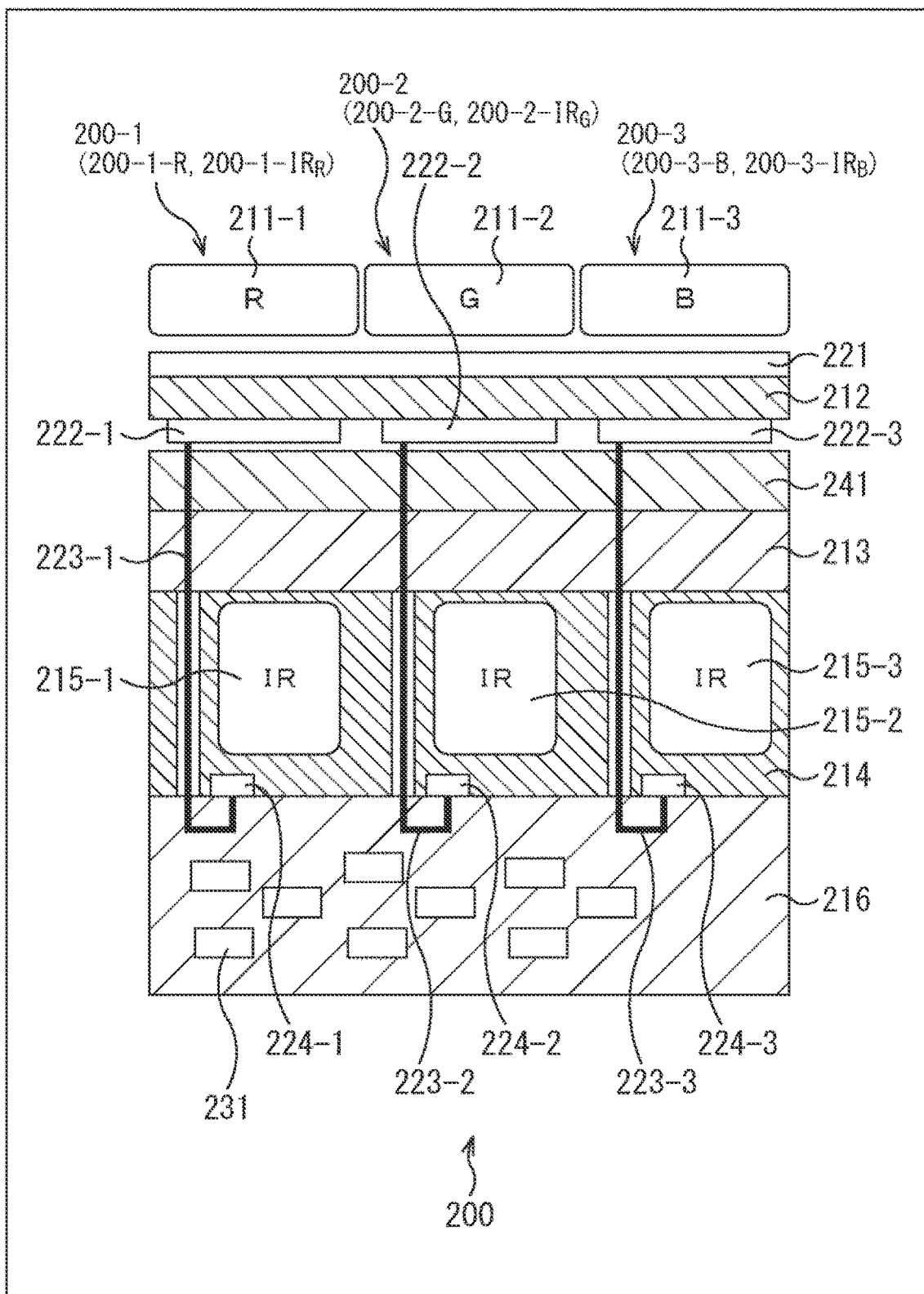
FIG. 13 is a cross-section view of a structure of pixels according to a second embodiment.

FIG. 13 is a cross-section view illustrating a structure of the pixels 200 according to the second embodiment.

FIG. 13 illustrates three pixels 200-1 to 200-3 arranged at arbitrary positions among a plurality of pixels 200 two-dimensionally arranged in the pixel array part 11 (FIG. 1). However, the pixels 200-1 to 200-3 employ a structure of backside irradiation type.

Additionally, color filters 211 to a wiring layer 216, a transparent electrode 221 to charge holding parts 224, and wirings 231 in the pixels 200 of FIG. 13 correspond to the color filters 111 to the wiring layer 116, the transparent electrode 121 to the charge holding parts 124, and the wirings 131 in the pixels 100 of FIG. 2, respectively.

That is, an organic photoelectric conversion layer 212 which absorbs only lights in the visible light region is formed above a semiconductor layer 214 in which photodiodes 215 configured to absorb a light in the infrared region are formed, and color filters 211 are further formed thereon in the pixels 200 of FIG. 13.

The pixels 200 has the structure illustrated in FIG. 13, and thus an R pixel 200-1-R, a G pixel 200-2-G, and a B pixel 200-3-B are configured of the organic photoelectric conversion layer 212. Further, an IR pixel 200-1-IR$_R$ is configured of a photodiode 215-1 in a pixel 200. Similarly, an IR pixel 200-2-IR$_G$ is configured of a photodiode 215-2, and an IR pixel 200-3-IR$_B$ is configured of a photodiode 215-3.

Figure 14:
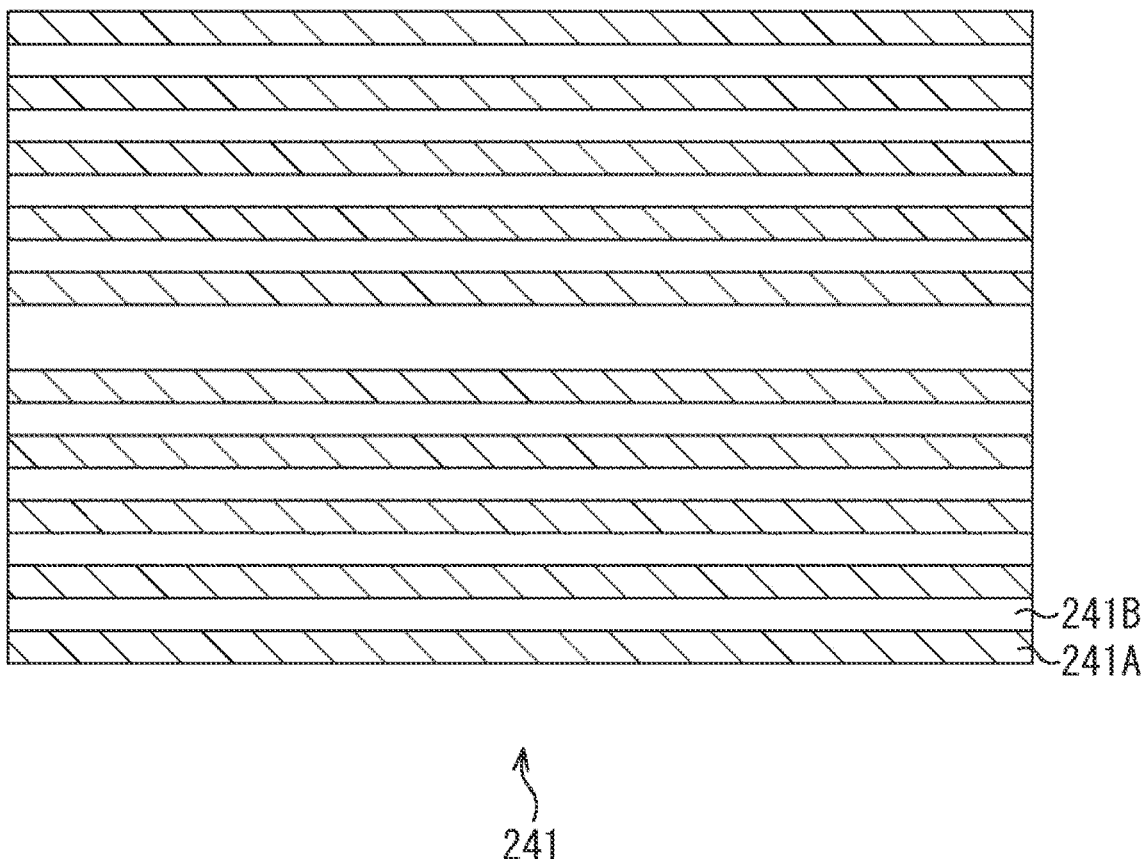
FIG. 14 is a diagram illustrating a structure of a multi-layered filter.

Further, in the pixels 200, a multilayered filter 241 is formed between the organic photoelectric conversion layer 212 and an interlayer insulative film 213. The multilayered filter 241 includes an inorganic material, and has a transmission band at least in the infrared region. FIG. 14 illustrates a cross-section structure of the multilayered filter 241.

In FIG. 14, the multilayered filter 241 is formed in a laminated structure of a high refractive index material 241A which is an inorganic material with a high refractive index and a low refractive index material 241B which is a material with a low refractive index, for example. The high refractive index material 241A can employ silicon nitride ($Si_3N_4$), titanium oxide ($TiO_2$), or the like, for example. Further, the low refractive index material 241B can employ silicon oxide (SiO) or the like, for example.

In FIG. 14, the high refractive index material 241A and the low refractive index material 241B are periodically and alternately laminated thereby to form the multilayered filter 241. For example, in the multilayered filter 241, a transmission band can be determined depending on the thickness of a low refractive index material 241B formed as an intermediate layer thicker than the other layers.

Figure 15:
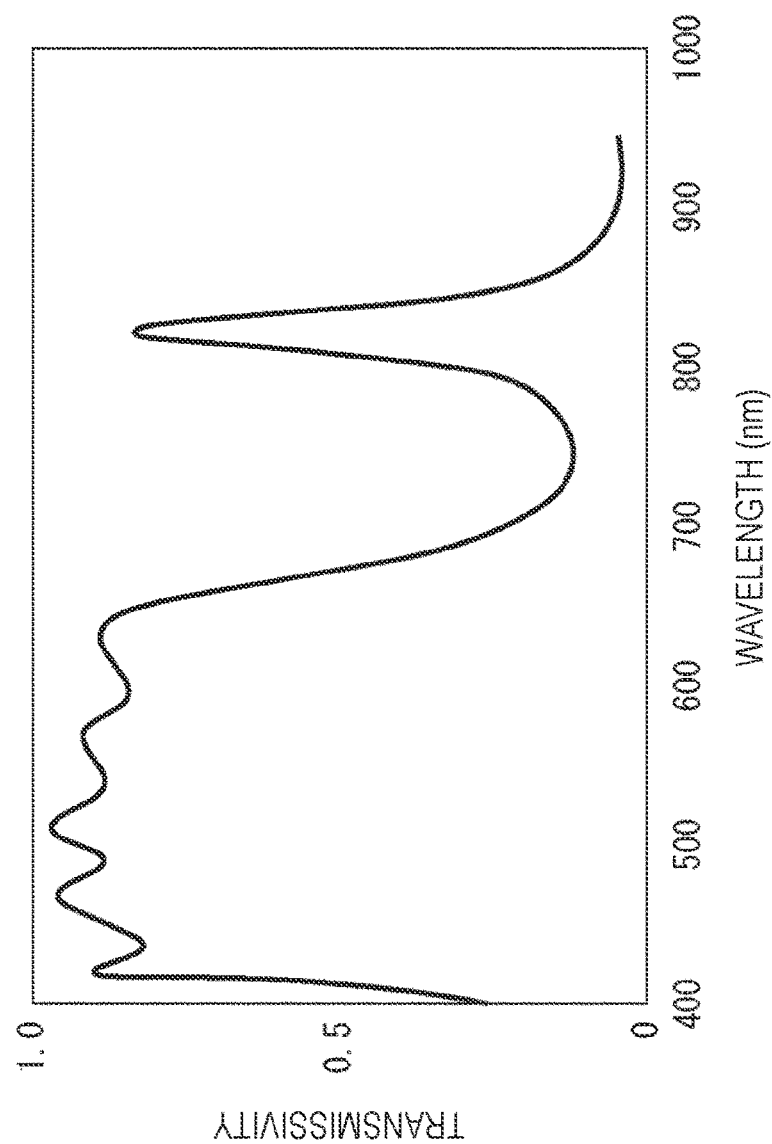
FIG. 15 is a diagram illustrating transmissivity of the multilayered filter in each wavelength band.

Here, FIG. 15 illustrates transmissivity of the multilayered filter 241 in each wavelength band. The horizontal axis indicates wavelength (nm) and the vertical axis indicates transmissivity in FIG. 15. As illustrated in FIG. 15, the multilayered filter 241 has the transmission bands in a wavelength region (a range of 400 to 650 nm, or the like, for example) of the visible light region and in a wavelength region (a range of 800 to 900 nm, or the like, for example) of the infrared region, respectively, and transmits lights with a wavelength included in the transmission bands.

The multilayered filter 241 is provided in the pixels 200 so that the spectrum of a light absorbed in each IR pixel can be uniformed for all the IR pixels by the transmission band in the infrared region. A difference in transmissivity into each IR pixel before and after the multilayered filter 241 is inserted will be described here with reference to FIG. 16 and FIG. 17.

Characteristics of Each Pixel Before Multilayered Filter is Inserted

Figure 16:
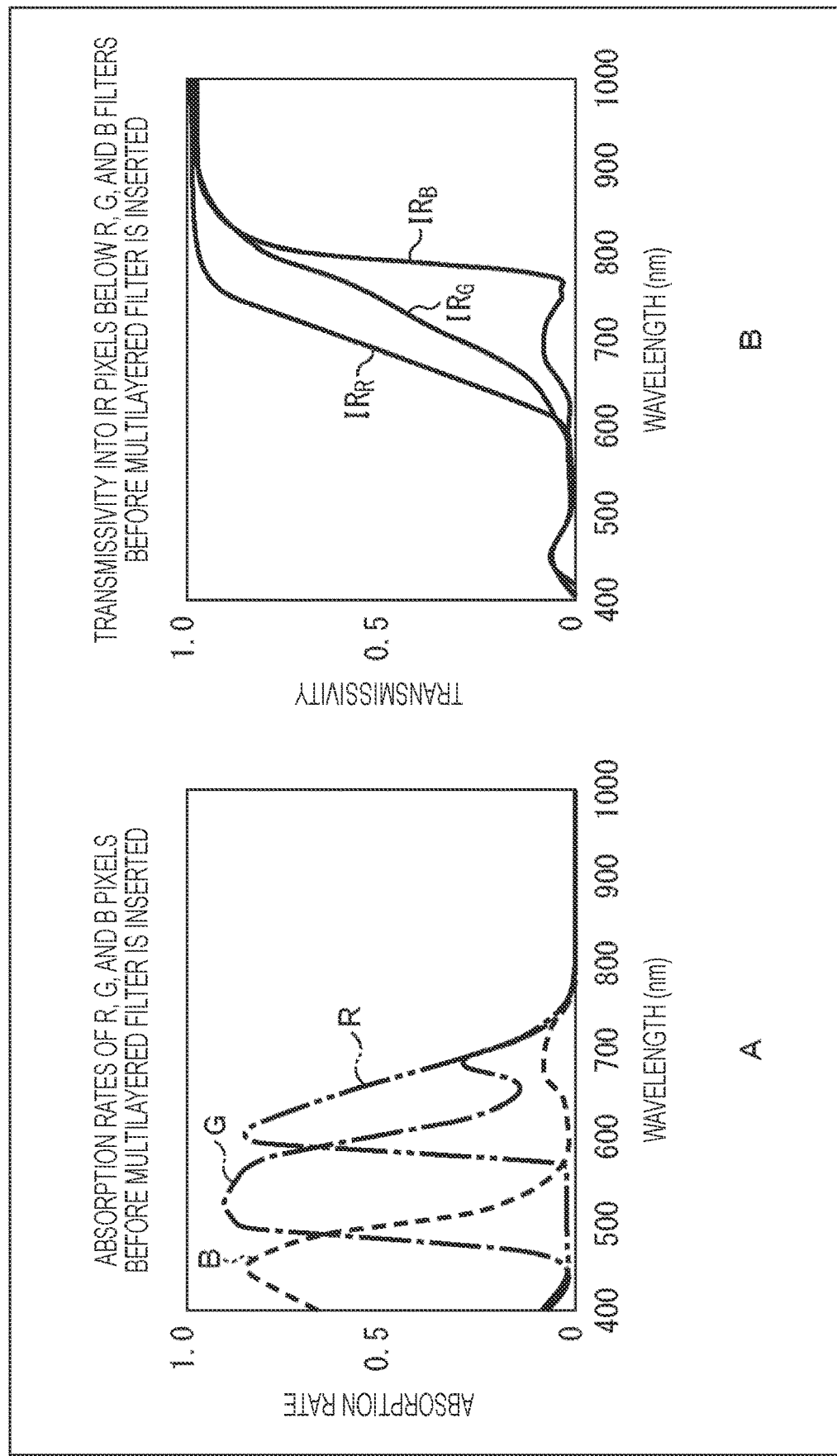
FIG. 16 is a diagram illustrating characteristics of each pixel before the multilayered filter is inserted.

FIG. 16 is a diagram illustrating characteristics of each pixel before the multilayered filter 241 is inserted. Additionally, the characteristics of the pixels illustrated in FIG. 16 are the characteristics of the pixels before the multilayered filter 241 is inserted, and thus correspond to the characteristics of the pixels 100 illustrated in FIG. 2.

A of FIG. 16 illustrates absorption rates of pixels of each color component configured of the organic photoelectric conversion layer 212 in each wavelength band. As illustrated in A of FIG. 16, the R pixel 200-1-R can absorb a light (visible light) corresponding to the wavelength region of the R-component light. Further, the G pixel 200-2-G can absorb a light corresponding to the wavelength region of the G-component light, and the B pixel 200-3-B can absorb a light corresponding to the wavelength region of the B-component light.

Further, B of FIG. 16 illustrates transmissivity into the IR pixels arranged below the color filters 211 of the respective color components. As illustrated in B of FIG. 16, the spectra of the IR-component lights absorbed in the IR pixel 200-1-$IR_R$, the IR pixel 200-2-$IR_G$, and the IR pixel 200-3-$IR_B$ are different. That is, as described above, the IR pixels are different in sensitivity per IR pixel, and thus the IR pixels cannot be used to generate the same IR image.

Characteristics of Each Pixel after Multilayered Filter is Inserted

Figure 17:
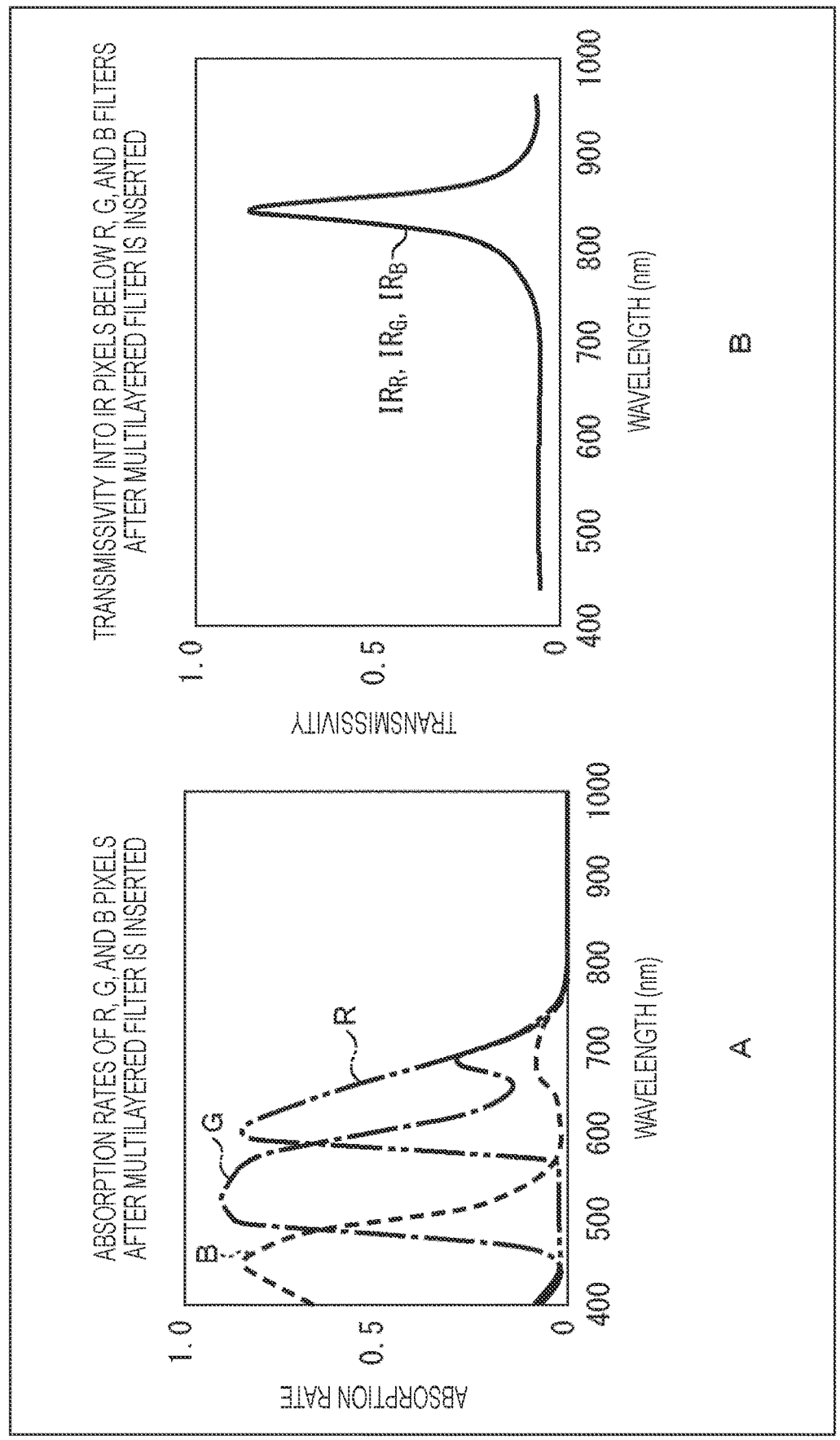
FIG. 17 is a diagram illustrating characteristics of each pixel after the multilayered filter is inserted.

FIG. 17 is a diagram illustrating characteristics of each pixel after the multilayered filter 241 is inserted. Additionally, the characteristics of the pixels illustrated in FIG. 17 are the characteristics of the pixels after the multilayered filter 241 is inserted, and thus correspond to the characteristics of the pixels 200 illustrated in FIG. 13.

A of FIG. 17 illustrates absorption rates of pixels of each color component configured of the organic photoelectric conversion layer 212 in each wavelength band. The multilayered filter 241 is formed below the organic photoelectric conversion layer 212 in the pixels 200 so that the lights absorbed in the R pixel 200-1-R, the G pixel 200-2-G, and the B pixel 200-3-B do not change before and after the multilayered filter 241 is inserted. That is, the waveforms of the absorption rates of the R, G, and B pixels illustrated in A of FIG. 16 are the same as the waveforms of the absorption rates of the R, G, and B pixels illustrated in A of FIG. 17.

Further, B of FIG. 17 illustrates transmissivity into the IR pixels arranged below the color filters 211 of the respective color components.

Here, in a case where the multilayered filter 241 is provided below the organic photoelectric conversion layer 212, the multilayered filter 241 has a transmission band in a wavelength region (a range of 800 to 900 nm, or the like, for example) of the infrared region, and thus only lights (infrared rays) in the wavelength region with the transmission band in the infrared region reach the IR pixel 200-1-$IR_R$, the IR pixel 200-2-$IR_G$, and the IR pixel 200-3-$IR_B$.

In addition, the IR-component lights absorbed in the IR pixel 200-1-$IR_R$, the IR pixel 200-2-$IR_G$, and the IR pixel 200-3-$IR_B$, respectively, correspond to the lights in the wavelength region with the transmission band in the infrared region of the multilayered filter 241. Thus, as illustrated in B of FIG. 17, the spectra of the IR-component lights detected by the IR pixel 200-1-$IR_R$, the IR pixel 200-2-$IR_G$, and the IR pixel 200-3-$IR_B$, respectively, can be uniformed.

With a comparison between B of FIG. 16 and B of FIG. 17, in a case where the multilayered filter 241 is not inserted, the spectra of the IR-component lights absorbed in the respective IR pixels vary, but the multilayered filter 241 is inserted so that the spectra of the IR-component lights absorbed in the respective IR pixels can be uniformed by the transmission band in the infrared region. Consequently, the sensitivity per IR pixel can be uniformed, and the IR pixels can be used to generate the same IR image.

Additionally, the description has been made assuming that the multilayered filter 241 is characterized in that the transmission bands are provided in both the visible light region and the infrared region in FIG. 15, but a transmission band may be provided only in the infrared region. That is, the multilayered filter 241 is provided below the organic photoelectric conversion layer 212 in the pixels 200 so that the lights in the visible light region are sufficiently absorbed in the organic photoelectric conversion layer 212. Thus, if a transmission band is not provided in the visible light region in the multilayered filter 241 below the organic photoelectric conversion layer 212, a light in the visible light region does not have an effect on the photodiodes 215 below the multilayered filter 241.

Further, the multilayered filter 241 may be characterized in that a transmission band is provided in the infrared region and a light in the visible light region can be reflected. In this case, in a case where a light in the visible light region which cannot be absorbed in the organic photoelectric conversion layer 212 reaches the multilayered filter 241, the light in the visible light region can reflect toward the organic photoelectric conversion layer 212 by the multilayered filter 241.

Consequently, the organic photoelectric conversion layer 212 can absorb not only lights in the visible light region above it but also lights in the visible light region from the multilayered filter 241 below it, and thus the amount of absorbed light in the visible light region can be increased in the organic photoelectric conversion layer 212. Further, the organic photoelectric conversion layer 212 can increase the amount of absorbed light in the visible light region, and thus can decrease the thickness thereof.

In a case where the structure of the pixels 200 of FIG. 13 is employed in this way, lights (visible lights) transmitting through the respective color filters 211 are absorbed in the R pixel 200-1-R, the G pixel 200-2-G, and the B pixel 200-3-B configured of the organic photoelectric conversion layer 212 as a photoelectric conversion region. On the other hand, lights (infrared rays) transmitting through the transmission band in the infrared region of the multilayered filter 241 are absorbed in the IR pixel 200-1-$IR_R$, the IR pixel 200-2-$IR_G$, and the IR pixel 200-3-$IR_B$ configured of the photodiodes 215-1 to 215-3 as photoelectric conversion regions.

At this time, a light (infrared ray) absorbed in each photodiode 215 is a light in the wavelength region with the transmission band in the infrared region of the multilayered filter 241. Thus, the spectra of the lights absorbed in the respective IR pixels are uniformed. Consequently, an IR image using the IR signals obtained from the IR pixels in all the pixels 200 two-dimensionally arranged in the pixel array part 11 (FIG. 1) can be acquired, and a high-resolution IR image can be acquired.

Then, a plurality of pixels 200 two-dimensionally arranged in the pixel array part 11 (FIG. 1) are pixels of any color component such as R pixel 200-1-R, G pixel 200-2-G, or B pixel 200-3-B depending on a layout pattern such as Bayer layout, thereby generating any of R signals, G signals, and B signals. Further, at the same time, all the plurality of pixels 200 two-dimensionally arranged in the pixel array part 11 (FIG. 1) are IR pixels with the same sensitivity (IR pixel 200-1-$IR_R$, IR pixel 200-2-$IR_G$, or IR pixel 200-3-$IR_B$) thereby to generate IR signals.

As described above, the CMOS image sensor 10 (FIG. 1) having the pixels 200 (FIG. 13) according to the second embodiment can acquire a visible light image using R signals, G signals, or B signals obtained for a plurality of pixels 200 two-dimensionally arranged in a predetermined layout pattern, and a high-resolution IR image using the IR signals obtained from all the plurality of pixels 200 at the same time.

Further, at this time, the R pixel 200-1-R, the G pixel 200-2-G, or the B pixel 200-3-B which generates an R signal, a G signal, or a B signal photoelectrically converts a light (visible light) transmitting through the organic photoelectric conversion layer 212 and the color filter 211 formed above the photodiode 215, thereby acquiring a high-quality visible light image. Consequently, the structure of the pixels 200 according to the second embodiment is employed thereby to generate a high-resolution IR image while keeping high quality of a visible light image.

4. Third Embodiment: Structure Using Plasmon Filter (OPC: RGB Pixels, PD: IR Pixels)

A structure of pixels 300 according to the third embodiment will be described below with reference to FIG. 18 and FIG. 19.

Structure of Pixels

Figure 18:
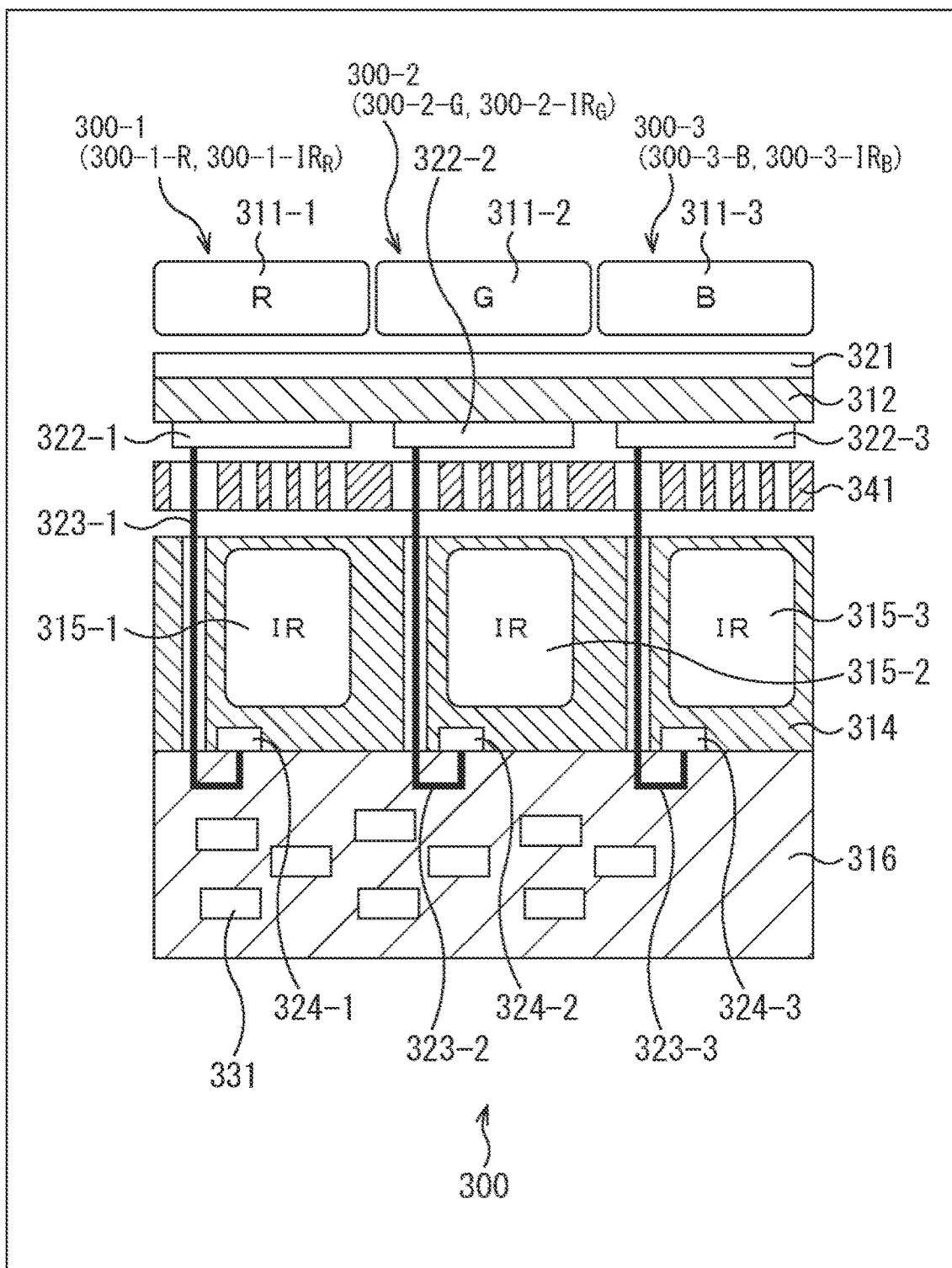
FIG. 18 is a cross-section view illustrating a structure of pixels according to a third embodiment.

FIG. 18 is a cross-section view illustrating a structure of the pixels 300 according to the third embodiment.

FIG. 18 illustrates three pixels 300-1 to 300-3 arranged at arbitrary positions among a plurality of pixels 300 two-dimensionally arranged in the pixel array part 11 (FIG. 1) by way of example. However, the pixels 300-1 to 300-3 employ a structure of backside irradiation type.

Additionally, color filters 311 to a wiring layer 316, a transparent electrode 321 to charge holding parts 324, and wirings 331 in the pixels 300 of FIG. 18 correspond to the color filters 111 to the wiring layer 116, the transparent electrode 121 to the charge holding parts 124, and the wirings 131 in the pixels 100 of FIG. 2, respectively.

That is, in the pixels 300 of FIG. 18, an organic photoelectric conversion layer 312 configured to absorb only lights in the visible light region is formed above a semiconductor layer 314 in which photodiodes 315 as photoelectric conversion regions are formed, and the color filters 311 are further formed thereon.

The pixels 300 employ the structure illustrated in FIG. 18 so that an R pixel 300-1-R, a G pixel 300-2-G, and a B pixel 300-3-B are configured of the organic photoelectric conversion layer 312. Further, an IR pixel 300-1-$IR_R$ is configured of a photodiode 315-1 in a pixel 300. Similarly, an IR pixel 300-2-$IR_G$ is configured of a photodiode 315-2 and an IR pixel 300-3-$IR_B$ is configured of a photodiode 315-3.

Further, a plasmon filter 341 is formed between the organic photoelectric conversion layer 312 and the semiconductor layer 314 in the pixels 300. The plasmon filter 341 is a metal thin-film filter using surface plasmon polariton (SPP), and has a transmission band at least in the infrared region. FIG. 19 illustrates a structure of the plasmon filter 341.

Figure 19:
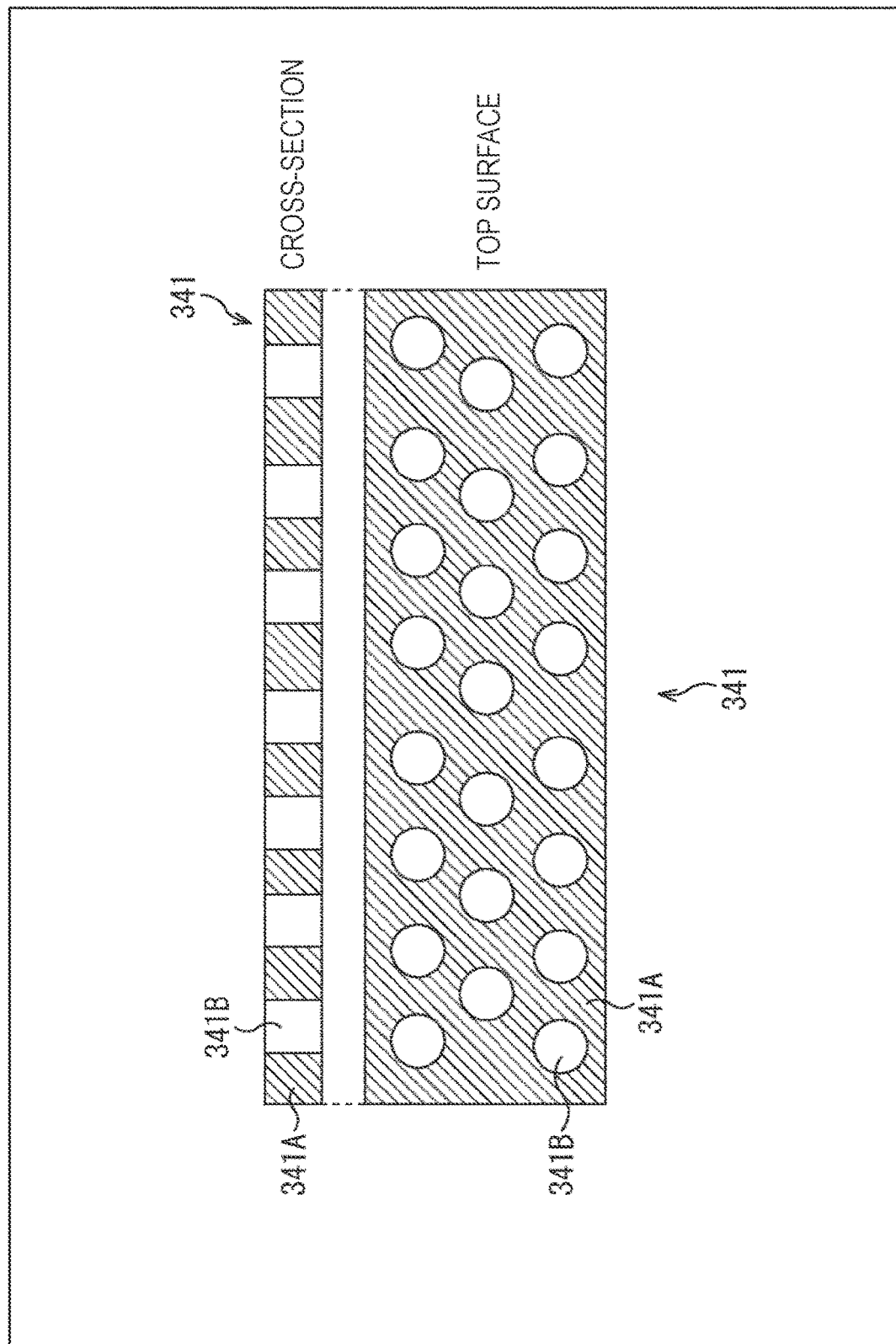
FIG. 19 is a diagram illustrating a structure of a plasmon filter.

In FIG. 19, the plasmon filter 341 is configured in which holes 3416 having an opening with a predetermined diameter are arranged for a metal thin-film 341A in a honeycomb structure. The metal thin-film 341A includes a metal such as aluminum (Al), gold (Au), or silver (Ag), an alloy, or the like, for example. Further, the diameter of the opening of the hole 3416 is as large as a photodiode 315 formed in the semiconductor layer 314 can detect a light within a certain wavelength region in the infrared region. Additionally, a material such as silicon nitride (SiN) can be embedded inside the holes 3416.

Additionally, the arrangement of the holes 3416 in the plasmon filter 341 is not limited to the honeycomb structure illustrated in FIG. 19, but may be any periodic arrangement such as arrangement having an orthogonal matrix (square matrix) structure, and the like. Further, the microstructural pattern of the plasmon filter 341 may be a ring-shaped, dot-shaped pattern, or the like, for example, in addition to a structure in which the holes 3416 are arranged illustrated in FIG. 19. That is, the plasmon filter 341 can be a metal thin-film filter in which at least one periodic microstructural pattern is formed for the metal thin-film.

In a case where the structure of the pixels 300 of FIG. 18 is employed in this way, lights (visible lights) transmitting through the respective color filters 311 are absorbed in the R pixel 300-1-R, the G pixel 300-2-G, and the B pixel 300-3-B configured of the organic photoelectric conversion layer 312 as a photoelectric conversion region. On the other hand, lights (infrared rays) transmitting through the plasmon filter 341 are absorbed in the IR pixel 300-1-$IR_R$, the IR pixel 300-2-$IR_G$, and the IR pixel 300-3-$IR_B$ configured of the photodiodes 315-1 to 315-3 as photoelectric conversion regions, respectively.

At this time, a light (infrared ray) absorbed in each IR pixel configure of each photodiode 315 is a light in a certain wavelength region in the infrared region transmitting through the plasmon filter 341. Thus, the spectra of the lights absorbed in the respective IR pixels are the same. Consequently, an IR image using the IR signals obtained from the IR pixels in all the pixels 300 two-dimensionally arranged in the pixel array part 11 (FIG. 1) can be acquired, and a high-resolution IR image can be acquired.

Then, a plurality of pixels 300 two-dimensionally arranged in the pixel array part 11 (FIG. 1) are pixels of any color component such as R pixel 300-1-R, G pixel 300-2-G, or B pixel 300-3-B depending on a layout pattern such as Bayer layout thereby to generate any of R signals, G signals, and B signals. Further, at the same time, all the plurality of pixels 300 two-dimensionally arranged in the pixel array part 11 (FIG. 1) are IR pixels with the same sensitivity (IR pixel 300-1-$IR_R$, IR pixel 300-2-$IR_G$, or IR pixel 300-3-$IR_B$) thereby to generate IR signals.

As described above, the CMOS image sensor 10 (FIG. 1) having the pixels 300 (FIG. 18) according to the third embodiment can acquire a visible light image using R signals, G signals, or B signals obtained for a plurality of pixels 300 two-dimensionally arranged in a predetermined layout pattern and a high-resolution IR image using the IR signals obtained from all the plurality of pixels 300 at the same time.

Further, at this time, the R pixel 300-1-R, the G pixel 300-2-G, or the B pixel 300-3-B configured to generate an R signal, a G signal, or a B signal photoelectrically converts a light (visible light) transmitting through the organic photoelectric conversion layer 312 and the color filter 311 formed above the photodiode 315, thereby acquiring a high-quality visible light image. Consequently, the structure of the pixels 300 according to the third embodiment is employed thereby to generate a high-resolution IR image while keeping high quality of a visible light image.

Additionally, the plasmon filter 341 is employed as a filter having a transmission band at least in the infrared region according to the third embodiment, and is advantageous in that the manufacturing steps are easier than in a case where the multilayered filter 241 having the similar characteristics is employed. That is, in a case where the multilayered filter 241 is employed, a step of manufacturing a multilayered film with different refractive indexes is required on manufacture, while the step is not required on manufacture in a case where the plasmon filter 341 is employed, and thus the manufacturing steps are easier in terms of the point.

5. Fourth Embodiment: Structure Using Dual-Bandpass Filter (OPC: IR Pixels, PD: RGB Pixels)

A structure of pixels 400 according to the fourth embodiment will be described below with reference to FIG. 20 to FIG. 23.

Structure of Pixels

Figure 20:
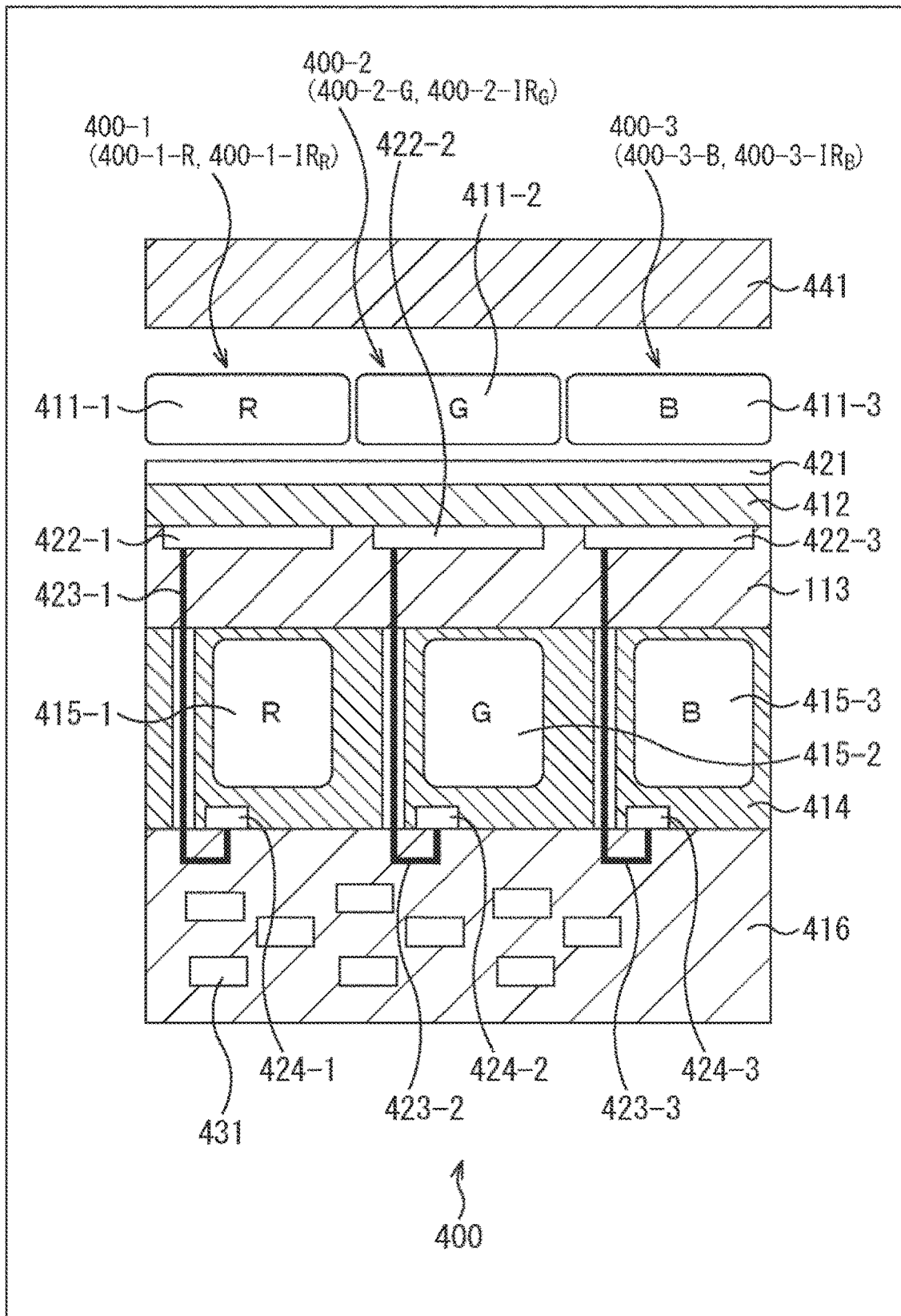
FIG. 20 is a cross-section view illustrating a structure of pixels according to a fourth embodiment.

FIG. 20 is a cross-section view illustrating a structure of the pixels 400 according to the fourth embodiment.

FIG. 20 illustrates three pixels 400-1 to 400-3 arranged at arbitrary positions among a plurality of pixels 400 two-dimensionally arranged in the pixel array part 11 (FIG. 1) by way of example. However, the pixels 400-1 to 400-3 employ a structure of backside irradiation type.

Additionally, color filters 411 to a wiring layer 416, a transparent electrode 421 to charge holding parts 424, and wirings 431 in the pixels 400 of FIG. 20 correspond to the color filters 111 to the wiring layer 116, the transparent electrode 121 to the charge holding parts 124, and the wirings 131 in the pixels 100 of FIG. 2, respectively.

That is, in the pixels 400 of FIG. 20, an organic photoelectric conversion layer 412 configured to absorb only lights in the infrared region is formed above a semiconductor layer 414 in which photodiodes 415 as photoelectric conversion regions are formed, and the color filters 411 are further formed thereon. Additionally, a photoelectric conversion material in the infrared region of the organic photoelectric conversion layer 412 can employ a bulk-hetero structure in a combination of chloroaluminum phthalocyanine (ClAlPc) absorbent in the infrared region and transparent organic semiconductor, for example.

The pixels 400 have the structure illustrated in FIG. 20, and thus an IR pixel 400-1-$IR_R$, an IR pixel 400-2-$IR_G$, and an IR pixel 400-3-$IR_B$ are configured of the organic photoelectric conversion layer 412. Further, in the pixels 400, an R pixel 400-1-R is configured of a photodiode 415-1. Similarly, a G pixel 400-2-G is configured of a photodiode 415-2, and a B pixel 400-3-B is configured of a photodiode 415-3.

Figure 21:
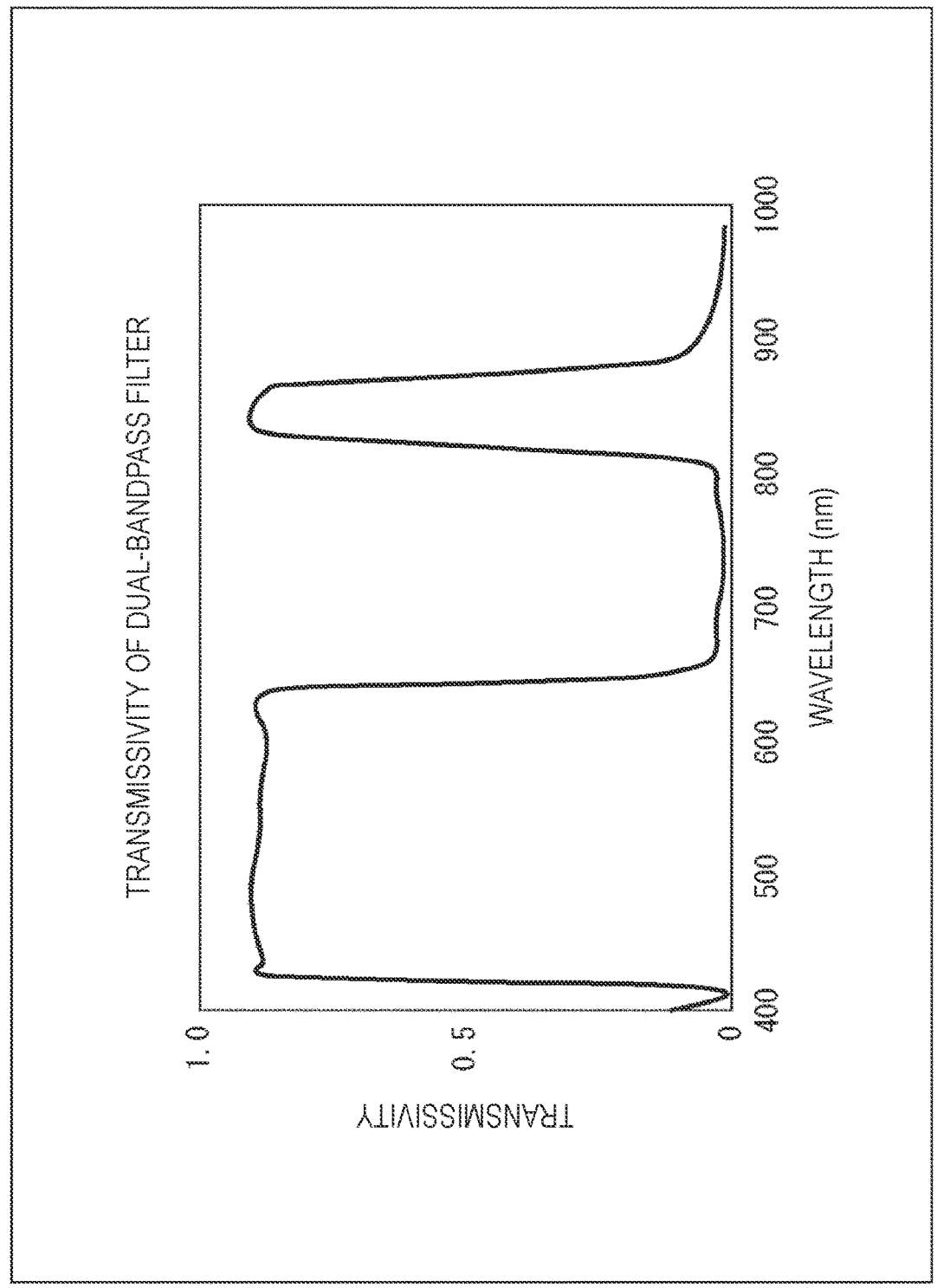
FIG. 21 is a diagram illustrating transmissivity of a dual-bandpass filter in each wavelength band.

Further, in the pixels 400, a dual-bandpass filter 441 is formed above the color filters 411. The dual-bandpass filter 441 has transmission bands in the visible light region and in the infrared region, respectively, similarly to the dual-bandpass filter 141 of FIG. 8. As illustrated in FIG. 21, the dual-bandpass filter 441 has the transmission bands in a wavelength region (a range of 400 to 650 nm, or the like, for example) of the visible light region and in a wavelength region (a range of 800 to 900 nm, or the like, for example) of the infrared region, respectively.

The dual-bandpass filter 441 is provided in the pixels 400 so that the spectrum of a light absorbed in each IR pixel can be the same for all the IR pixels due to the transmission band in the infrared region. A difference in transmissivity into each IR pixel before and after the dual-bandpass filter 441 is inserted will be described here with reference to FIG. 22 and FIG. 23.

Characteristics of Each Pixel Before Dual-Bandpass Filter is Inserted

Figure 22:
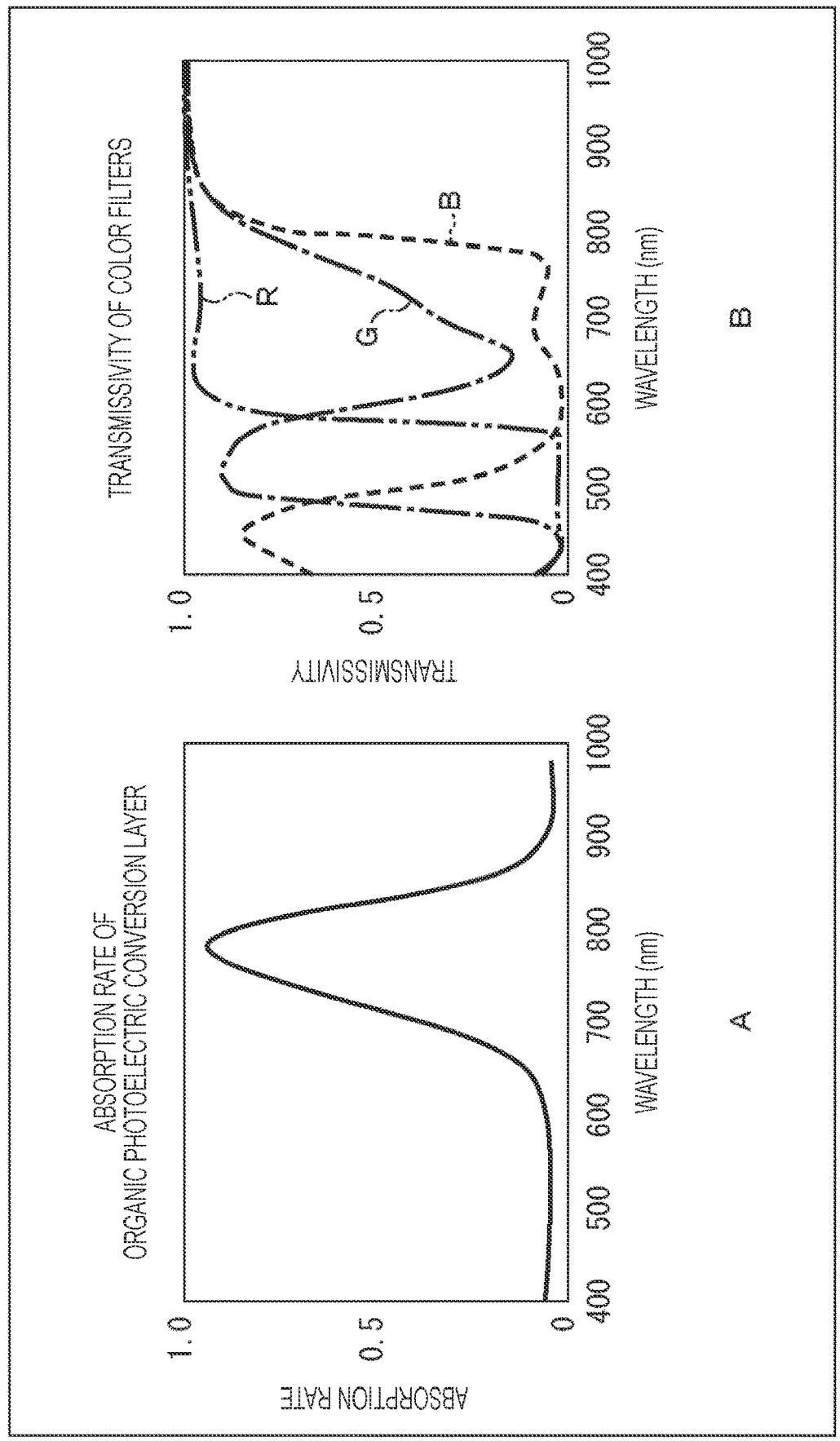
FIG. 22 is a diagram illustrating characteristics of each pixel before the dual-bandpass filter is inserted.

FIG. 22 is a diagram for explaining characteristics of each pixel before the dual-bandpass filter 441 is inserted.

A of FIG. 22 illustrates an absorption rate of the organic photoelectric conversion layer 412 in each wavelength band. As illustrated in A of FIG. 22, the organic photoelectric conversion layer 412 absorbs lights (infrared rays) corresponding to a wavelength region (wavelength region with a certain width) of an IR-component light, and thus infrared rays in the wavelength region with a certain width are absorbed in the IR pixel 400-1-$IR_R$, the IR pixel 400-2-$IR_G$, and the IR pixel 400-3-$IR_B$.

Further, B of FIG. 22 illustrates transmissivity of the color filters 411 of the respective color components in each wavelength band. The transmissivity into the R, G, and B pixels configured of the photodiodes 415 arranged below the color filters 411 corresponds to the lights transmitting through the color filters 411 having the characteristics of B of FIG. 22 and the organic photoelectric conversion layer 412 having the characteristics of A of FIG. 22. The transmitted lights (visible lights) are then absorbed in the R pixel 400-1-R, the G pixel 400-2-G, and the B pixel 400-3-B.

Characteristics of Each Pixel after Dual-Bandpass Filter is Inserted

Figure 23:
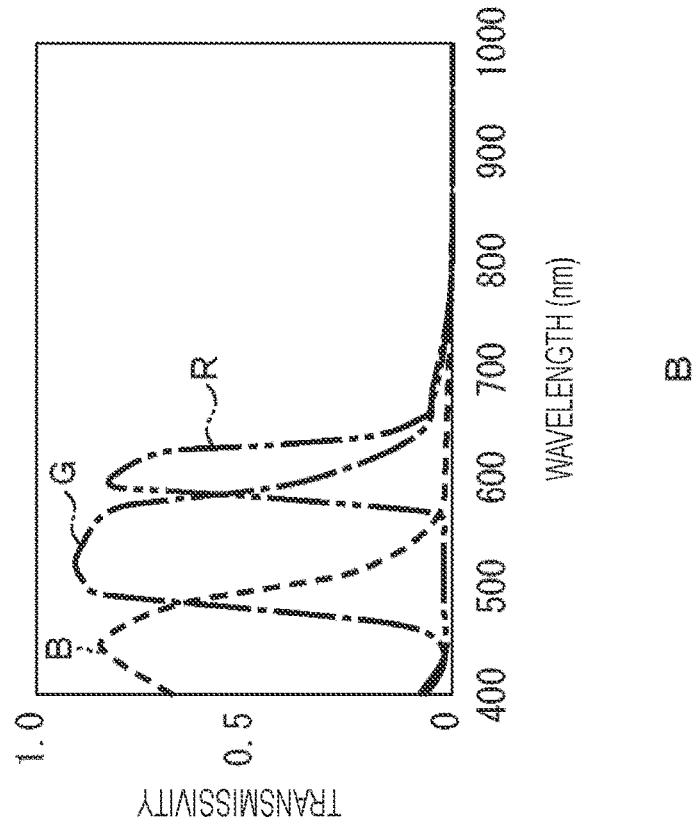
FIG. 23 is a diagram illustrating characteristics of each pixel after the dual-bandpass filter is inserted.
Figure 23:
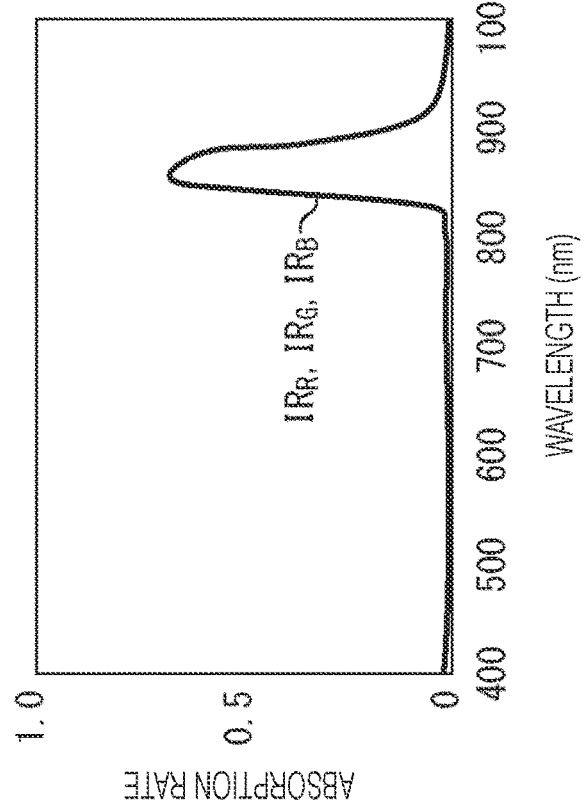

FIG. 23 is a diagram illustrating characteristics of each pixel after the dual-bandpass filter 441 is inserted. Additionally, the characteristics of the pixels illustrated in FIG. 23 are the characteristics of the pixels after the dual-bandpass filter 441 is inserted, and thus correspond to the characteristics of the pixels 400 illustrated in FIG. 20.

A of FIG. 23 illustrates an absorption rate of the IR pixels configured of the organic photoelectric conversion layer 412 in each wavelength band.

Here, in a case where the dual-bandpass filter 441 is provided above the color filters 411, the dual-bandpass filter 441 has a transmission band in a wavelength region (a range of 800 to 900 nm, or the like, for example) of the infrared region, and thus only lights (infrared rays) in the wavelength region with the transmission band in the infrared region are absorbed in the IR pixel 400-1-$IR_R$, the IR pixel 400-2-$IR_G$, and the IR pixel 400-3-$IR_B$.

Further, B of FIG. 23 illustrates transmissivity into the R, G, and B pixels configured of the photodiodes 415 arranged below the color filters 411 of the respective color components.

Here, in a case where the dual-bandpass filter 441 is provided above the color filters 411, the dual-bandpass filter 441 has a transmission band in a wavelength region (a range of 400 to 650 nm, or the like, for example) of the visible light region, and thus lights (visible lights) transmitting through the dual-bandpass filter 441 and the organic photoelectric conversion layer 412 are absorbed in the R pixel 400-1-R, the G pixel 400-2-G, and the B pixel 400-3-B.

As illustrated in B of FIG. 23, the R pixel 400-1-R can absorb a light (visible light) corresponding to the wavelength region of the R-component light. Further, the G pixel 400-2-G can absorb a light corresponding to the wavelength region of the G-component light, and the B pixel 400-3-B can absorb a light corresponding to the wavelength region of the B-component light.

In a case where the structure of the pixels 400 of FIG. 20 is employed in this way, lights (infrared rays) transmitting through the transmission band in the infrared region of the dual-bandpass filter 441 are absorbed in the IR pixel 400-1-$IR_R$, the IR pixel 400-2-$IR_G$, and the IR pixel 400-3-$IR_B$ configured of the organic photoelectric conversion layer 412 as a photoelectric conversion region. On the other hand, lights (visible lights) transmitting through the transmission band in the visible light region of the dual-bandpass filter 441 are absorbed in the R pixel 400-1-R, the G pixel 400-2-G, and the B pixel 400-3-B configured of the photodiodes 415-1 to 415-3 as photoelectric conversion regions.

At this time, a light (infrared ray) absorbed in each IR pixel configured of the organic photoelectric conversion layer 412 is a light in the wavelength region with the transmission band in the infrared region of the dual-bandpass filter 441. Thus, the spectra of the lights absorbed in the respective IR pixels are the same. Consequently, an IR image using the IR signals obtained from the IR pixels in all the pixels 400 two-dimensionally arranged in the pixel array part 11 (FIG. 1) can be acquired, and a high-resolution IR image can be acquired.

A plurality of pixels 400 two-dimensionally arranged in the pixel array part 11 (FIG. 1) are then pixels of any color component such as R pixel 400-1-R, G pixel 400-2-G, or B pixel 400-3-B depending on a layout pattern such as Bayer layout thereby to generate any of R signals, G signal, and B signals. Further, at the same time, all the plurality of pixels 400 two-dimensionally arranged in the pixel array part 11 (FIG. 1) are IR pixels with the same sensitivity (IR pixel 400-1-$IR_R$, IR pixel 400-2-$IR_G$, or IR pixel 400-3-$IR_B$) thereby to generate IR signals.

As described above, the CMOS image sensor 10 (FIG. 1) having the pixels 400 (FIG. 20) according to the fourth embodiment can acquire a visible light image using R signals, G signals, or B signals obtained for a plurality of pixels 400 two-dimensionally arranged in a predetermined layout pattern, and a high-resolution IR image using the IR signals obtained from all the plurality of pixels 400 at the same time.

Further, at this time, the R pixel 400-1-R, the G pixel 400-2-G, or the B pixel 400-3-B which generates an R signal, a G signal, or a B signal photoelectrically converts a light (visible light) transmitting through the organic photoelectric conversion layer 412 and the color filter 411 formed above the photodiode 415, thereby acquiring a high-quality visible light image. Consequently, the structure of the pixels 400 according to the fourth embodiment is employed thereby to generate a high-resolution IR image while keeping high quality of a visible light image.

6. Fifth Embodiment: Structure Using Multilayered Filter (OPC: IR Pixels, PD: RGB Pixels)

A structure of pixels 500 according to the fifth embodiment will be finally described with reference to FIG. 24 and FIG. 25.
Structure of Pixels FIG. 24 is a cross-section view illustrating a structure of the pixels 500 according to the fifth embodiment.

Figure 24:
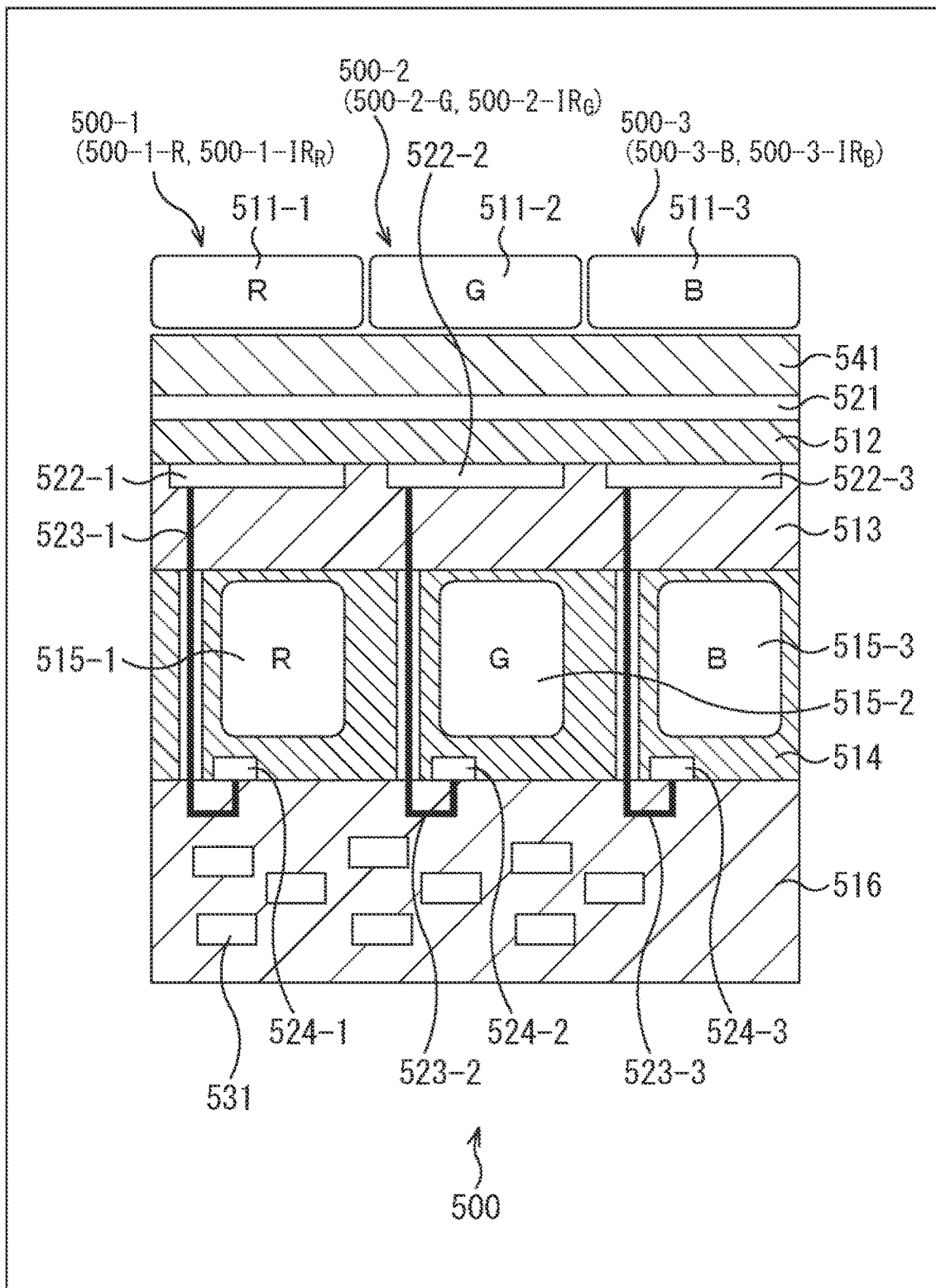
FIG. 24 is a cross-section view illustrating a structure of pixels according to a fifth embodiment.
Figure 25:
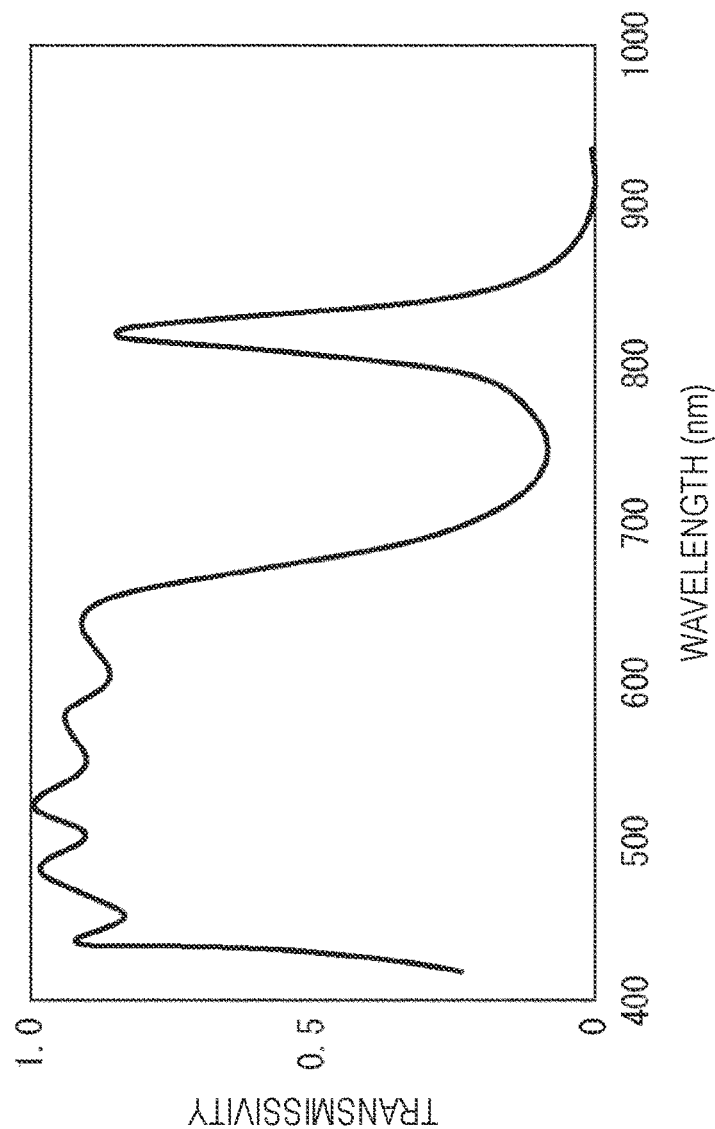
FIG. 25 is a diagram illustrating transmissivity of a multilayered filter in each wavelength band.

FIG. 24 illustrates three pixels 500-1 to 500-3 arranged at arbitrary positions among a plurality of pixels 500 two-dimensionally arranged in the pixel array part 11 (FIG. 1) by way of example. However, the pixels 500-1 to 500-3 employ a structure of backside irradiation type. Additionally, color filters 511 to a wiring layer 516, a transparent electrode 521 to charge holding parts 524, and wirings 531 in the pixels 500 of FIG. 24 correspond to the color filters 111 to the wiring layer 116, the transparent electrode 121 to the charge holding parts 124, and the wirings 131 in the pixels 100 of FIG. 2, respectively.

That is, in the pixels 500 of FIG. 24, an organic photoelectric conversion layer 512 which absorbs only lights in the infrared regions is formed above a semiconductor layer 514 in which photodiodes 515 as photoelectric conversion regions are formed, and the color filters 511 are further formed thereon. Additionally, a photoelectric conversion material of the infrared region of the organic photoelectric conversion layer 512 can employ a bulk-hetero structure similarly to the organic photoelectric conversion layer 412 of FIG. 20.

The pixels 500 have the structure illustrated in FIG. 24, and thus an IR pixel 500-1-$IR_R$, an IR pixel 500-2-$IR_G$, and an IR pixel 500-3-$IR_B$ are configured of the organic photoelectric conversion layer 512. Further, in the pixels 500, an R pixel 500-1-R is configured of a photodiode 515-1. Similarly, a G pixel 500-2-G is configured of a photodiode 515-2, and a B pixel 500-3-B is configured of a photodiode 515-3.

Further, a multilayered filter 541 is formed between the color filters 511 and the organic photoelectric conversion layer 512 in the pixels 500. The multilayered filter 541 has transmission bands in the visible light region and the infrared region, respectively, similarly to the multilayered filter 241 of FIG. 13. As illustrated in FIG. 25, the multilayered filter 541 has the transmission bands in a wavelength region (a range of 400 to 650 nm, or the like, for example) of the visible light region and in a wavelength region (a range of 800 to 900 nm, or the like, for example) of the infrared region, respectively.

In a case where the structure of the pixels 500 of FIG. 24 is employed in this way, lights (infrared rays) transmitting through the transmission band in the infrared region of the multilayered filter 541 are absorbed in the IR pixel 500-1-$IR_R$, the IR pixel 500-2-$IR_G$, and the IR pixel 500-3-$IR_B$ configured of the organic photoelectric conversion layer 512 as a photoelectric conversion region. On the other hand, lights (visible lights) transmitting through the transmission band in the visible light region of the multilayered filter 541 are absorbed in the R pixel 500-1-R, the G pixel 500-2-G, and the B pixel 500-3-B configured of the photodiodes 515-1 to 515-3 as photoelectric conversion regions, respectively.

At this time, a light (infrared ray) absorbed in each IR pixel configured of the organic photoelectric conversion layer 512 is a light in the wavelength region with the transmission band in the infrared region of the multilayered filter 541. Thus, the spectra of the lights absorbed in the respective IR pixels are the same. Consequently, an IR image using the IR signals obtained from the IR pixels in all the pixels 500 two-dimensionally arranged in the pixel array part 11 (FIG. 1) can be acquired, and a high-resolution IR image can be acquired.

A plurality of pixels 500 two-dimensionally arranged in the pixel array part 11 (FIG. 1) are then pixels of any color component such as R pixel 500-1-R, G pixel 500-2-G, or B pixel 500-3-B depending on a layout pattern such as Bayer layout thereby to generate any of R signals, G signals, and B signals. Further, at the same time, all the plurality of pixels 500 two-dimensionally arranged in the pixel array part 11

(FIG. 1) are IR pixels with the same sensitivity (IR pixel 500-1-IR$_R$, IR pixel 500-2-IR$_G$, or IR pixel 500-3-IR$_B$) thereby to generate IR signals.

As described above, the CMOS image sensor 10 (FIG. 1) having the pixels 500 (FIG. 24) according to the fifth embodiment can acquire a visible light image using R signals, G signals, or B signals obtained for a plurality of pixels 500 two-dimensionally arranged in a predetermined layout pattern, and a high-resolution IR image using the IR signals obtained from all the plurality of pixels 500 at the same time.

Further, at this time, the R pixel 500-1-R, the G pixel 500-2-G, or the B pixel 500-3-B which generates an R signal, a G signal, or a B signal photoelectrically converts a light (visible light) transmitting through the organic photoelectric conversion layer 512 and the color filter 511 formed above the photodiode 515 thereby to acquire a high-quality visible light image. Consequently, the structure of the pixels 500 according to the fifth embodiment is employed thereby to generate a high-resolution IR image while keeping high quality of a visible light image.

7. Readout Circuit

A readout circuit in a pixel according to the first embodiment to the fifth embodiment will be described below with reference to FIG. 26 and FIG. 27. A circuit for reading out signal charges obtained by the organic photoelectric conversion layer 112 and a circuit for reading out signal charges obtained by the photodiode 115 in a pixel 100 (FIG. 8) according to the first embodiment will be described here by way of example.

However, a readout circuit for the organic photoelectric conversion layer 112 employs a system in which a memory part is provided for reducing noises and a system in which a feedback amplifier is provided to feed back a signal. A readout circuit employing the latter feedback system will be described here.

Readout Circuit for Organic Photoelectric Conversion Layer

Figure 26:
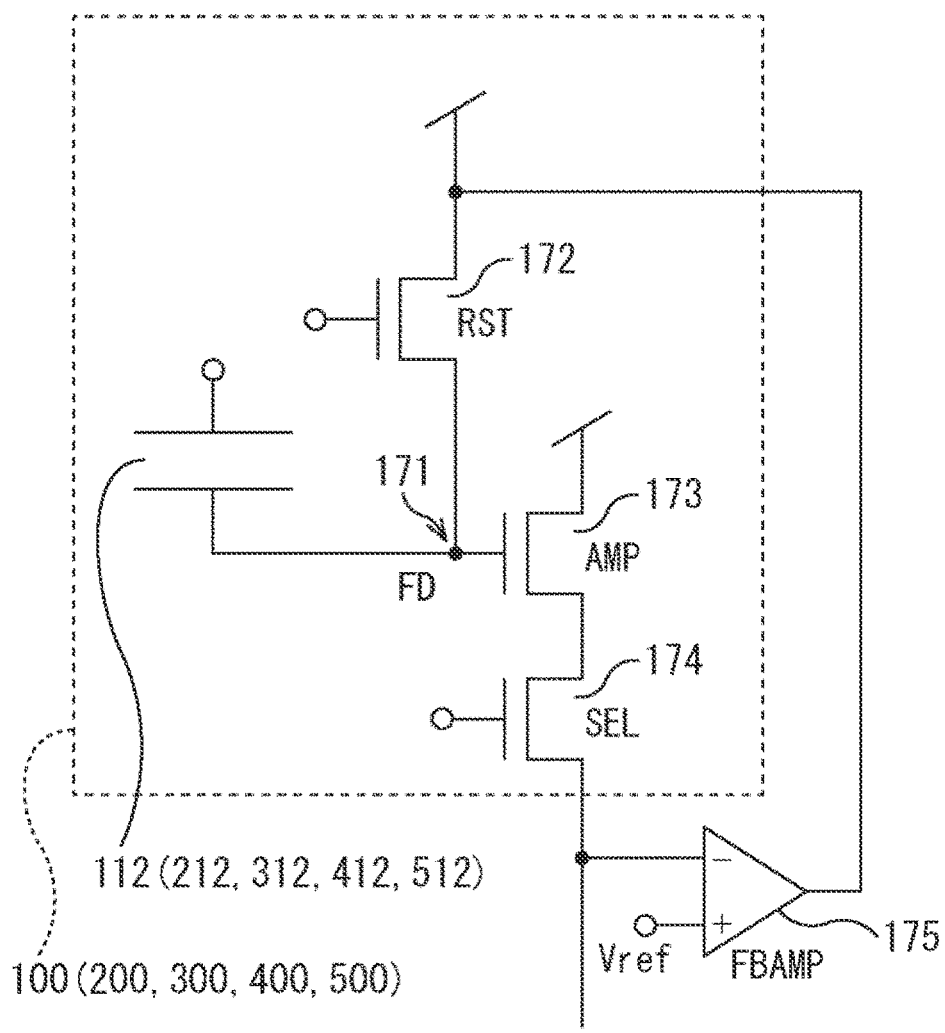
FIG. 26 is a diagram illustrating a readout circuit for an organic photoelectric conversion layer.

FIG. 26 is a diagram illustrating a readout circuit for the organic photoelectric conversion layer 112 in a pixel 100 (FIG. 8).

In FIG. 26, a pixel 100 has a pixel circuit (readout circuit) configured of a FD part 171, a reset transistor 172, an amplification transistor 173, and a select transistor 174 in addition to the organic photoelectric conversion layer 112. The pixel 100 is further provided with a feedback amplifier 175 for feeding back a readout signal to a reset signal for the pixel circuit.

Further, a plurality of drive lines as pixel drive lines 21 (FIG. 1) are wired per row of pixels, for example, for the pixels 100. Various drive signals SEL and RST are then supplied via a plurality of drive lines from the vertical drive circuit 12 (FIG. 1).

The organic photoelectric conversion layer 112 is a photoelectric conversion region which absorbs only lights in the visible light region and generates signal charges (charges) corresponding to a light of each color component such as R component, G component, or B component.

The FD part 171 is connected between the organic photoelectric conversion layer 112 and the amplification transistor 173. The FD part 171 is floating diffusion (FD), charge/voltage-converts signal charges generated by the organic photoelectric conversion layer 112 into a voltage signal, and outputs the voltage signal to the amplification transistor 173.

The amplification transistor 173 is connected at its gate electrode to the FD part 171, is connected at its drain electrode to the power supply part, and serves as an input part of a circuit for reading out a voltage signal held in the FD part 171 or a source follower circuit. That is, the amplification transistor 173 is connected at its source electrode to a vertical signal line 22 (FIG. 1) via the select transistor 174 thereby to configure a constant current source connected to one end of the vertical signal line 22, and a source follower circuit.

The select transistor 174 is connected between the source electrode of the amplification transistor 173 and the vertical signal line 22 (FIG. 1). A drive signal SEL is applied to the gate electrode of the select transistor 174. When the drive signal SEL enters the active state, the select transistor 174 enters the conducted state and the pixel 100 is in the selected state. With this arrangement, a readout signal (pixel signal) output from the amplification transistor 173 is output to the vertical signal line 22 (FIG. 1) via the select transistor 174.

The reset transistor 172 is connected between the FD part 171 and the power supply part. A drive signal RST is applied to the gate electrode of the reset transistor 172. When the drive signal RST enters the active state, the reset gate of the reset transistor 172 enters the conducted state and a reset signal for resetting the FD part 171 is supplied to the FD part 171.

The feedback amplifier 175 is connected at one input terminal (−) to the vertical signal line 22 connected to the select transistor 174, and is connected at the other input terminal (+) to a reference voltage part (Vref). Further, the output terminal of the feedback amplifier 175 is connected between the reset transistor 172 and the power supply part. The feedback amplifier 175 feeds back a readout signal (pixel signal) from the pixel 100 to a reset signal by the reset transistor 172.

Specifically, in a case where the reset transistor 172 resets the FD part 171, the drive signal RST enters the active state and the reset gate enters the conducted state. At this time, the feedback amplifier 175 gives a necessary gain to and feeds back an output signal of the select transistor 174 and feeds back thereby to cancel noises at the input part of the amplification transistor 173.

The readout circuit for the organic photoelectric conversion layer 112 in the pixel 100 is configured as described above.

Additionally, FIG. 26 illustrates the readout circuit for the organic photoelectric conversion layer 112 in the pixel 100 (FIG. 8) according to the first embodiment by way of example, but a readout circuit for the organic photoelectric conversion layers 212 to 512 can be configured similarly also in a pixel 200 to a pixel 500 according to the other embodiments. However, according to the fourth embodiment or the fifth embodiment, the organic photoelectric conversion layer 412 or 512 absorbs only lights in the infrared region and generates signal charges.

Readout Circuit for Photodiode

Figure 27:
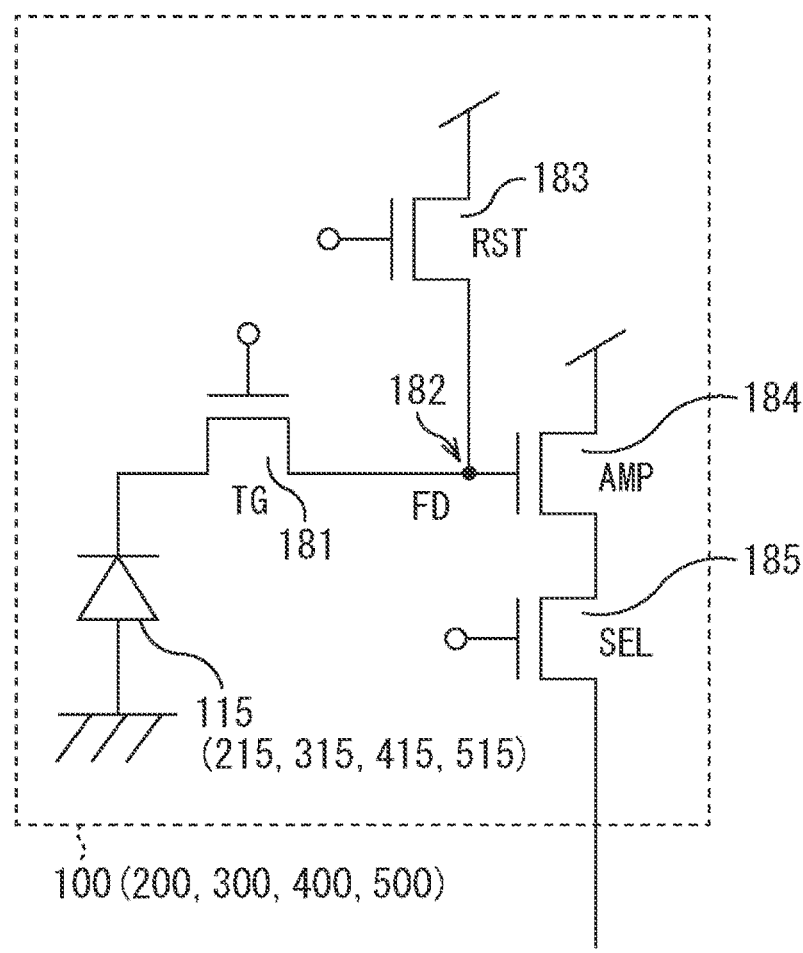
FIG. 27 is a diagram illustrating a readout circuit for a photodiode.

FIG. 27 is a diagram illustrating a readout circuit for a photodiode 115 in a pixel 100 (FIG. 8).

In FIG. 27, a pixel 100 has a pixel circuit (readout circuit) configured of a transfer transistor 181, a FD part 182, a reset transistor 183, an amplification transistor 184, and a select transistor 185 in addition to the photodiode 115. Further, a plurality of drive lines as pixel drive lines 21 (FIG. 1) are wired per row of pixels, for example, in the pixels 100. Various drive signals TG, SEL, and RST are then supplied via a plurality of drive lines from the vertical drive circuit 12 (FIG. 1).

The photodiode 115 is a photoelectric conversion region including a pn-junction photodiode, for example. The photodiode 115 generates and accumulates signal charges (charges) depending on the amount of received light.

The transfer transistor 181 is connected between the photodiode 115 and the FD part 182. A drive signal TG is applied to the gate electrode of the transfer transistor 181. When the drive signal TG enters the active state, the transfer gate of the transfer transistor 181 enters the conducted state, and the signal charges accumulated in the photodiode 115 are transferred to the FD part 182 via the transfer transistor 181.

The FD part 182 is connected between the transfer transistor 181 and the amplification transistor 184. The FD part 182 is floating diffusion (FD), charge/voltage-converts the signal charges transferred by the transfer transistor 181 into a voltage signal, and outputs the voltage signal to the amplification transistor 184.

The reset transistor 183 is connected between the FD part 182 and the power supply part. A drive signal RST is applied to the gate electrode of the reset transistor 183. When the drive signal RST enters the active state, the reset gate of the reset transistor 183 enters the conducted state, and the potential of the FD part 182 is reset at a level of the power supply part.

The amplification transistor 184 is connected at its gate electrode to the FD part 182, is connected at its drain electrode to the power supply part, and serves as an input part of a circuit for reading out a voltage signal held in the FD part 182 or a source follower circuit. That is, the amplification transistor 184 is connected at its source electrode to the vertical signal line 22 (FIG. 1) via the select transistor 185 thereby to configure a constant current source connected to one end of the vertical signal line 22, and a source follower circuit.

The select transistor 185 is connected between the source electrode of the amplification transistor 184 and the vertical signal line 22 (FIG. 1). A drive signal SEL is applied to the gate electrode of the select transistor 185. When the drive signal SEL enters the active state, the select transistor 185 enters the conducted state and the pixel 100 is in the selected state. With this arrangement, a readout signal (pixel signal) output from the amplification transistor 184 is output to the vertical signal line 22 (FIG. 1) via the select transistor 185.

The readout circuit for the photodiode 115 in the pixel 100 is configured as described above.

Additionally, FIG. 27 illustrates the readout circuit for the photodiode 115 in the pixel 100 (FIG. 8) according to the first embodiment by way of example, but a readout circuit for the photodiodes 215 to 515 can be configured similarly also in a pixel 200 to a pixel 500 according to the other embodiments. However, according to the first embodiment to the third embodiment, the photodiodes 115 to 315 are IR pixels. Further, according to the fourth embodiment and the fifth embodiment, the photodiodes 415 to 515 are pixels corresponding to each color component.

The readout circuits in a pixel according to the first embodiment to the fifth embodiment have been described above, but in a case where the readout circuit for the organic photoelectric conversion layer employs the feedback system as illustrated in FIG. 26, a memory part does not need to be provided, but the feedback system is disadvantageous in readout speed and is characterized in that reset noises (kTC noises) cannot be completely removed.

On the other hand, a limited readout speed or reset noises may be further permitted in generating an IR image than in generating a visible light image. For example, a light (IR light) in the infrared region is applied on an object by use of an external IR light source in generating an IR image thereby to secure sufficient sensitivity, and thus the problem is eliminated even if reset noises cannot be completely removed. Further, limited fast readout may be permitted depending on an application of an IR image.

With this arrangement, in a case where the organic photoelectric conversion layer absorbs only lights in the infrared region and generates signal charges, a readout circuit for the organic photoelectric conversion layer can employ the readout circuit in the feedback system illustrated in FIG. 26. In this case, a readout circuit for a photodiode employs the readout circuit illustrated in FIG. 27 thereby to read out RGB signals at a high speed and at low noises.

That is, a combination of the readout circuit for the organic photoelectric conversion layer illustrated in FIG. 26 and the readout circuit for the photodiode illustrated in FIG. 27 is preferably applied to pixels in which IR pixels are configured of an organic photoelectric conversion layer and RGB pixels are configured of photodiodes. Thus, the pixels 400 according to the fourth embodiment and the pixels 500 according to the fifth embodiment among the pixels according to the first embodiment to the fifth embodiment have the structure suitable for the combination of the readout circuits illustrated in FIG. 26 and FIG. 27.

However, the combination of the readout circuits illustrated in FIG. 26 and FIG. 27 is exemplary, and, for example, a readout circuit for an organic photoelectric conversion layer which absorbs only lights in the visible light region in the pixels 100 to 300 according to the first embodiment to the third embodiment employs a readout circuit provided with a memory part for reducing noises, for example, thereby reading out RGB signals at low noises. Additionally, the readout circuit for the organic photoelectric conversion layer illustrated in FIG. 26 may be of course employed for the pixels 100 to 300 according to the first embodiment to the third embodiment.

That is, the combination of the readout circuits illustrated in FIG. 26 and FIG. 27 is exemplary, and any combination of a readout circuit capable of reading out signal charges photoelectrically converted by an organic photoelectric conversion layer and a readout circuit capable of reading out signal charges photoelectrically converted by a photodiode may be employed. Additionally, a readout circuit for an organic photoelectric conversion layer may be the same as a readout circuit for a photodiode.

8. Variant

Other Structure of Pixels

Figure 28:
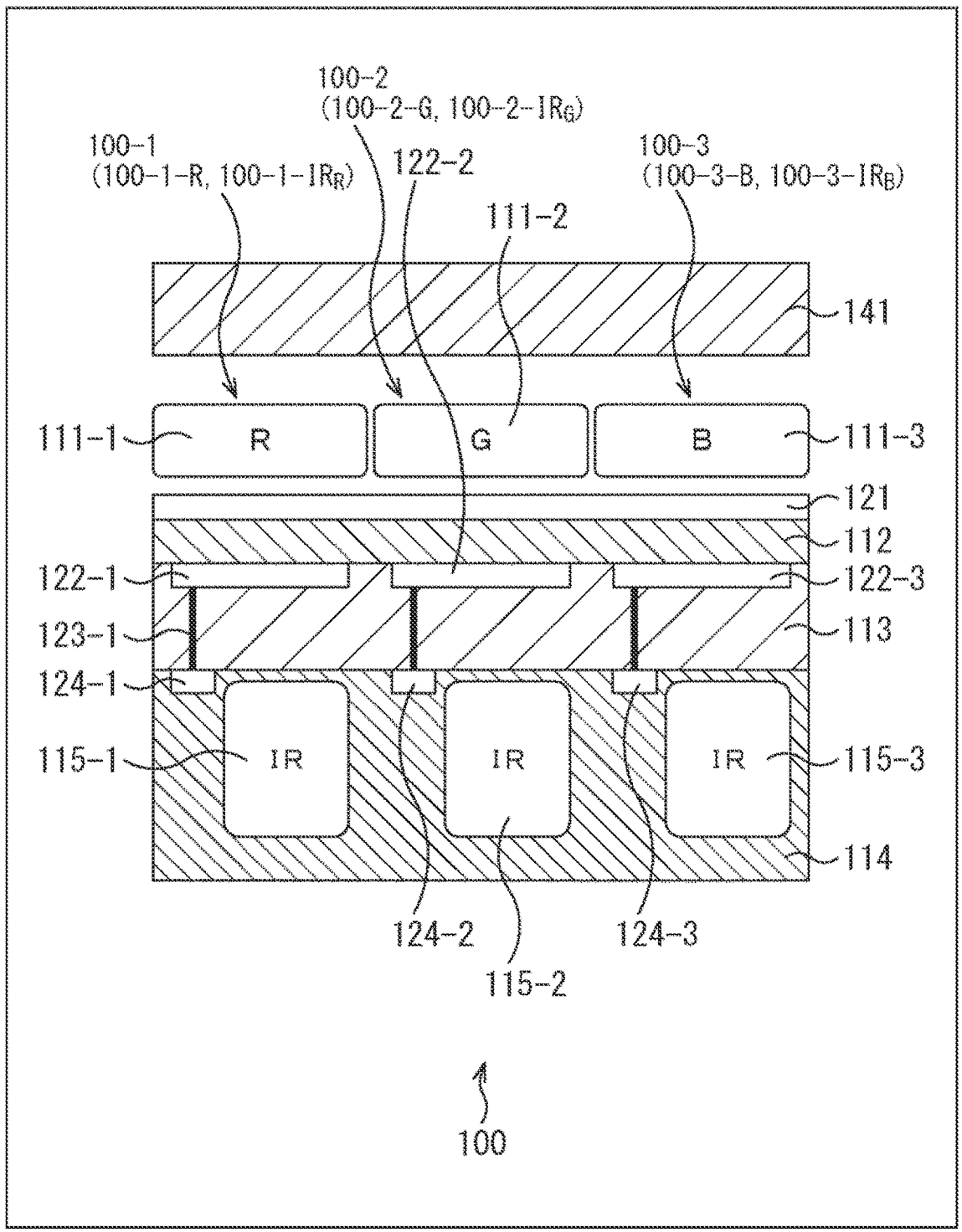
FIG. 28 is a cross-section view illustrating other structure of the pixels according to the first embodiment.
Figure 29:
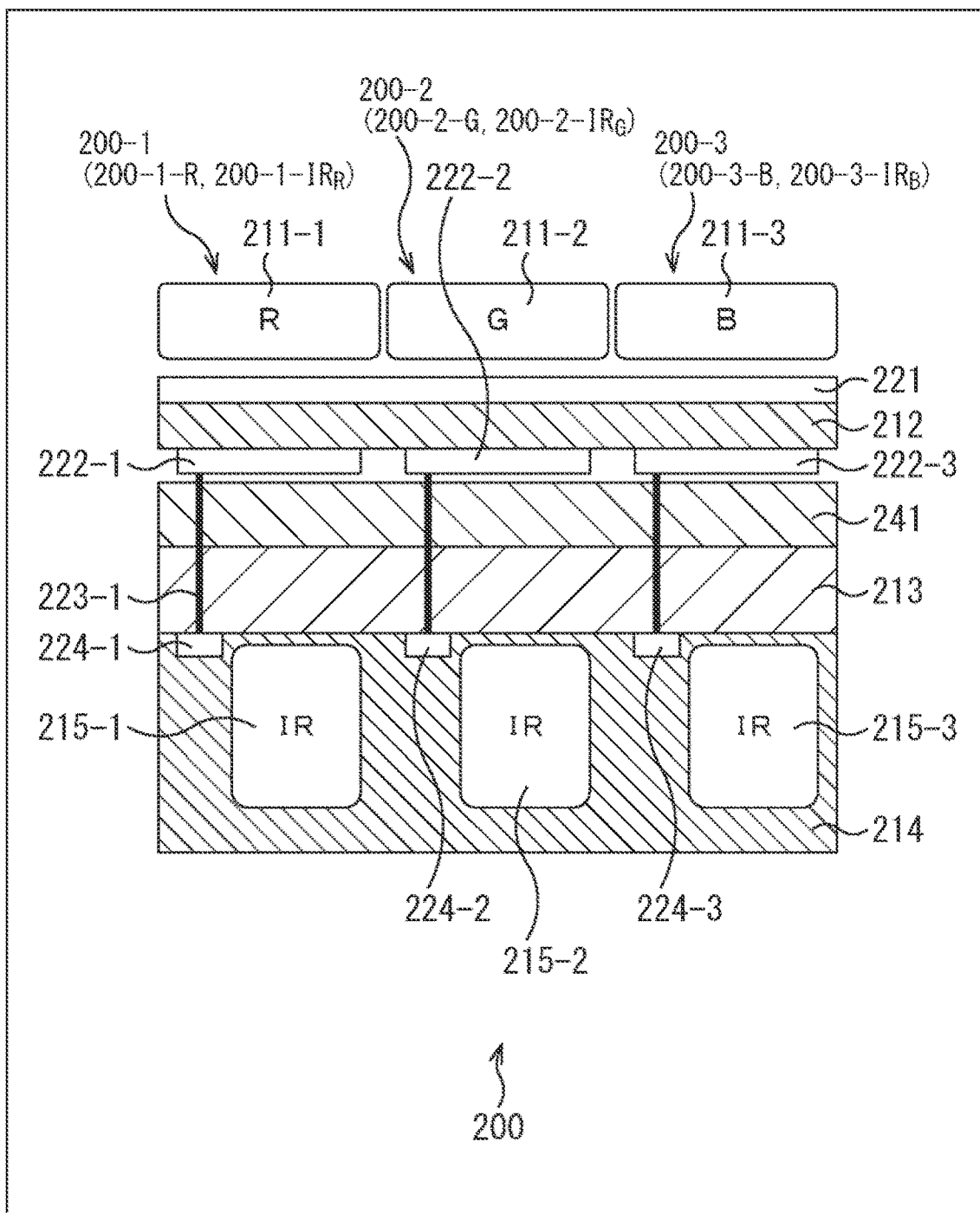
FIG. 29 is a cross-section view illustrating other structure of the pixels according to the second embodiment.
Figure 30:
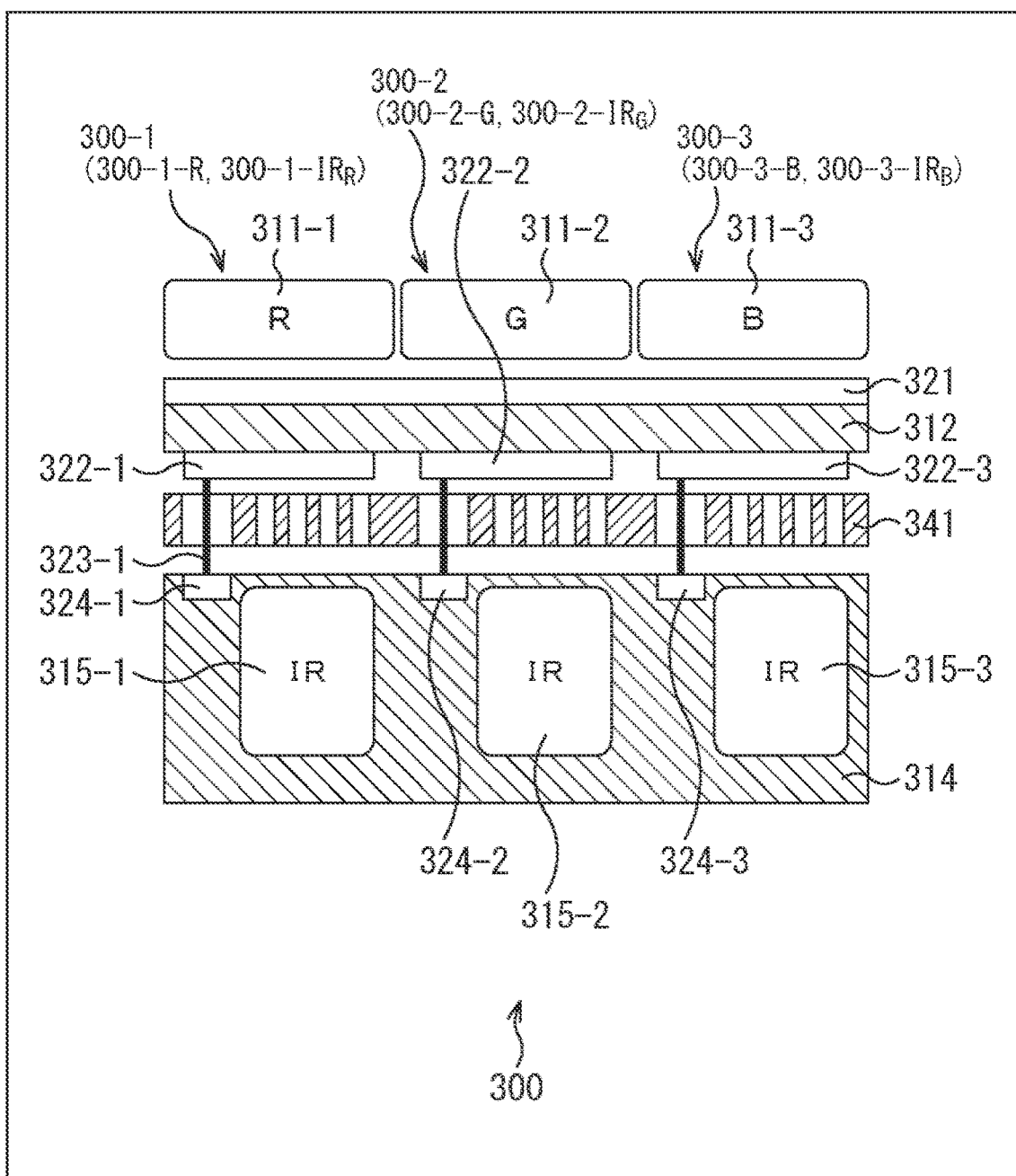
FIG. 30 is a cross-section view illustrating other structure of the pixels according to the third embodiment.
Figure 31:
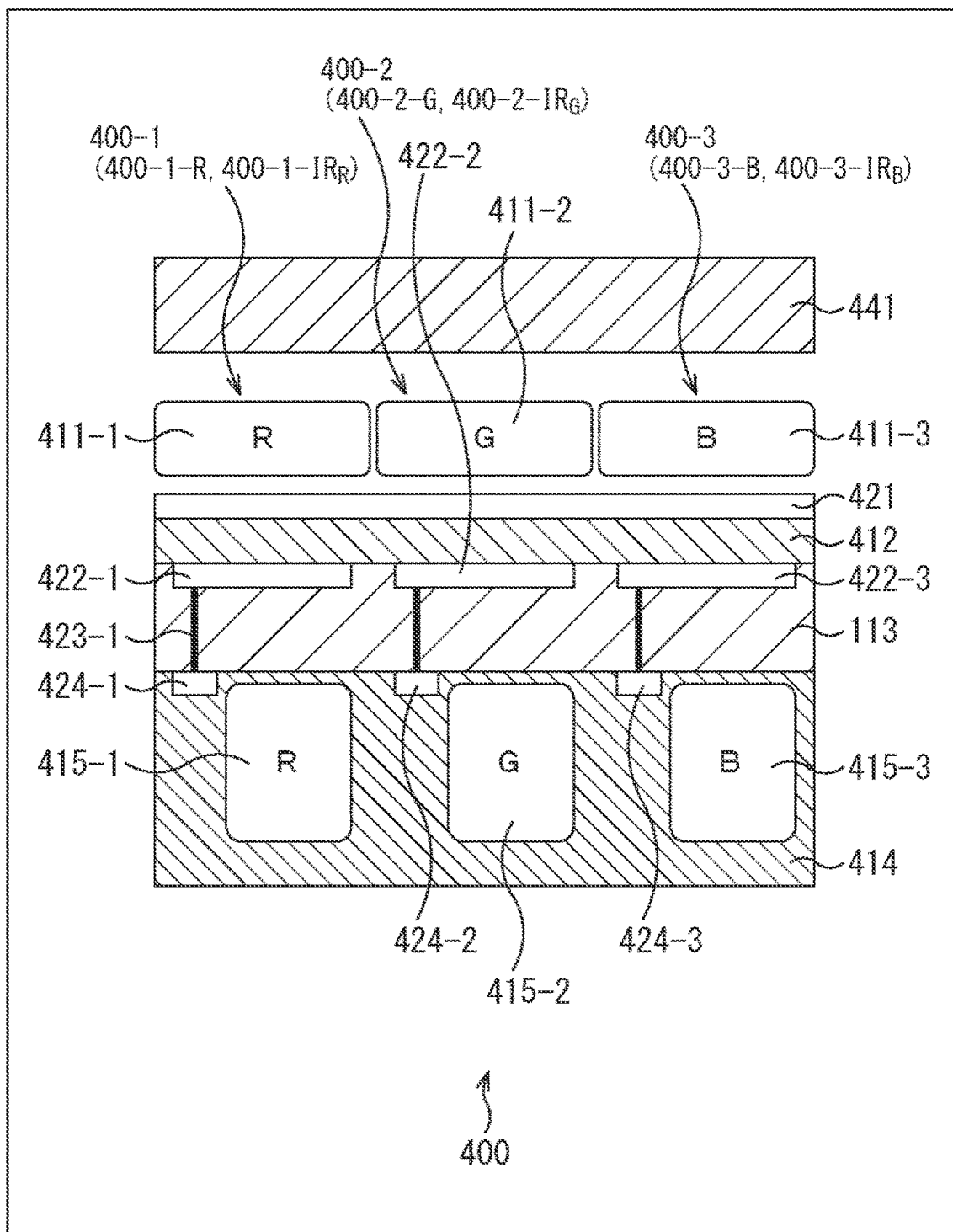
FIG. 31 is a cross-section view illustrating other structure of the pixels according to the fourth embodiment.
Figure 32:
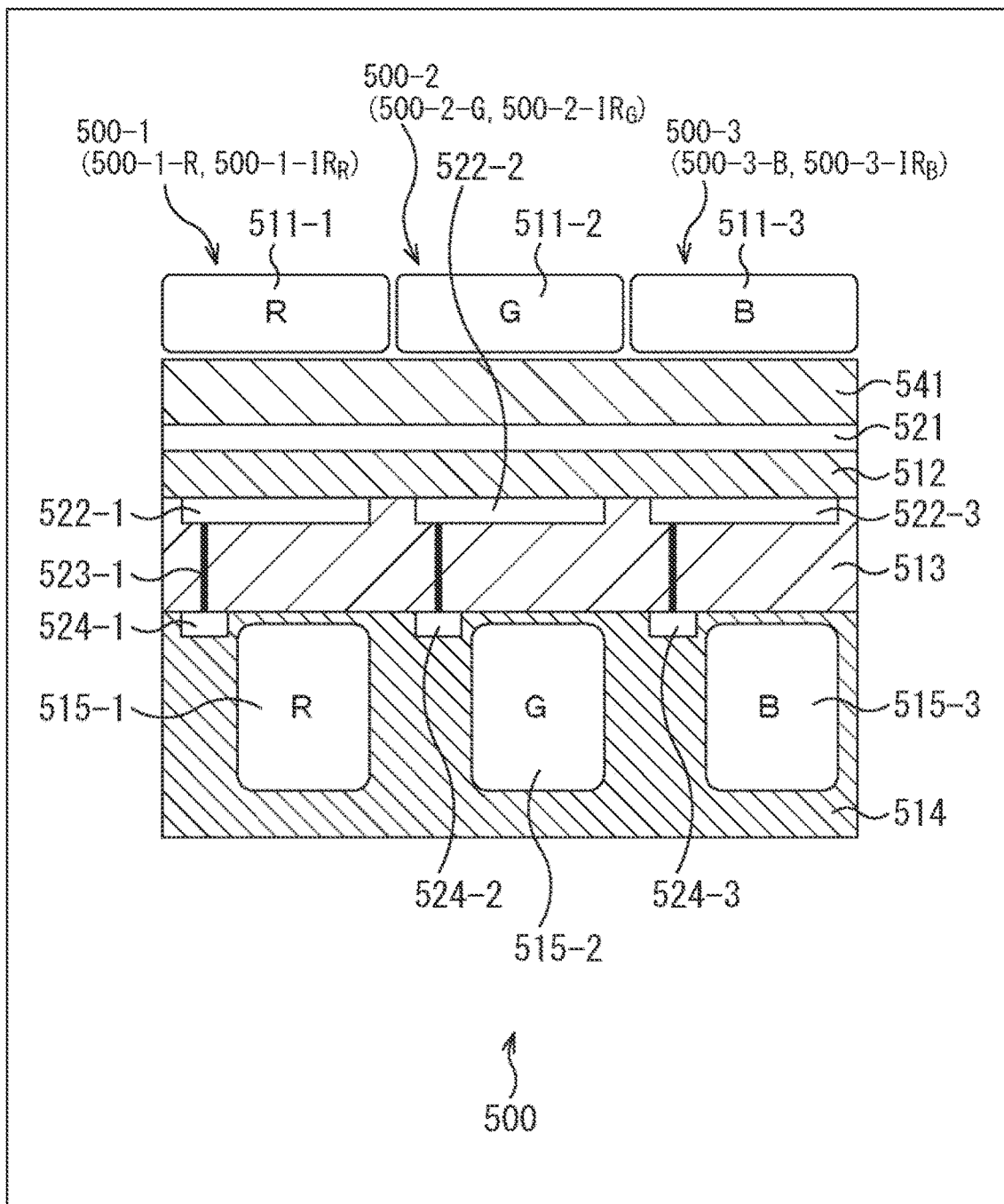
FIG. 32 is a cross-section view illustrating other structure of the pixels according to the fifth embodiment.

The description has been made assuming that the pixels according to the first embodiment to the fifth embodiment are in a structure of backside irradiation type, but a structure of surface irradiation type may be employed. FIG. 28 illustrates that the pixels 100 (FIG. 8) according to the first embodiment are in a structure of surface irradiation type. The wiring layer 116 is formed on the semiconductor layer 114 in the pixels 100 of surface irradiation type in FIG. 28.

Similarly, FIG. 29 to FIG. 32 illustrate that the pixels 200 (FIG. 13) according to the second embodiment, the pixels 300 (FIG. 18) according to the third embodiment, the pixels 400 (FIG. 20) according to the fourth embodiment, and the pixels 500 (FIG. 24) according to the fifth embodiment are in the structure of surface irradiation type.

Other Exemplary Filter

The description has been made by way of the dual-bandpass filter 141 (FIG. 8), the multilayered filter 241 (FIG.

13), the plasmon filter 341 (FIG. 18), the dual-bandpass filter 441 (FIG. 20), and the multilayered filter 541 (FIG. 24) as a filter functioning as a spectroscopic adjustment layer in the pixels according to the first embodiment to the fifth embodiment, but the filters are exemplary and other filter having a similar spectroscopic adjustment function may be employed.

For example, an anti-UV filter which transmits a light in a predetermined wavelength region may be employed instead of the dual-bandpass filter 141 or the dual-bandpass filter 441. Further, for example, the multilayered filter 241, the plasmon filter 341, and the multilayered filter 541 are exemplary filters having a transmission band at least in the infrared region, and other filter having a transmission band in the infrared region may be employed.

9. Configuration of Electronic Apparatus

Figure 33:
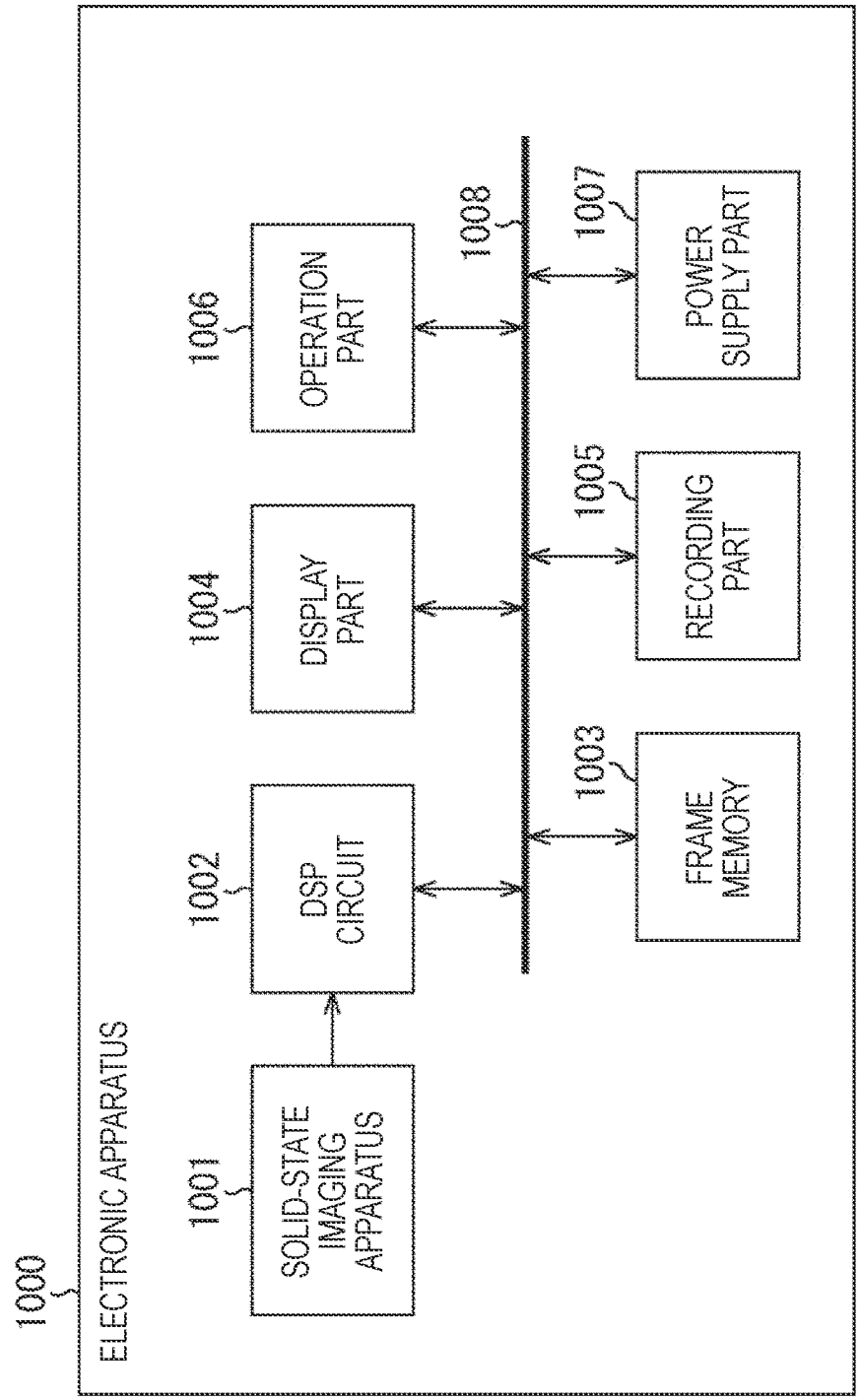
FIG. 33 is a diagram illustrating an exemplary configuration of an electronic apparatus having a solid-state imaging apparatus.

FIG. 33 is a diagram illustrating an exemplary configuration of an electronic apparatus having a solid-state imaging apparatus.

An electronic apparatus 1000 of FIG. 33 is, for example, an imaging apparatus such as digital still camera or video camera, a portable terminal apparatus having an imaging function such as Smartphone or tablet terminal, or the like.

In FIG. 33, the electronic apparatus 1000 is configured of a solid-state imaging apparatus 1001, a digital signal processor (DSP) circuit 1002, a frame memory 1003, a display part 1004, a recording part 1005, an operation part 1006, and a power supply part 1007. Further, the DSP circuit 1002, the frame memory 1003, the display part 1004, the recording part 1005, the operation part 1006, and the power supply part 1007 are mutually connected via a bus line 1008 in the electronic apparatus 1000.

The solid-state imaging apparatus 1001 corresponds to the CMOS image sensor 10 of FIG. 1, and a structure of the pixels two-dimensionally arranged in the pixel array part 11 therein employs a structure of pixels corresponding to any of the first embodiment to the fifth embodiment, for example.

The DSP circuit 1002 is a signal processing circuit configured to process a signal supplied from the solid-state imaging apparatus 1001. The DSP circuit 1002 outputs image data obtained by processing the signal from the solid-state imaging apparatus 1001. The frame memory 1003 temporarily holds the image data processed by the DSP circuit 1002 in units of frame.

The display part 1004 is configured of, for example, a panel-type display apparatus such as liquid crystal panel or organic electro luminescence (EL) panel, and displays a moving picture or still image shot by the solid-state imaging apparatus 1001. The recording part 1005 records image data on a moving picture or still image shot by the solid-state imaging apparatus 1001 in a recording medium such as semiconductor memory or hard disc.

The operation part 1006 outputs operation commands for various functions of the electronic apparatus 1000 in response to user's operations. The power supply part 1007 supplies power to various power supplies as operation power supplies of the DSP circuit 1002, the frame memory 1003, the display part 1004, the recording part 1005, and the operation part 1006 as needed.

The electronic apparatus 1000 is configured as described above.

10. Exemplary Use of Solid-State Imaging Apparatus

Figure 34:
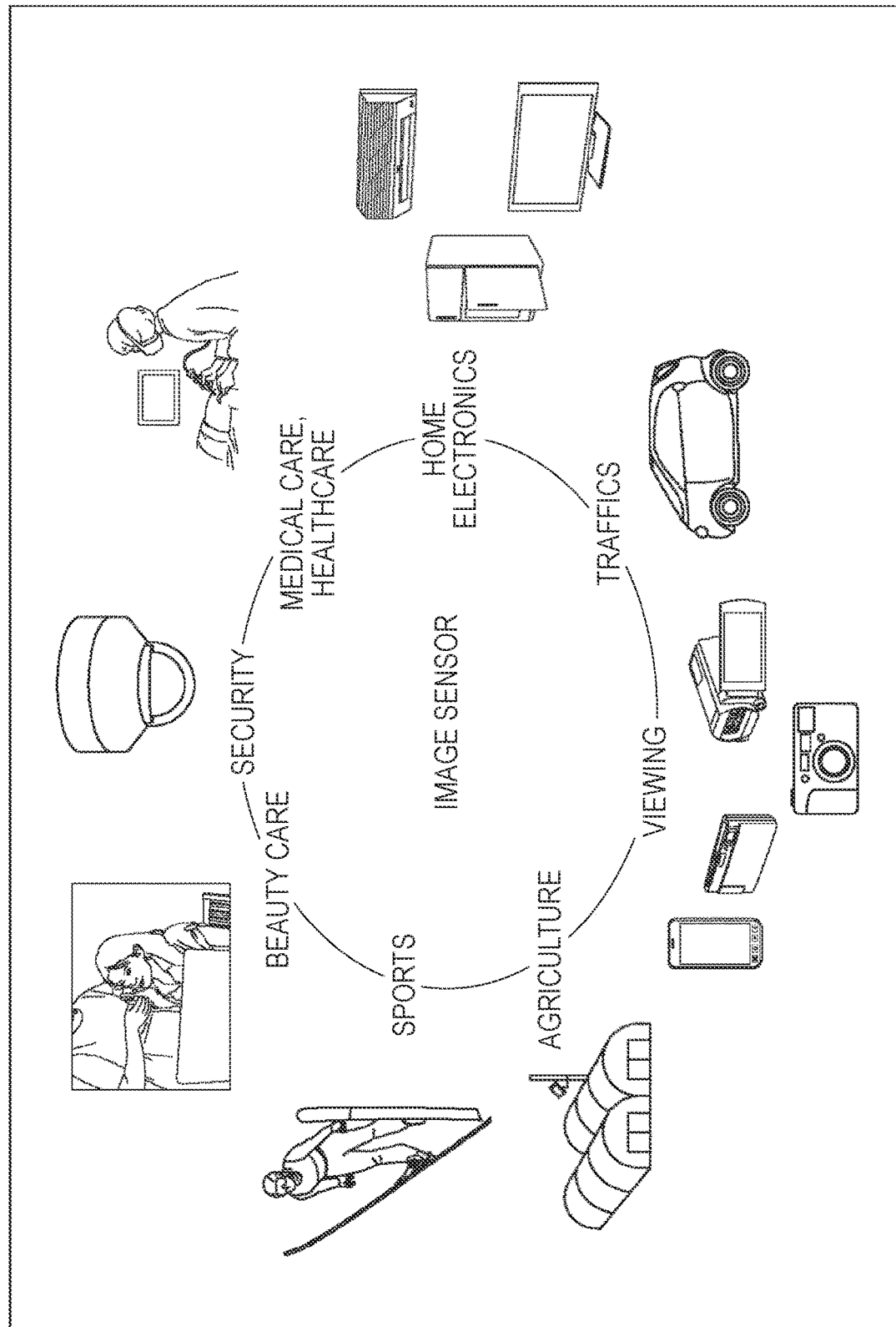
FIG. 34 is a diagram illustrating exemplary use of the solid-state imaging apparatus.

FIG. 34 is a diagram illustrating exemplary use of the CMOS image sensor 10 as an image sensor.

The CMOS image sensor 10 (FIG. 1) can be used in various cases for sensing lights such as visible light, infrared ray, ultraviolet ray, and X ray as described below, for example. That is, as illustrated in FIG. 34, the CMOS image sensor 10 can be used not only in the field of shooting images to be viewed but also in the field of traffics, in the field of home electronics, in the field of medical care and healthcare, in the field of security, in the field of beauty care, in the field of sports, in the field of agriculture, or the like, for example.

Specifically, as described above, the CMOS image sensor 10 can be used in apparatuses (such as the electronic apparatus 1000 of FIG. 33) configured to shoot an image to be viewed, such as digital camera, Smartphone, or camera-equipped cell phone, for example, in the field of viewing.

The CMOS image sensor 10 can be used in apparatuses for traffics such as vehicle-mounted sensor configured to shoot in front of, behind, around, inside, and the like of an automobile, monitoring camera configured to monitor a traveling vehicle or a road, or distance measurement sensor configured to measure an inter-vehicle distance or the like in order to achieve safe driving such as automatic stop or to recognize a driver's state or the like, for example, in the field of traffics.

The CMOS image sensor 10 can be used in apparatuses for home electronics such as TV receiver, refrigerator, and air conditioner in order to shoot a user's gesture and to operate a device according to the gesture, for example, in the field of home electronics. Further, the CMOS image sensor 10 can be used in apparatuses for medical care or healthcare such as endoscope, or angiographic apparatus using received infrared ray, for example, in the field of medical care/healthcare.

The CMOS image sensor 10 can be used in apparatuses for security such as monitoring camera for crime prevention or camera for person authentication, for example, in the field of security. Further, the CMOS image sensor 10 can be used in apparatuses for beauty care such as skin measurement device configured to shoot the skin or microscope configured to shoot the scalp, for example, in the field of beauty care.

The CMOS image sensor 10 can be used in apparatuses for sports such as action camera or wearable camera for sports or the like, for example, in the field of sports. Further, the CMOS image sensor 10 can be used in apparatuses for agriculture such as camera configured to monitor the states of field or crops, for example, in the field of agriculture.

Additionally, embodiments of the present technology are not limited to the above embodiments, and may be variously changed without departing from the spirit of the present technology.

Further, the present technology can take the following configurations.

(1) A solid-state imaging apparatus including:
    a pixel array part in which pixels each having a first photoelectric conversion region formed above a semiconductor layer and a second photoelectric conversion region formed in the semiconductor layer are two-dimensionally arranged,
    in which each of the pixels further has:
    a first filter configured to transmit a light in a predetermined wavelength region corresponding to a color component; and
    a second filter having different transmission characteristics from the first filter,
    one photoelectric conversion region out of the first photoelectric conversion region and the second photoelectric conversion region photoelectrically converts a light in a visible light region and the other photoelectric conversion region photoelectrically converts a light in an infrared region, the first filter is formed above the first photoelectric conversion region, and the second filter has transmission characteristics of making wavelengths of lights in an infrared region absorbed in the other photoelectric conversion region formed below the first filter the same.

(2) The solid-state imaging apparatus according to (1), in which the first filter is a color filter.

(3) The solid-state imaging apparatus according to (2), in which the first photoelectric conversion region is a photoelectric conversion region configured to absorb and photoelectrically convert a light in a visible light region, and the second photoelectric conversion region is a photoelectric conversion region configured to photoelectrically convert a light in an infrared region.

(4) The solid-state imaging apparatus according to (3), in which the second filter is formed above the first filter, and has characteristics of transmitting through at least two wavelength regions including a wavelength region of lights in a visible light region and a wavelength region of lights in an infrared region.

(5) The solid-state imaging apparatus according to (3), in which the second filter is formed between the first photoelectric conversion region and the second photoelectric conversion region, and has characteristics of transmitting through a wavelength region of lights at least in an infrared region.

(6) The solid-state imaging apparatus according to (5), in which the second filter includes an inorganic film.

(7) The solid-state imaging apparatus according to (5) or (6), in which the second filter is a multilayered filter formed by laminating a plurality of materials with different refractive indexes.

(8) The solid-state imaging apparatus according to (5), in which the second filter is a metal thin-film filter in which a predetermined microstructural pattern is formed for a metal thin-film.

(9) The solid-state imaging apparatus according to (2), in which the first photoelectric conversion region is a photoelectric conversion region configured to absorb and photoelectrically convert a light in an infrared region, and the second photoelectric conversion region is a photoelectric conversion region configured to photoelectrically convert a light in a visible light region.

(10) The solid-state imaging apparatus according to (9), in which the second filter is formed above the first filter, and has characteristics of transmitting through at least two wavelength regions including a wavelength region of lights in a visible light region and a wavelength region of lights in an infrared region.

(11) The solid-state imaging apparatus according to (9), in which the second filter is a multilayered filter formed by laminating a plurality of materials with different refractive indexes, and has characteristics of transmitting through a wavelength region of lights at least in an infrared region.

(12) The solid-state imaging apparatus according to any of (1) to (11), in which each of the pixels has:

a first pixel circuit configured of:

a first charge/voltage conversion part configured to convert a charge photoelectrically converted in the first photoelectric conversion region into a voltage signal;

a first reset transistor configured to reset the first charge/voltage conversion part;

a first amplification transistor configured to amplify the voltage signal from the first charge/voltage conversion part; and a first select transistor configured to select and output the signal voltage amplified in the first amplification transistor; and a second pixel circuit configured of:

a second charge/voltage conversion part configured to convert a charge photoelectrically converted in the second photoelectric conversion region into a voltage signal;

a transfer transistor configured to transfer the charge from the second photoelectric conversion region to the second charge/voltage conversion part;

a second reset transistor configured to reset the second charge/voltage conversion part;

a second amplification transistor configured to amplify the voltage signal from the second charge/voltage conversion part; and a second select transistor configured to select and output the signal voltage amplified in the second amplification transistor, and a feedback amplifier configured to feed back a readout signal from the first pixel circuit to a reset signal of the first reset transistor is provided for the first pixel circuit.

(13) An electronic apparatus mounting a solid-state imaging apparatus thereon, the solid-state imaging apparatus including:

a pixel array part in which pixels each having a first photoelectric conversion region formed above a semiconductor layer and a second photoelectric conversion region formed in the semiconductor layer are two-dimensionally arranged, in which each of the pixels further has:

a first filter configured to transmit a light in a predetermined wavelength region corresponding to a color component; and a second filter having different transmission characteristics from the first filter, one photoelectric conversion region out of the first photoelectric conversion region and the second photoelectric conversion region photoelectrically converts a light in a visible light region, and the other photoelectric conversion region photoelectrically converts a light in an infrared region, the first filter is formed above the first photoelectric conversion region, and the second filter has transmission characteristics of making wavelengths of lights in an infrared region absorbed in the other photoelectric conversion region formed below the first filter the same.

REFERENCE SIGNS LIST

10 CMOS image sensor
11 Pixel array part
12 Vertical drive circuit
13 Column processing circuit
14 Horizontal drive circuit 15 Output circuit
16 Control circuit
17 I/O terminal
100 Pixel
111-1 R color filter
111-2 G color filter
111-3 B color filter
112 Organic photoelectric conversion layer
115-1, 115-2, 115-3 Photodiode
141 Dual-bandpass filter
171 FD part
172 Reset transistor
173 Amplification transistor
174 Select transistor
175 Feedback amplifier
181 Transfer transistor
182 FD part
183 Reset transistor
184 Amplification transistor
185 Select transistor
200 Pixel
211-1 R color filter
211-2 G color filter
211-3 B color filter
212 Organic photoelectric conversion layer
215-1, 215-2, 215-3 Photodiode
241 Multilayered filter
300 Pixel
311-1 R color filter
311-2 G color filter
311-3 B color filter
312 Organic photoelectric conversion layer
315-1, 315-2, 315-3 Photodiode
341 Plasmon filter
400 Pixel
411-1 R color filter
411-2 G color filter
411-3 B color filter
412 Organic photoelectric conversion layer
415-1, 415-2, 415-3 Photodiode
441 Dual-bandpass filter
500 Pixel
511-1 R color filter
511-2 G color filter
511-3 B color filter
512 Organic photoelectric conversion layer
515-1, 515-2, 515-3 Photodiode
541 Multilayered filter
1000 Electronic apparatus
1001 Solid-state imaging apparatus

The invention claimed is:

1. A light detecting device, comprising:
first and second pixels, each of the first and second pixels comprising:
a first photoelectric conversion region disposed above a semiconductor layer and a second photoelectric conversion region disposed in the semiconductor layer,
wherein out of the first photoelectric conversion region and the second photoelectric conversion region, one of the first photoelectric conversion region or the second photoelectric conversion region photoelectrically coverts light in a visible light region and the other of the first photoelectric conversion region or the second photoelectric conversion region photoelectrically converts light in an infrared light region;
a first filter,
wherein the first filter of the first pixel is configured to transmit a light in a predetermined wavelength region corresponding to a color component, and
wherein the first filter of the first pixel has transmission characteristics different than the first filter of the second pixel; and
a second filter configured to allow the other of the first photoelectric conversion region or the second photoelectric conversion region to receive light in a same infrared region.

2. The light detecting device according to claim 1, wherein the first filter is a color filter.

3. The light detecting device according to claim 1, wherein the second filter is formed above the first filter and has characteristics of transmitting light through at least two wavelength regions including a wavelength region in the visible light region and a wavelength region in the infrared region.

4. The light detecting device according to claim 1, wherein the second filter is formed between the first photoelectric conversion region and the second photoelectric conversion region and has characteristics of transmitting light through a wavelength region at least in an infrared region.

5. The light detecting device according to claim 1, wherein the second filter includes an inorganic film.

6. The light detecting device according to claim 1, wherein the second filter is a multilayered filter formed by laminating a plurality of materials with different refractive indexes.

7. The light detecting device according to claim 1, wherein the second filter is a metal thin-film filter in which a predetermined microstructural pattern is formed for a metal thin-film.

8. The light detecting device according to claim 1, wherein each of the first and second pixels further comprises an electrode and a charge holding part.

9. The light detecting device according to claim 8 wherein the electrode is a transparent electrode.

10. The light detecting device according to claim 8, wherein the second photoelectric conversion region is disposed between the electrode and the charge holding part and the charge holding part is electrically connected to the electrode.

11. An electronic apparatus mounting a light detecting device thereon, the light detecting device comprising:
first and second pixels, each of the first and second pixels comprising:
a first photoelectric conversion region disposed above a semiconductor layer and a second photoelectric conversion region disposed in the semiconductor layer,
wherein out of the first photoelectric conversion region and the second photoelectric conversion region, one of the first photoelectric conversion region or the second photoelectric conversion region photoelectrically coverts light in a visible light region and the other of the first photoelectric conversion region or the second photoelectric conversion region photoelectrically converts light in an infrared light region;
a first filter,
wherein the first filter of the first pixel is configured to transmit a light in a predetermined wavelength region corresponding to a color component, and
wherein the first filter of the first pixel has transmission characteristics different than the first filter of the second pixel; and a second filter configured to allow the other of the first photoelectric conversion region or the second photoelectric conversion region to receive light in a same infrared region.

12. The electronic apparatus according to claim 11, wherein the first filter is a color filter.

13. The electronic apparatus according to claim 11, wherein the second filter is formed above the first filter and has characteristics of transmitting light through at least two wavelength regions including a wavelength region in the visible light region and a wavelength region in the infrared region.

14. The electronic apparatus according to claim 11, wherein the second filter is formed between the first photoelectric conversion region and the second photoelectric conversion region and has characteristics of transmitting light through a wavelength region at least in an infrared region.

15. The electronic apparatus according to claim 11, wherein the second filter includes an inorganic film.

16. The electronic apparatus according to claim 11, wherein the second filter is a multilayered filter formed by laminating a plurality of materials with different refractive indexes.

17. The electronic apparatus according to claim 11, wherein the second filter is a metal thin-film filter in which a predetermined microstructural pattern is formed for a metal thin-film.

18. The electronic apparatus according to claim 11, wherein each of the first and second pixels further comprises an electrode and a charge holding part.

19. The electronic apparatus according to claim 18, wherein the electrode is a transparent electrode.

20. The electronic apparatus according to claim 18, wherein the second photoelectric conversion region is disposed between the electrode and the charge holding part and the charge holding part is electrically connected to the electrode.

* * * * *